(12) United States Patent
Kobayashi et al.

(10) Patent No.: US 11,935,905 B2
(45) Date of Patent: Mar. 19, 2024

(54) IMAGING DEVICE AND IMAGING SYSTEM

(71) Applicant: CANON KABUSHIKI KAISHA, Tokyo (JP)

(72) Inventors: Hirokazu Kobayashi, Tokyo (JP); Hisataka Hirose, Kanagawa (JP); Satoshi Kumaki, Saitama (JP); Yasuhiro Matsuo, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 670 days.

(21) Appl. No.: 17/063,187

(22) Filed: Oct. 5, 2020

(65) Prior Publication Data

US 2021/0036036 A1 Feb. 4, 2021

Related U.S. Application Data

(63) Continuation of application No. PCT/JP2019/015018, filed on Apr. 4, 2019.

(30) Foreign Application Priority Data

Apr. 6, 2018 (JP) .................................. 2018-074047
Mar. 27, 2019 (JP) .................................. 2019-061361

(51) Int. Cl.
*H01L 27/146* (2006.01)
*H04N 25/704* (2023.01)

(52) U.S. Cl.
CPC .... *H01L 27/1461* (2013.01); *H01L 27/14603* (2013.01); *H01L 27/14643* (2013.01); *H04N 25/704* (2023.01)

(58) Field of Classification Search
CPC ........... H01L 27/1461; H01L 27/14603; H01L 27/14643; H01L 27/14607; H01L 27/1464; H04N 25/704; H04N 25/772
See application file for complete search history.

(56) References Cited

U.S. PATENT DOCUMENTS

2006/0202129 A1  9/2006 Niclass
2007/0052056 A1* 3/2007 Doi ..................... H01L 27/1469
                                                      257/462
(Continued)

FOREIGN PATENT DOCUMENTS

CN    103299437 A    9/2013
JP    2012-129276 A  7/2012
(Continued)

OTHER PUBLICATIONS

The International Search Report of PCT/JP2019/015018 dated Jul. 2, 2019.
(Continued)

*Primary Examiner* — Douglas W Owens
(74) *Attorney, Agent, or Firm* — Cowan, Liebowitz & Latman, P.C.

(57) ABSTRACT

An imaging device comprises pixels. The pixel includes first semiconductor regions of a first conductivity type provided in a surface part of a semiconductor substrate and a second semiconductor region of a second conductivity type provided in the surface part of the semiconductor substrate between the first semiconductor regions. The pixel includes: a light-receiving unit in which photodiodes each configured between the second semiconductor region and one of the first semiconductor regions; quenching circuits, each connected to a corresponding one of the first semiconductor regions; and a counter unit connected to each of connection nodes between the first semiconductor regions and the quenching circuits and counts a pulse generated in response to a photon being incident on the light-receiving unit. The second semiconductor region is provided across a deeper part of the semiconductor substrate than the first semiconductor regions.

19 Claims, 43 Drawing Sheets

(56) References Cited

U.S. PATENT DOCUMENTS

| | | | |
|---|---|---|---|
| 2010/0214654 A1 | 8/2010 | Birk | |
| 2016/0351745 A1* | 12/2016 | Frey | H01L 31/1133 |
| 2017/0104020 A1 | 4/2017 | Lee | |
| 2019/0082128 A1* | 3/2019 | Oh | G01S 17/89 |
| 2020/0025934 A1* | 1/2020 | Kwon | H01L 31/103 |

FOREIGN PATENT DOCUMENTS

| | | |
|---|---|---|
| JP | 2012-174783 A | 9/2012 |
| JP | 2013-149740 A | 8/2013 |
| JP | 2013-149757 A | 8/2013 |
| JP | 2016-171308 A | 9/2016 |
| JP | 2017-059563 A | 3/2017 |
| JP | 2017-117834 A | 6/2017 |
| JP | 2018-037672 A | 3/2018 |
| WO | 2017/130723 A1 | 8/2017 |

OTHER PUBLICATIONS

The above documents were cited in the Nov. 1, 2023 Chinese Office Action, without an English Translation, that issued in Chinese Patent Application No. 201980024730.6.

* cited by examiner

FIG. 4
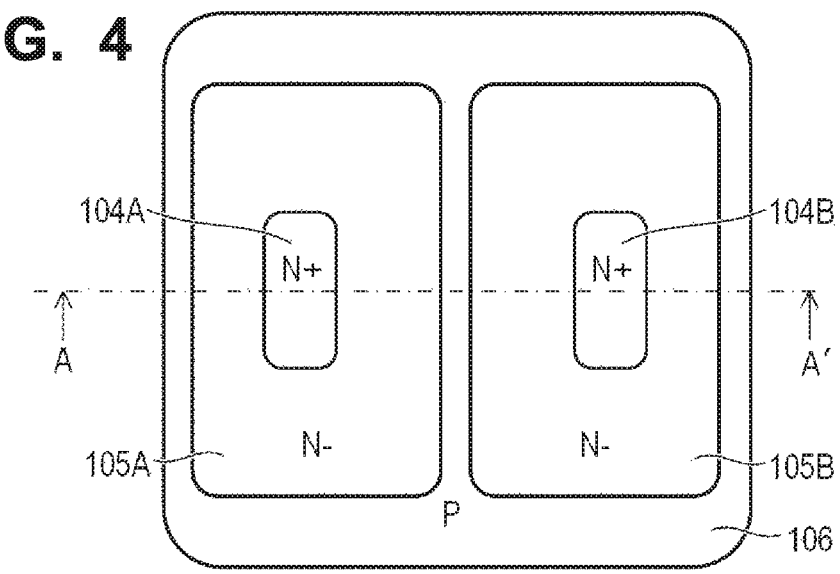
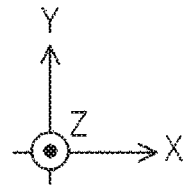
FIG. 5
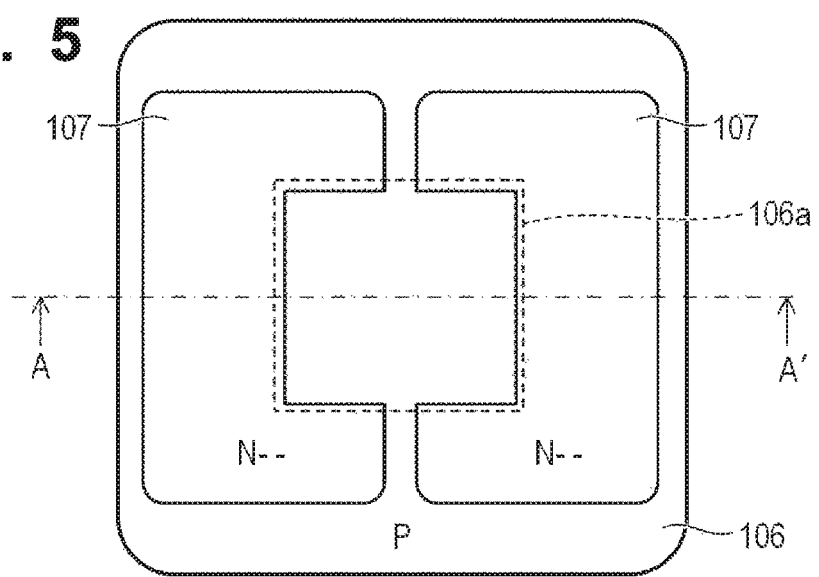
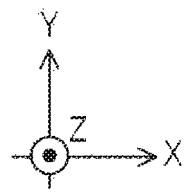

FIG. 11
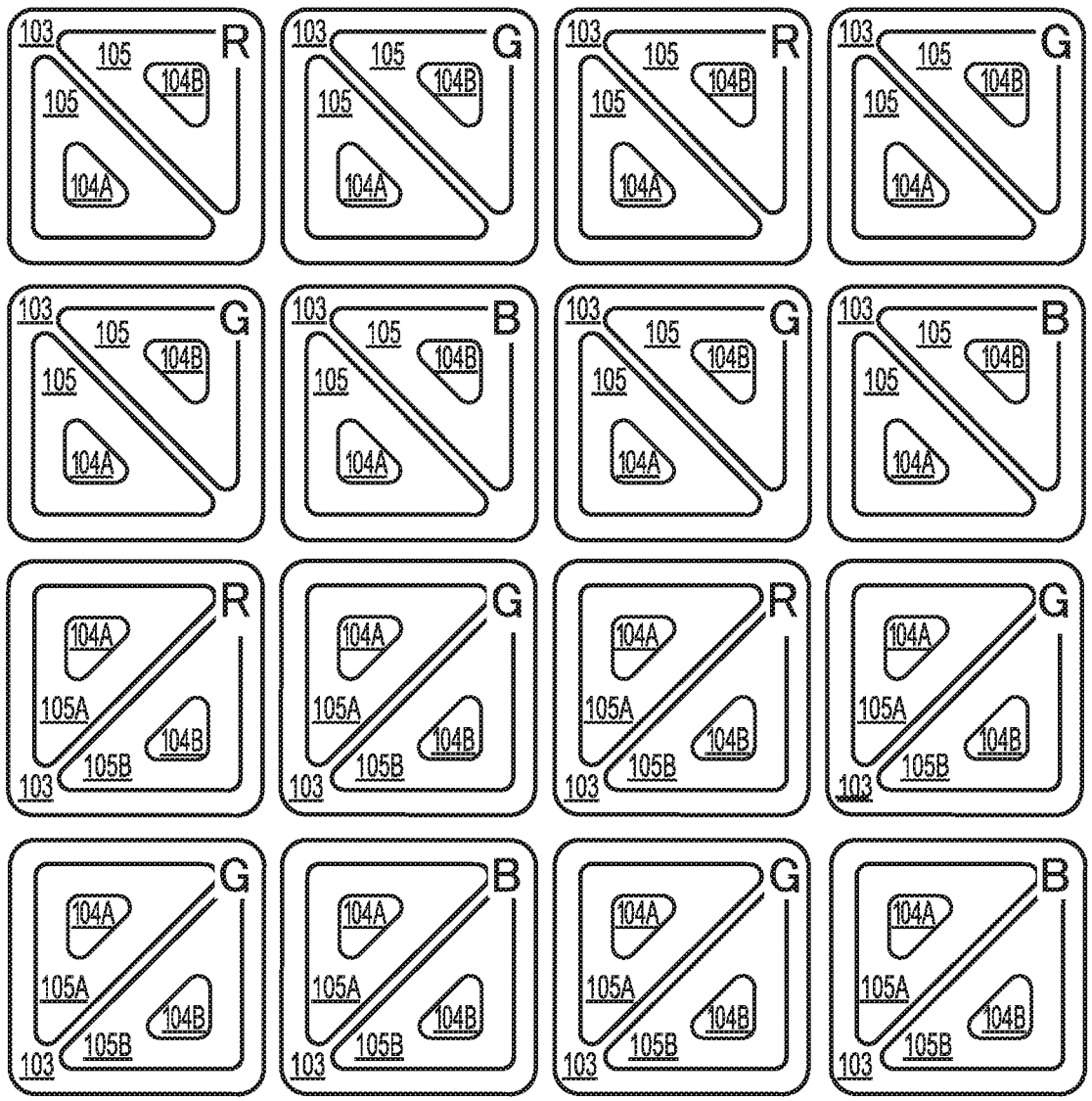
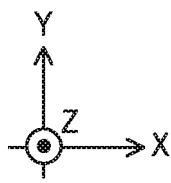

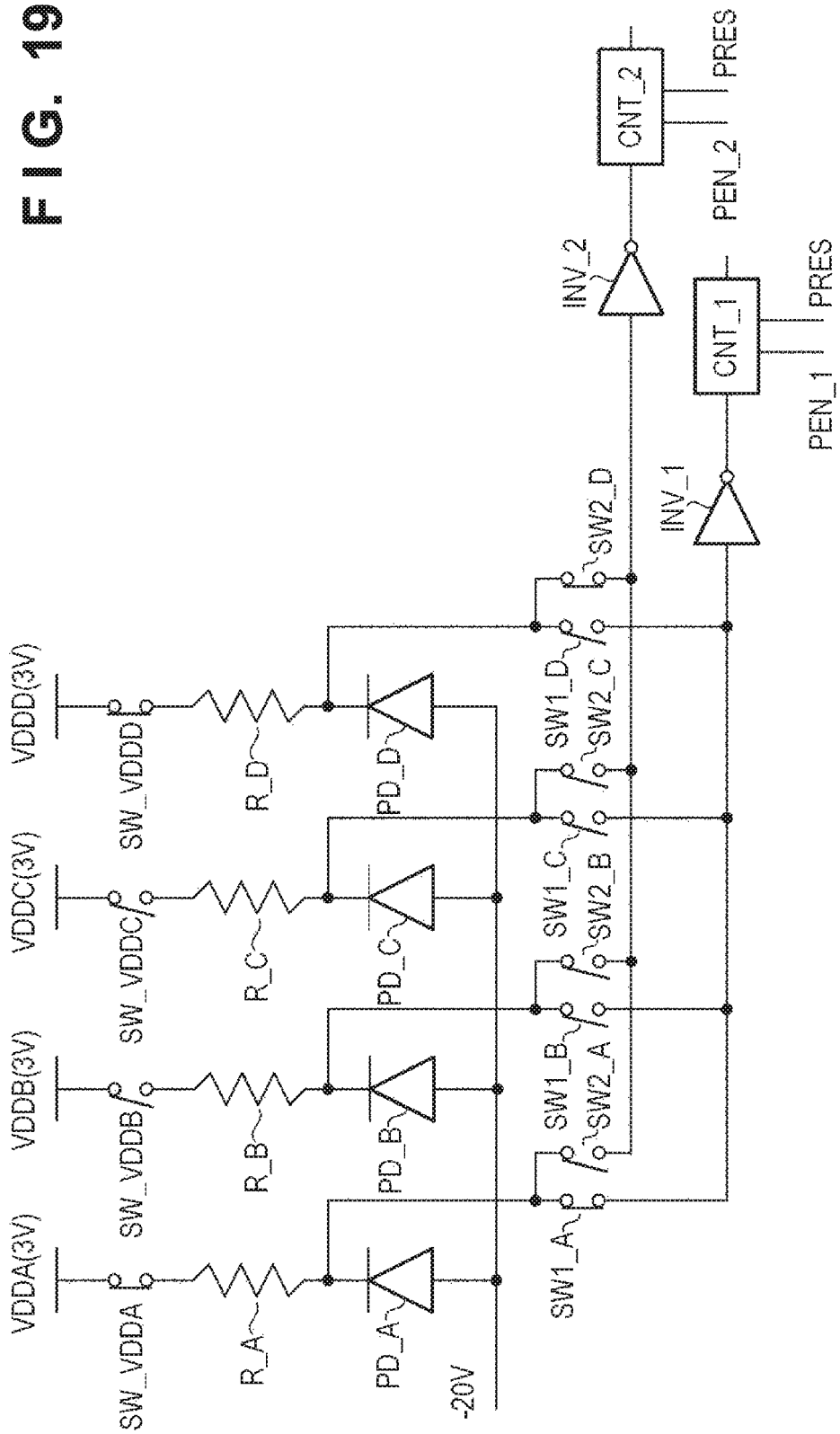

FIG. 36A

| R | G | R | G |
|---|---|---|---|
| G | B | G | B |
| R | G | R | G |
| G | B | G | B |

FIG. 36B

| R | G | R | G |
|---|---|---|---|
| G | B | G | B |
| R | G | R | G |
| G | B | G | B |

FIG. 36C

| R | G | R | G |
|---|---|---|---|
| G | B | G | B |
| R | G | R | G |
| G | B | G | B |

IMAGING DEVICE AND IMAGING SYSTEM

CROSS-REFERENCE TO RELATED APPLICATIONS

This application is a Continuation of International Patent Application No. PCT/JP2019/015018, filed on Apr. 4, 2019, which claims the benefit of Japanese Patent Application No. 2018-074047, filed on Apr. 6, 2018 and Japanese Patent Application No. 2019-061361, filed on Mar. 27, 2019, all of which are hereby incorporated by reference herein in their entirety.

BACKGROUND OF THE INVENTION

Field of the Invention

The present invention relates to an imaging device and an imaging system.

Background Art

The SPAD (Single-Photon Avalanche Diode) is known as a detector capable of detecting faint light at the level of a single photon. The SPAD uses an avalanche multiplication phenomenon, produced by a strong electrical field induced at a pn junction of a semiconductor, to amplify a signal charge excited by a photon by approximately several times to several millions of times. By using high gain properties of the avalanche multiplication phenomenon, a signal of faint light can be read out and amplified significantly beyond noise, and a luminance resolution can be realized at the level of a single photon. PTL 1 discloses an imaging device in which pixels, each including a SPAD, are arranged two-dimensionally.

On the other hand, imaging devices which can be used for both capturing images and focus detection using a phase difference detection method are being put into practical use. By configuring an imaging device so that light can be received having divided a pupil region of an imaging optical system, signals obtained through the division can be used to detect a phase difference, and a signal obtained by adding these divided signals can be used for capturing images. PTL 2 discloses an imaging device in which photoelectric conversion units are divided so as to be usable for focus detection which uses the phase difference detection method.

CITATION LIST

Patent Literature

PTL 1: Japanese Patent Laid-Open No. 2012-174783
PTL 2: Japanese Patent Laid-Open No. 2013-149757

However, if, in an imaging device which uses SPADs, the photoelectric conversion units are divided so as to be usable for focus detection which uses the phase difference detection method, a bokeh similar to that obtained when the photoelectric conversion units are not divided cannot be obtained simply by adding the signals obtained from the divided photoelectric conversion units.

The present invention provides an imaging device which uses SPADs, the imaging device being capable of focus detection using a phase difference detection method and capable of obtaining a bokeh similar to that which is obtained when not dividing pupils when capturing an image.

SUMMARY OF THE INVENTION

One aspect of the present invention provides an imaging device including a plurality of pixels arranged in a plurality of rows and a plurality of columns. Each of the plurality of pixels includes: a light-receiving unit having a plurality of first semiconductor regions of a first conductivity type provided in a surface part of a semiconductor substrate and a second semiconductor region of a second conductivity type provided in the surface part of the semiconductor substrate between the plurality of first semiconductor regions, a plurality of photodiodes each configured between the second semiconductor region and one of the plurality of first semiconductor regions; a plurality of quenching circuits, each connected to a corresponding one of the plurality of first semiconductor regions; and a counter unit connected to each of connection nodes between the plurality of first semiconductor regions and the plurality of quenching circuits, the counter unit counting a pulse generated in response to a photon being incident on the light-receiving unit. The second semiconductor region is provided across a deeper part of the semiconductor substrate than the plurality of first semiconductor regions.

Another aspect of the present invention provides an imaging device in which a plurality of pixels are disposed. Each of the plurality of pixels includes: a microlens; a first semiconductor region of a first conductivity type having a light-receiving surface on which light is incident via the microlens; and a plurality of second semiconductor regions of the first conductivity type provided on a surface of the first semiconductor region opposite from the light-receiving surface, the plurality of second semiconductor regions being separated by a semiconductor region of a second conductivity type. The semiconductor region of the second conductivity type in at least some pixels of the plurality of pixels has a part extending to a predetermined depth of the first semiconductor region.

Yet another aspect of the present invention provides an imaging device in which a plurality of pixels are disposed. The plurality of pixels include a plurality of types of pixels having different spectral properties; and of the plurality of pixels, a potential difference supplied to a first type of pixel is smaller than a potential difference supplied to a second type of pixel a wavelength of light mainly detected by which is shorter than that of the first type of pixel.

Still another aspect of the present invention provides an imaging device in which a plurality of pixels are disposed. Each of the plurality of pixels includes: a microlens; a first semiconductor region of a first conductivity type having a light-receiving surface on which light is incident via the microlens; and a plurality of second semiconductor regions of the first conductivity type provided on a surface of the first semiconductor region opposite from the light-receiving surface, the plurality of second semiconductor regions being separated by a semiconductor region of a second conductivity type. Of the plurality of pixels, an interval of the plurality of second semiconductor regions in a first type of pixel is narrower than an interval of the plurality of second semiconductor regions in a second type of pixel a wavelength of light mainly detected by which is shorter than that of the first type of pixel.

Still another aspect of the present invention provides an imaging system including an imaging device according to the present invention, and a signal processing unit that processes a signal output from the imaging device.

Further features of the present invention will become apparent from the following description of exemplary embodiments with reference to the attached drawings.

BRIEF DESCRIPTION OF THE DRAWINGS

The appended drawings, which are included in and constitute part of the specification, illustrate embodiments of the present invention, and along with those descriptions serve to illustrate the principles of the present invention.

FIG. 4 is a plan view (No. 1) illustrating the structure of a pixel in the imaging device according to the first embodiment of the present invention.

FIG. 5 is a plan view (No. 2) illustrating the structure of a pixel in the imaging device according to the first embodiment of the present invention.

FIG. 11 is a plan view (No. 4) illustrating the structure of an imaging device according to a variation on the first embodiment of the present invention.

FIG. 19 is a circuit diagram (No. 1) illustrating an example of the configuration and an example of the driving of a pixel in the imaging device according to the fourth embodiment of the present invention.

FIG. 36A is a diagram illustrating an example of the arrangement of pixels in the imaging device according to the eighth embodiment of the present invention.

FIG. 36B is a diagram illustrating an example of the arrangement of pixels in the imaging device according to the eighth embodiment of the present invention.

FIG. 36C is a diagram illustrating an example of the arrangement of pixels in the imaging device according to the eighth embodiment of the present invention.

DESCRIPTION OF THE EMBODIMENTS

First Embodiment

An imaging device and a driving method thereof according to a first embodiment of the present invention will be described with reference to FIG. 1 to FIG. 13.

Figure 1:
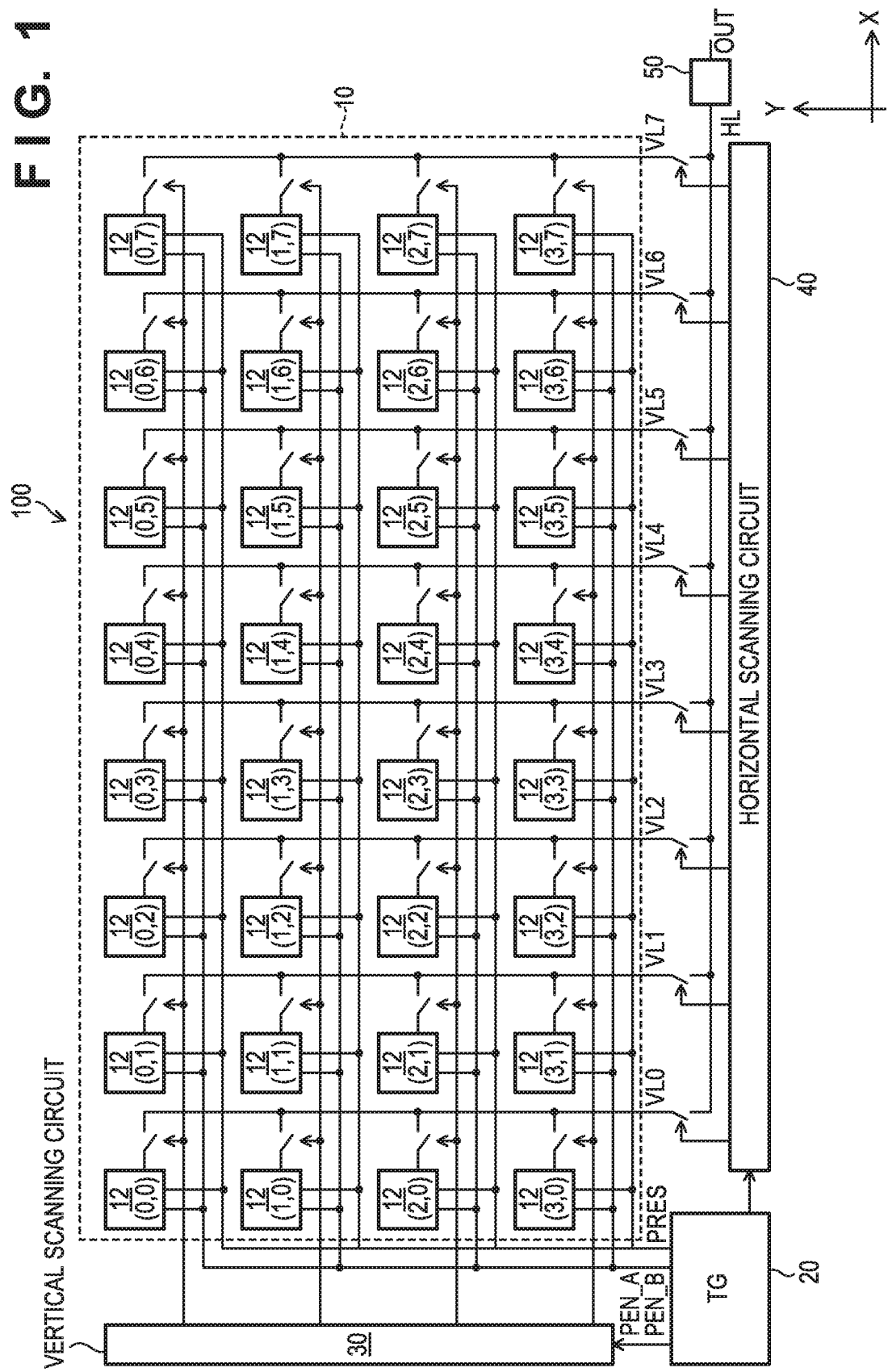
FIG. 1 is a block diagram illustrating the overall configuration of an imaging device according to a first embodiment of the present invention.
Figure 2:
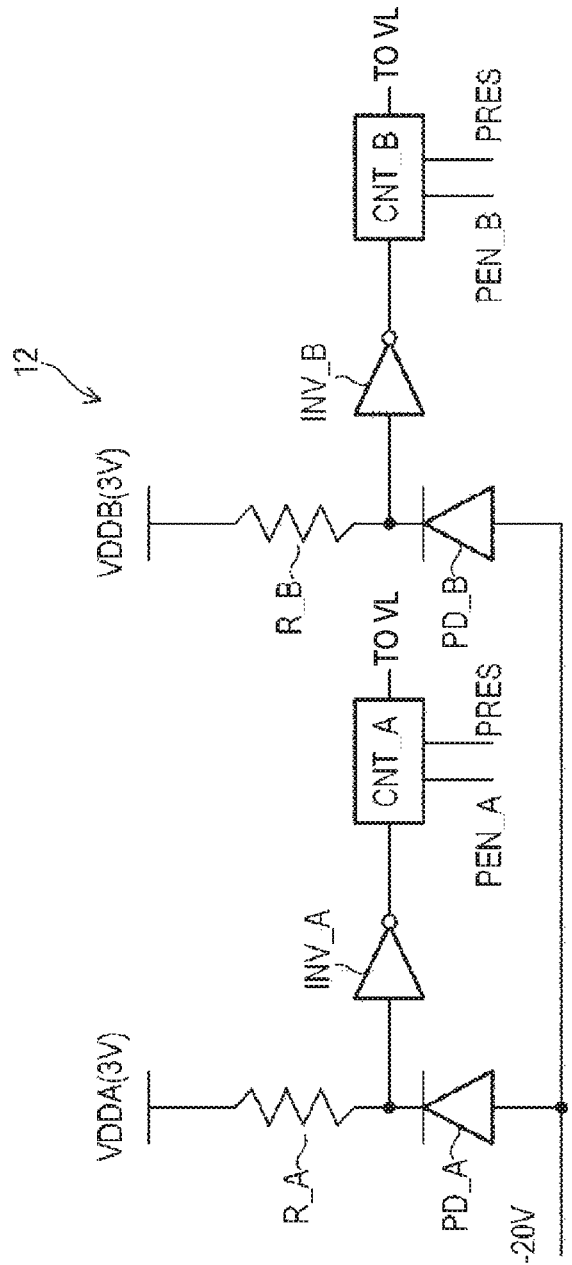
FIG. 2 is a circuit diagram illustrating an example of the configuration of a pixel in the imaging device according to the first embodiment of the present invention.

First, the overall configuration of an imaging device 100 according to the present embodiment will be described with reference to FIG. 1 and FIG. 2. FIG. 1 is a block diagram illustrating the overall configuration of the imaging device according to the present embodiment. FIG. 2 is a circuit diagram illustrating an example of the configuration of a pixel in the imaging device according to the present embodiment.

As illustrated in FIG. 1, the imaging device 100 according to the present embodiment includes a pixel region 10, a timing generation circuit (TG) 20, a vertical scanning circuit 30, a horizontal scanning circuit 40, and an output unit 50.

A plurality of pixels 12 arranged in a matrix over a plurality of rows and a plurality of columns are provided in the pixel region 10. Although FIG. 1 illustrates 32 pixels 12 arranged in four rows by eight columns, in reality, millions to tens of millions of pixels 12 are arranged in order to obtain high-resolution images. In FIG. 1, the pixels 12 are given the number 12 with coordinates representing a row number p and a column number q, for reference numerals "12(p,q)". For example, "12(2,5)" indicates the pixel 12 located in the second row and the fifth column.

A control line extending in a first direction (an X direction in FIG. 1) is provided in each row of the pixel region 10. The control line in each row is connected to each of the pixels 12 arranged in the first direction, and serves as a common signal line for those pixels 12. The first direction in which the control lines extend may be referred to as a "row direction" or a "horizontal direction". The control line in each row is connected to the vertical scanning circuit 30. The vertical scanning circuit 30 is a circuit unit that outputs, to control lines in each row, row selection signals for selecting, in units of rows, the pixels 12 from which signals are to be read out. Additionally, the pixels 12 are connected to the timing generation circuit 20, and the configuration is such that predetermined control signals (enable signals PEN_A and PEN_B, and a reset signal PRES) can be supplied to the pixels 12 from the timing generation circuit 20.

A vertical signal line VL extending in a second direction (a Y direction in FIG. 1) crossing to the first direction is provided in each column of the pixel region 10. The vertical signal line VL serves as a common signal line for the pixels 12 arranged in the second direction. The second direction in which the vertical signal lines VL extend may be referred to as a "column direction" or a "vertical direction". Note that in FIG. 1, the vertical signal lines VL are represented by the reference sign "VLq", with the column number q added. For example, the vertical signal line VL in the fourth column is given the reference sign "VL4".

The horizontal scanning circuit 40 is a circuit unit which supplies a selection signal that selects the vertical signal lines VL to output pixel signals to a horizontal signal line HL. The output unit 50 is a circuit unit for outputting the pixel signals output from the vertical signal lines VL selected by the horizontal scanning circuit 40 to the exterior of the imaging device as an output signal OUT. The timing generation circuit 20 is connected to both the vertical scanning circuit 30 and the horizontal scanning circuit 40, and supplies control signals that control the operations, and the timings thereof, of the vertical scanning circuit 30 and the horizontal scanning circuit 40.

As illustrated in FIG. 2, each of the pixels 12 includes photodiodes PD_A and PD_B, resistors R_A and R_B, inverter circuits INV_A and INV_B, and counter circuits CNT_A and CNT_B. The photodiodes PD_A and PD_B constitute light-receiving units of the pixel 12. The resistors R_A and R_B constitute quenching circuits. The inverter circuits INV_A and INV_B constitute waveform forming units. The counter circuits CNT_A and CNT_B constitute counter units of the pixel 12.

A negative voltage (e.g., −20 V) is supplied to an anode of the photodiode PD_A from a voltage supply unit (not shown) as a driving voltage. One terminal of the resistor R_A is connected to a cathode of the photodiode PD_A A positive voltage (VDDA; 3 V, for example) is supplied to another terminal of the resistor R_A from the voltage supply unit (not shown) as a driving voltage. An input terminal of the inverter circuit INV_A is connected to a connection node between the photodiode PD_A and the resistor R_A. The counter circuit CNT_A is connected to an output terminal of the inverter circuit INV_A. The enable signal PEN_A and the reset signal PRES are supplied to the counter circuit CNT_A from the timing generation circuit 20. An output of the counter circuit CNT_A serves as one output of the pixel 12.

Likewise, a negative voltage (e.g., −20 V) is supplied to an anode of the photodiode PD_B from a voltage supply unit (not shown) as a driving voltage. One terminal of the resistor R_B is connected to a cathode of the photodiode PD_B. A positive voltage (VDDB; 3 V, for example) is supplied to another terminal of the resistor R_B from the voltage supply unit (not shown) as a driving voltage. An input terminal of the inverter circuit INV_B is connected to a connection node between the photodiode PD_B and the resistor R_B. The counter circuit CNT_B is connected to an output terminal of the inverter circuit INV_B. The enable signal PEN_B and the reset signal PRES are supplied to the counter circuit CNT_B from the timing generation circuit 20. An output of the counter circuit CNT_B serves as another output of the pixel 12.

Next, an overview of operations of the imaging device 100 according to the present embodiment will be described with reference to FIG. 1 and FIG. 2.

A reverse-bias voltage of a magnitude greater than or equal to a breakdown voltage is applied to the photodiode PD_A via the resistor R_A, which functions as a quenching circuit. By applying such a large reverse-bias voltage to the photodiode PD_A, a single electron produced by photoelectrically converting a single photon incident on the photodiode PD_A can be avalanche-multiplied. When current flows in the photodiode PD_A due to the avalanche multiplication, the potential at the anode of the photodiode PD_A drops to near the potential at the cathode (−20 V). However, by providing the resistor R_A, which functions as a quenching circuit, this current can be canceled with a given time constant (known as "Geiger mode operation"). Once no current flows in the resistor R_A, the potential at the cathode of the photodiode PD_A returns to the voltage VDDA (3 V). In other words, a single voltage pulse is produced by the single electron produced by photoelectrically converting the single photon. By repeating this operation, a number of voltage pulses corresponding to the number of incident photons are output.

The inverter circuit INV_A is a buffer for shaping the aforementioned voltage pulse. The counter circuit CNT_A is a counter for counting the number of voltage pulses shaped by the inverter circuit INV_A. The counter circuit CNT_A includes an enable terminal EN_A for receiving the enable signal PEN_A from the timing generation circuit 20, and a reset terminal RES for receiving the reset signal PRES from the timing generation circuit 20. For example, by canceling a reset state effected by the reset signal PRES with the counter circuit CNT_A having been put into an enabled state using the enable signal PEN_A, the counting of the voltage pulses by the counter circuit CNT_A can be started at that point in time. Additionally, by putting the counter circuit CNT_A into a disabled state using the enable signal PEN_A at a different timing, the count value counted up to that point in time can be held. In other words, the timing generation circuit 20 supplies, to each pixel 12 in the imaging device 100, a start timing and an end timing of an accumulation period for capturing an image. The count value counted by the counter circuit CNT_A during a predetermined counting period is proportional to the number of voltage pulses produced in accordance with a received light amount, and is therefore equivalent to a value obtained from AD conversion.

Although not described here, the operations of the photodiode PD_B, the resistor R_B, the inverter circuit INV_B, and the counter circuit CNT_B are the same as the operations of the photodiode PD_A the resistor R_A, the inverter circuit INV_A, and the counter circuit CNT_A.

After the predetermined accumulation period has passed, the count values counted by the counter circuits CNT_A and CNT_B in each pixel 12 are output to the exterior of the imaging device 100 through the output unit 50. The vertical scanning circuit 30 outputs the row selection signal to the control lines in designated rows at a predetermined timing based on a control signal from the timing generation circuit 20. The pixels 12 belonging to the selected rows output the count values of the counter circuits CNT_A and CNT_B to the vertical signal lines VL in the columns corresponding to those pixels 12. The horizontal scanning circuit 40 selects the vertical signal lines VL to which the count values of the pixels 12 belonging to the selected rows are output, in order from a 0th column to a seventh column, and outputs the count values from the selected vertical signal lines VL to the horizontal signal line HL. The output unit 50 converts the count values output to the horizontal signal line HL into a predetermined serial transfer format such as LVDS (Low Voltage Differential Signal), and outputs the result as the output signal OUT. The count values from the counter circuits CNT_A and CNT_B in all of the pixels 12 can be output by repeating these operations from the 0th row to the third row.

In this manner, each pixel 12 in the imaging device according to the present embodiment outputs a signal expressing a count value based on the number of photons incident on the photodiode PD_A and a signal expressing a count value based on the number of photons incident on the photodiode PD_B. When two signals are obtained from a single pixel 12, the readout of one of the signals from the one pixel 12 and the readout of the other signal may be performed separately. In this case, the configuration may be such that the rows are selected in sequence at intervals of two horizontal synchronization periods.

For a single pixel 12, the signal expressing a count value based on the number of photons incident on the photodiode PD_A and the signal expressing a count value based on the number of photons incident on the photodiode PD_B can be used as signals for phase difference detection. In this case, the photodiodes PD_A and PD_B may be disposed under a common microlens so that light passing through different pupil regions of an imaging optical system is incident on the photodiode PD_A and the photodiode PD_B. A signal obtained by adding the signal expressing a count value based on the number of photons incident on the photodiode PD_A with the signal expressing a count value based on the number of photons incident on the photodiode PD_B can be used as a signal for capturing an image. The adding of the signals can be performed by an image processing unit (not shown).

A backside-illuminated structure can be used favorably in the imaging device 100 according to the present embodiment. In this case, a separate substrate in which the counter circuits and the like are provided is stacked on a substrate in which the photodiodes are provided, on the surface opposite from a light-incidence surface of the substrate. Control signals such as the enable signals PEN_A and PEN_B can be supplied to the surface opposite from the light-incidence surface by, for example, TSVs (rough-Silicon Vias) provided in the separate substrate.

Figure 3:
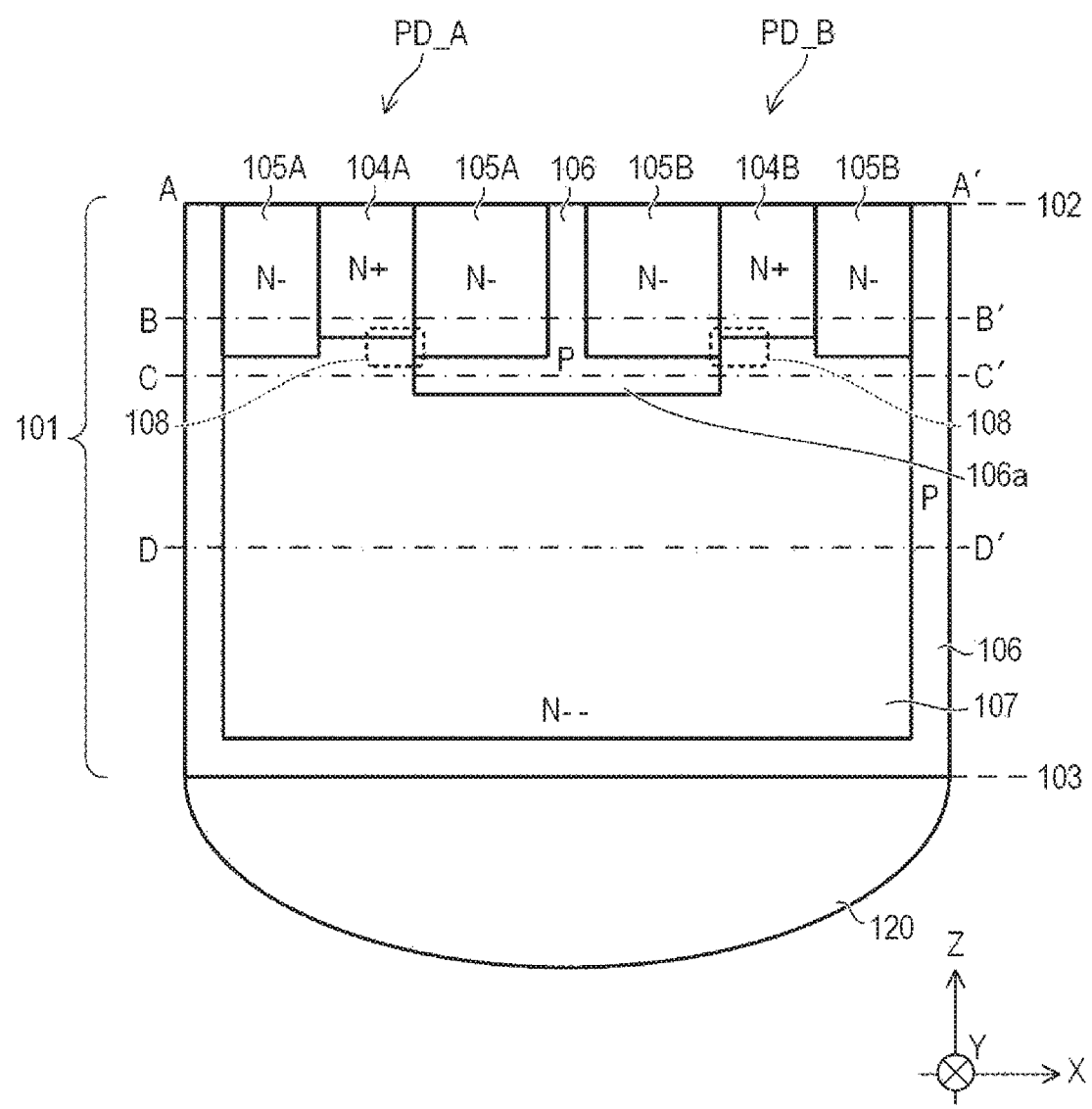
FIG. 3 is an overall cross-sectional view illustrating the structure of a pixel in the imaging device according to the first embodiment of the present invention.
Figure 6:
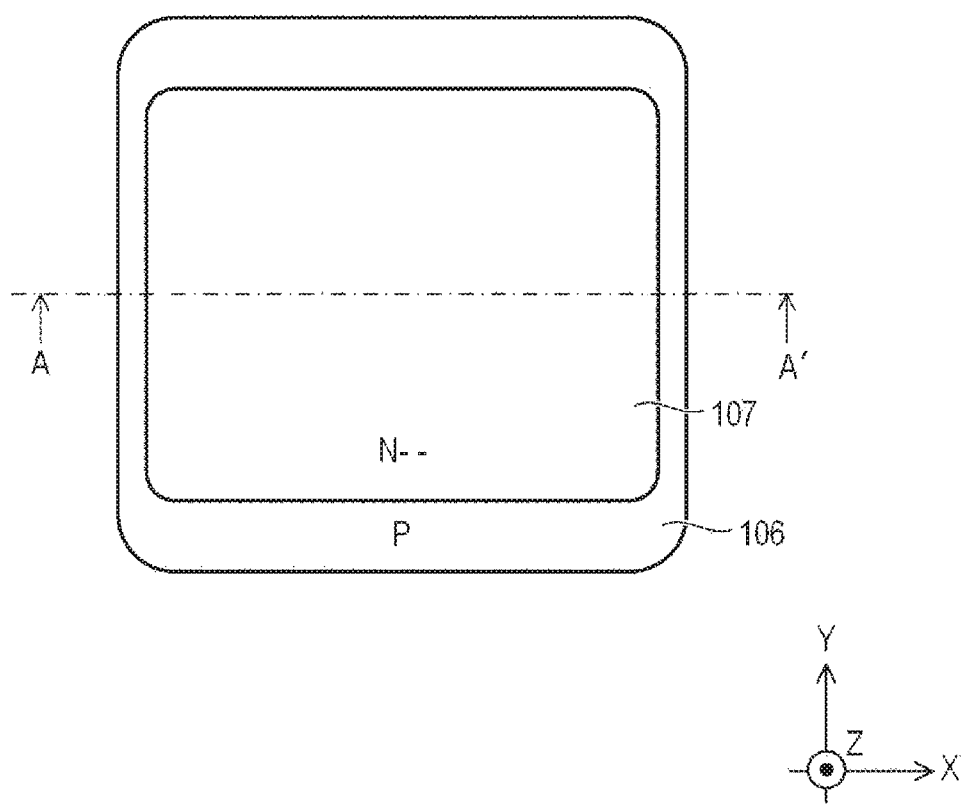
FIG. 6 is a plan view (No. 3) illustrating the structure of a pixel in the imaging device according to the first embodiment of the present invention.
Figure 7A:
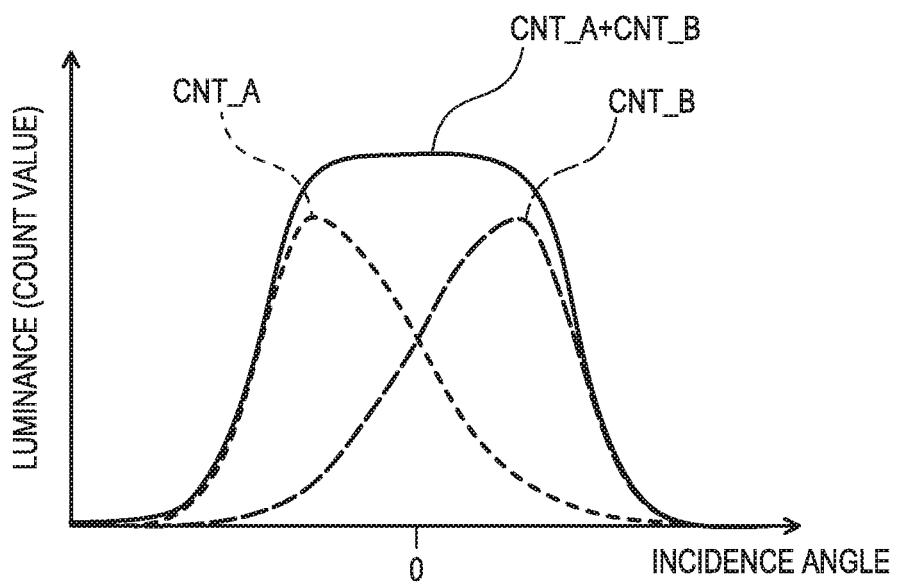
FIG. 7A is a diagram illustrating light incidence angle properties of a pixel.
Figure 7B:
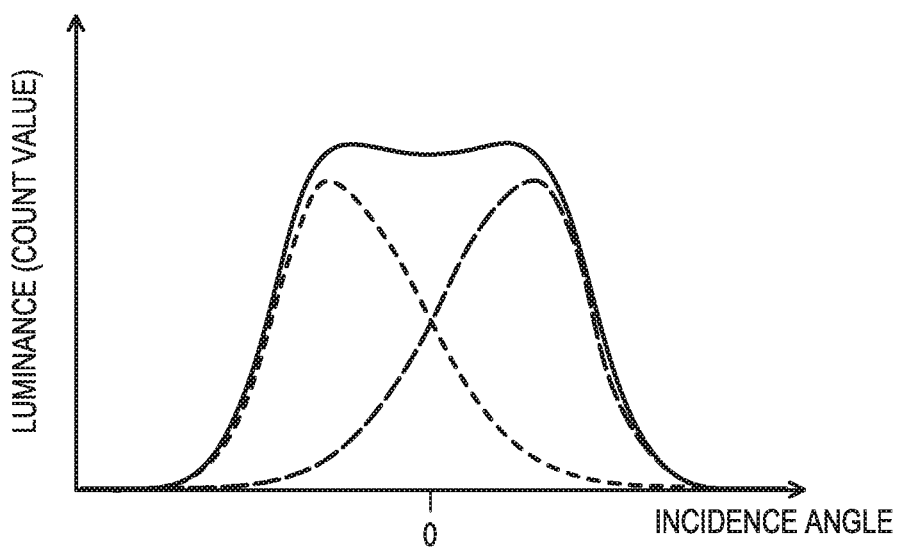
FIG. 7B is a diagram illustrating light incidence angle properties of a pixel.

The structure of the photodiodes PD_A and PD_B of the imaging device 100 according to the present embodiment will be described in further detail next with reference to FIG. 3 to FIG. 7B. FIG. 3 is an overall cross-sectional view illustrating the structure of a pixel in the imaging device according to the present embodiment. FIG. 3 illustrates the two photodiodes, i.e., the photodiode PD_A and the photodiode PD_B, in a single pixel 12. FIG. 4 to FIG. 6 are plan views illustrating the structure of a pixel in the imaging device according to the present embodiment. FIG. 4 is a plan view of a plane, parallel to a surface of a semiconductor substrate 101, which contains the line B-B' in FIG. 3. FIG. 5 is a plan view of a plane, parallel to the surface of the semiconductor substrate 101, which contains the line C-C' in FIG. 3. FIG. 6 is a plan view of a plane, parallel to the surface of the semiconductor substrate 101, which contains the line D-D' in FIG. 3. Note that FIG. 3 is a cross-sectional view taken along the line A-A' in FIG. 4, FIG. 5, and FIG. 6. FIG. 7A and FIG. 7B are diagrams illustrating light incidence angle properties of a pixel.

As illustrated in FIG. 3, the photodiode PD_A and the photodiode PD_B of the pixel 12 are provided in the semiconductor substrate 101, which has a first surface 102 and a second surface 103 on the opposite side therefrom. A high-concentration (N+) N-type semiconductor region 104A, which constitutes the cathode of the photodiode PD_A, is provided in a surface part of the semiconductor substrate 101 on the first surface 102 side thereof. Additionally, a high-concentration (N+) N-type semiconductor region 104B, which constitutes the cathode of the photodiode PD_B, is provided in a surface part of the semiconductor substrate 101 on the first surface 102 side thereof, distanced from the N-type semiconductor region 104A in the X direction. Furthermore, a low-concentration (N−) N-type semiconductor region 105A disposed so as to surround side surfaces of the N-type semiconductor region 104A, and a low-concentration (N−) N-type semiconductor region 105B disposed so as to surround side surfaces of the N-type semiconductor region 104B, are provided on the surface part on the first surface 102 side. The N-type semiconductor regions 105A and 105B are provided to a deeper position, from the first surface 102 of the semiconductor substrate 101, than bottom parts of the N-type semiconductor regions 104A and 104B.

Additionally, as illustrated in FIG. 3 and FIG. 4, a P-type semiconductor region 106, which constitutes the anodes of the photodiodes PD_A and PD_B, is provided in the surface part of the semiconductor substrate 101 on the first surface 102 thereof, so as to surround the side surfaces of the N-type semiconductor regions 105A and 105B. The P-type semiconductor region 106 is provided between the N-type semiconductor regions 104A and 105A and the N-type semiconductor regions 104B and 105B, and has a function of electrically isolating those sets of regions from each other. Specifically, the P-type semiconductor region 106 has a function of preventing a potential change arising when the photodiode PD_A, which takes the N-type semiconductor region 104A as its cathode, operates in Geiger mode, from being transmitted to the N-type semiconductor region 104B. Additionally, the P-type semiconductor region 106 has a function of preventing a potential change arising when the photodiode PD_B, which takes the N-type semiconductor region 104B as its cathode, operates in Geiger mode, from being transmitted to the N-type semiconductor region 104A. To that end, the P-type semiconductor region 106 is provided deeper in the semiconductor substrate 101 at least than the N-type semiconductor regions 105A and 105B.

As illustrated in FIG. 3 to FIG. 5, the P-type semiconductor region 106 extends from the side surfaces and across the bottom parts of the N-type semiconductor regions 105A and 105B in a region in which, seen in plan view, the N-type semiconductor region 104A and the N-type semiconductor region 104B oppose each other. For the sake of simplicity, the part of the P-type semiconductor region 106 that extends along the bottom parts of the N-type semiconductor regions 105A and 105B may be called a "P-type semiconductor region 106a" in the following descriptions.

As illustrated in FIG. 3, the P-type semiconductor region 106a and the N-type semiconductor regions 104A and 104B are separated by a predetermined gap based on the difference between the depths of the N-type semiconductor regions 104A and 104B and the depths of the N-type semiconductor regions 105A and 105B. Furthermore, as illustrated in FIG. 4 and FIG. 5, the P-type semiconductor region 106a is provided across the entirety of a region, seen in plan view, which is between the N-type semiconductor region 104A and the N-type semiconductor region 104B. In other words, viewed in plan view, the P-type semiconductor region 106a extends continuously between the N-type semiconductor region 104A and the N-type semiconductor region 104B. In terms of its relationship with the N-type semiconductor regions 105A and 105B, the P-type semiconductor region 106a is provided so as to cover a region, of the bottom parts of the N-type semiconductor regions 105A and 105B, which is between the N-type semiconductor region 104A and the N-type semiconductor region 104B.

As illustrated in FIG. 3 to FIG. 6, the P-type semiconductor region 106 located at a part corresponding to the boundary with the adjacent pixel extends along the side surfaces of the N-type semiconductor regions 105A and 105B, to the second surface 103 side of the semiconductor substrate 101, and along a surface part of the second surface 103. The P-type semiconductor region 106 can be used as a separating part for separating adjacent pixels.

The N-type semiconductor regions 105A and 105B are provided between the P-type semiconductor region 106 and each of the N-type semiconductor regions 104A and 104B, and function as a guard ring. In other words, the N-type semiconductor regions 105A and 105B are constituted by semiconductor regions having a lower impurity concentration than the N-type semiconductor regions 104A and 104B, which weakens an electrical field between the P-type semiconductor region 106 and the N-type semiconductor regions 104A and 104B and prevents edge breakdown.

As illustrated in FIG. 3 and FIG. 6, an N-type semiconductor region 107 which is electrically connected to the N-type semiconductor regions 104A and 104B is provided in a deep part of the semiconductor substrate 101. The N-type semiconductor region 107 makes contact with the P-type semiconductor region 106 at the second surface 103 side and side surface parts thereof, and forms a junction surface with the P-type semiconductor region 106. Additionally, the N-type semiconductor region 107 makes contact with the P-type semiconductor region 106a at the first surface 102 side thereof, and forms a junction surface with the P-type semiconductor region 106a. The N-type semiconductor region 107 functions as part of light-receiving regions of the photodiode PD_A and the photodiode PD_B. The N-type semiconductor region 107 is typically constituted by a semiconductor region (N--) having a lower impurity concentration than the N-type semiconductor regions 104A, 104B, 105A, and 105B. The region where the N-type semiconductor region 107 is provided is a region which is depleted when the imaging device is being driven. The region does not absolutely need to be constituted by an N-type semiconductor region, and may be constituted by a low-concentration P-type semiconductor region instead.

Additionally, a microlens 120 for focusing light, which has been formed into an image by an imaging optical system (not shown), onto the photodiode PD_A and the photodiode PD_B, is provided on the second surface 103 of the semiconductor substrate 101. A single pixel 12 includes a single microlens 120 for the two photodiodes PD_A and PD_B, and the configuration is such that light passing through different pupil regions of the imaging optical system is incident on the photodiode PD_A and the photodiode PD_B. A pair of images having parallax with respect to a predetermined direction can be obtained as a result.

An optical axis of the microlens 120 substantially matches the center of the light-receiving unit in a plan view of the pixel 12. It is desirable that the N-type semiconductor region 104A constituting the photodiode PD_A and the N-type semiconductor region 104B constituting the photodiode PD_B be disposed adjacent to each other, with the center of the light-receiving unit of the pixel 12 located therebetween, in a plan view.

The photodiodes PD_A and PD_B and the microlens 120 constituting a single pixel 12 are disposed in a two-dimensional matrix in the semiconductor substrate 101. At this time, as described earlier, the P-type semiconductor region 106 located at the side surface parts in FIG. 3 functions as a separating part for separating adjacent pixels 12.

Note that in the example illustrated in FIG. 3 to FIG. 6, the P-type semiconductor region 106 is extended along the side surfaces of the N-type semiconductor regions 105A and 105B to the second surface 103 side of the semiconductor substrate 101, from the standpoint of separating adjacent pixels 12 using the P-type semiconductor region 106. However, defining the space between the pixels 12 using the P-type semiconductor region 106 is not a required configuration in the present invention.

The light incident on the photodiodes PD_A and PD_B is focused by the microlens 120, and thus the probability that the light incident on a pixel adjacent to one pixel 12 will leak to the photodiodes PD_A and PD_B of that one pixel 12 is extremely low. Additionally, with the imaging device 100 according to the present embodiment, there is an increased detection efficiency between the N-type semiconductor regions 104A and 105A, as will be described later. As such, a relatively extremely low amount of color mixing will arise between pixels 12 which have gone through Geiger mode operation. Accordingly, the P-type semiconductor region 106 does not absolutely have to be provided between the pixels 12.

However, in an imaging device where adjacent pixels have different spectral properties, such as with a Bayer color filter arrangement, even slight color mixing between pixels often leads to a drop in image quality, and thus a configuration in which the pixels 12 are separated by the P-type semiconductor region 106 is favorable. In this case, the color filter can be disposed between the semiconductor substrate 101 and the microlens 120.

A large negative voltage (e.g., −20 V) is applied to the P-type semiconductor region 106 via a contact electrode (not shown) disposed on the first surface 102 side of the semiconductor substrate 101. A positive voltage (the voltage VDDA; 3 V, for example) is applied to the N-type semiconductor region 104A via the resistor R_A, which functions as a quenching circuit, a contact electrode (not shown) disposed on the first surface 102 side of the semiconductor substrate 101, and soon. Additionally, a positive voltage (a voltage VDDB; 3 V, for example) is applied to the N-type semiconductor region 104B via the resistor R_B, which functions as a quenching circuit, a contact electrode (not shown) disposed on the first surface 102 side of the semiconductor substrate 101, and so on. This broadens a depleted region of the pn junction between the P-type semiconductor regions 106 and 106a and the N-type semiconductor region 107, and an electron-hole pair is produced by the excitation of the photons incident on this depleted region.

Of the carrier generated in this manner, the holes collect in the P-type semiconductor region 106 due to electrical field drift, and are discharged to the exterior of the imaging device 100. On the other hand, the electrons of the generated carrier are dispersed within the N-type semiconductor region 107 due to electrical field drift, and collect in the N-type semiconductor region 104A or the N-type semiconductor region 104B. In this process, the electrons induce avalanche multiplication in a high-electrical field region 108 where the distance between the P-type semiconductor region 106a and the N-type semiconductor regions 104A and 104B is short, and the many electrons produced as a result collect in the N-type semiconductor region 104A or the N-type semiconductor region 104B. The high-electrical field region 108 can therefore also be called an avalanche multiplication region.

As described earlier, the P-type semiconductor region 106a extends continuously between the N-type semiconductor region 104A and the N-type semiconductor region 104B, and has a junction surface with the N-type semiconductor region 107. This prompts the electrons produced in the depleted region to drift in the direction of the N-type semiconductor regions 104A and 104B, making it possible to induce avalanche multiplication in the high-electrical field region 108 before the electrons disappear due to recombination.

In other words, electrons produced by photons normally incident on an intermediate region between the N-type semiconductor region 104A and the N-type semiconductor region 104B have a 50% probability of inducing avalanche multiplication in the high-electrical field region 108 between the N-type semiconductor region 104A and the P-type semiconductor region 106. The remaining 50% probability is the probability of the electrons inducing avalanche multiplication in the high-electrical field region 108 between the N-type semiconductor region 104B and the P-type semiconductor region 106. This makes it possible to greatly improve the photon detection efficiency.

As a result, the imaging device according to the present embodiment can achieve light incidence angle properties such as those indicated in FIG. 7A, for example. In FIG. 7A and FIG. 7B, the dotted line represents the count value of the counter circuit CNT_A relative to a light incidence angle (the horizontal axis), the dot-dash line represents the count value of the counter circuit CNT_B relative to the light incidence angle (the horizontal axis), and the solid line represents the total of the two. In addition to the light reception efficiency, the aforementioned detection efficiency affects the output value. Additionally, a light incidence angle of 0° corresponds to a photon which is normally incident.

As indicated by the solid line in FIG. 7A, the light incidence angle properties have a shape that peaks at an incidence angle of 0° and do not have inflection points near that peak. Thus, the shape of bokeh for a point light source is a perfect circle in which the luminance is highest at the center. This is a phenomenon caused by the light incidence angle properties illustrated in FIG. 7A propagating as a point spread function (PSF), and bokeh having a soft luminance, which is generally preferable in photographic expression, is reproduced even in subjects aside from point light sources.

Meanwhile, an electron produced by a photon incident on a light-receiving region closer to either of the N-type semiconductor region 104A and the N-type semiconductor region 104B than the center will induce avalanche multiplication in the high-electrical field region 108 closer to the region where the photon is incident. Accordingly, separation characteristics between a signal based on a photon detected by the photodiode PD_A and a signal based on a photon detected by the photodiode PD_B can be improved. This appears in pupil separation characteristics used in phase difference detection, as indicated by the dotted line and the dot-dash line in FIG. 7A and FIG. 7B.

PTL 2 describes conditions for depleting a first semiconductor region using a reverse-bias voltage applied between a first semiconductor region of a first conductivity type and a second semiconductor region of a second conductivity type which constitute a photoelectric conversion unit, in a case where the photoelectric conversion unit of a single pixel is divided into a plurality of parts. When the plurality of first semiconductor regions obtained from the division are completely depleted, the depleted regions make contact with each other, which is described as providing favorable light incidence angle properties during image capturing in which the signals from the divided photoelectric conversion units are added and output. However, when a reverse-bias voltage greater than or equal to the breakdown voltage is applied between the first semiconductor region and the second semiconductor region via a quenching circuit, for operating in Geiger mode as a SPAD, bokeh similar to that achieved when the photoelectric conversion units are not divided cannot be achieved.

This is because to achieve sensitivity during Geiger mode operation, it is necessary to bring not only the light receiving rate of the photoelectric conversion units, but also the probability that a single electron obtained by photoelectrically converting a photon can be avalanche-multiplied, i.e., the detection efficiency, close to 1. In particular, it is difficult for a high electrical field to act on electrons produced in a region between a plurality of photoelectric conversion units, which reduces the detection efficiency. When an inflection point arises near the peak of the light incidence angle properties as a result, for example, the central luminance of a point light source shifted from the focal point of the imaging optical system will drop and appear as a ring shape, and bokeh similar to that achieved when the photoelectric conversion units are not divided cannot be achieved.

FIG. 7B illustrates, as a comparative example, light incidence angle properties assuming a case where the detection efficiency for photons normally incident on the center of the pixel 12 has dropped below 100%. These properties have a shape in which there is an inflection point where the output drops near an incidence angle of 0°, and thus the shape of bokeh of a point light source propagating these properties as a PSF will be reproduced as a ring shape having a reduced central luminance. This is generally not preferable in photographic expressions.

In this manner, in the imaging device 100 according to the present embodiment, focus detection using the phase difference detection method can be performed by using a signal based on the output of the photodiode PD_A and a signal based on the output of the photodiode PD_B. Additionally, when generating an image using a signal obtained by adding the signal based on the output of the photodiode PD_A and the signal based on the output of the photodiode PD_B, a bokeh similar to that achieved when not performing pupil division can be realized.

Although the layout illustrated in FIG. 3 to FIG. 6 is an example of a case of pupil division along the X direction in FIG. 1, i.e., along the horizontal direction (the row direction), the direction of the pupil division does not absolutely have to be the horizontal direction. An example of a case of pupil division performed in a direction different from the horizontal direction described thus far will be described with reference to FIG. 8A to FIG. 11. FIG. 8A to FIG. 11 are plan views illustrating the structure of an imaging device according to variations on the present embodiment.

Figure 8A:
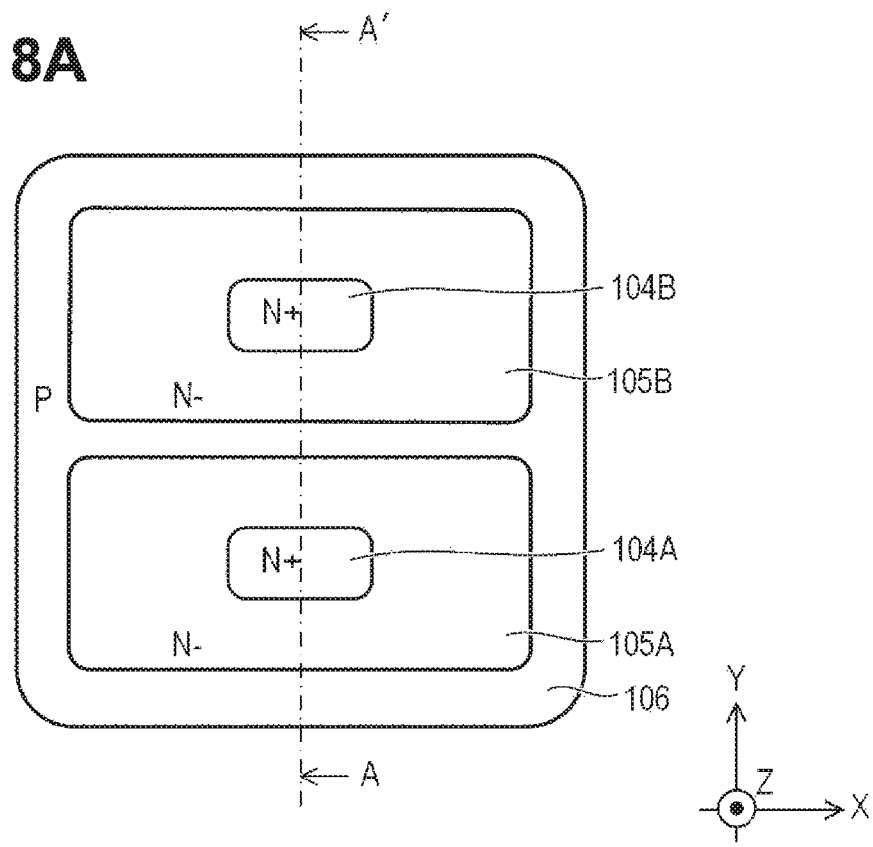
FIG. 8A is a plan view (No. 1) illustrating the structure of an imaging device according to a variation on the first embodiment of the present invention.
Figure 8B:
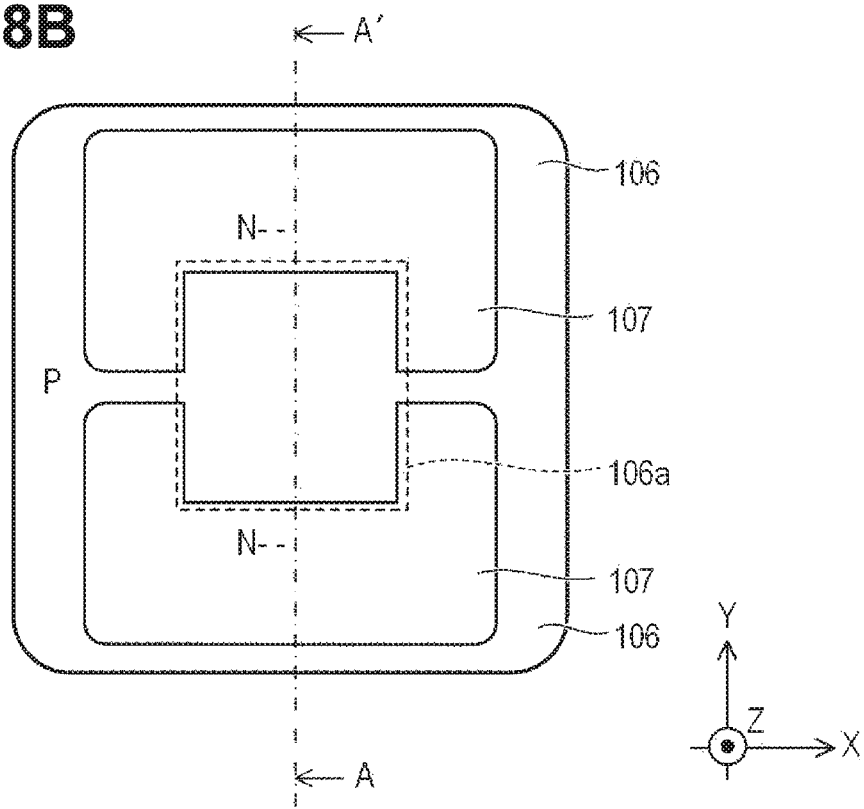
FIG. 8B is a plan view (No. 1) illustrating the structure of an imaging device according to a variation on the first embodiment of the present invention.

FIG. 8A and FIG. 8B are examples of a layout when pupil division is performed along the Y direction in FIG. 1, i.e., along the vertical direction (the column direction). FIG. 8A is a plan view of a plane, parallel to a surface of the semiconductor substrate 101, which contains the line B-B' in FIG. 3. FIG. 8B is a plan view of a plane, parallel to a surface of the semiconductor substrate 101, which contains the line C-C' in FIG. 3. Note that a cross-sectional view along the line A-A' in FIG. 8A and FIG. 8B is the same as in FIG. 3. Additionally, a plan view of a plane, parallel to the surface of the semiconductor substrate 101, which contains the line D-D' in FIG. 3, is the same as FIG. 6.

Figure 9A:
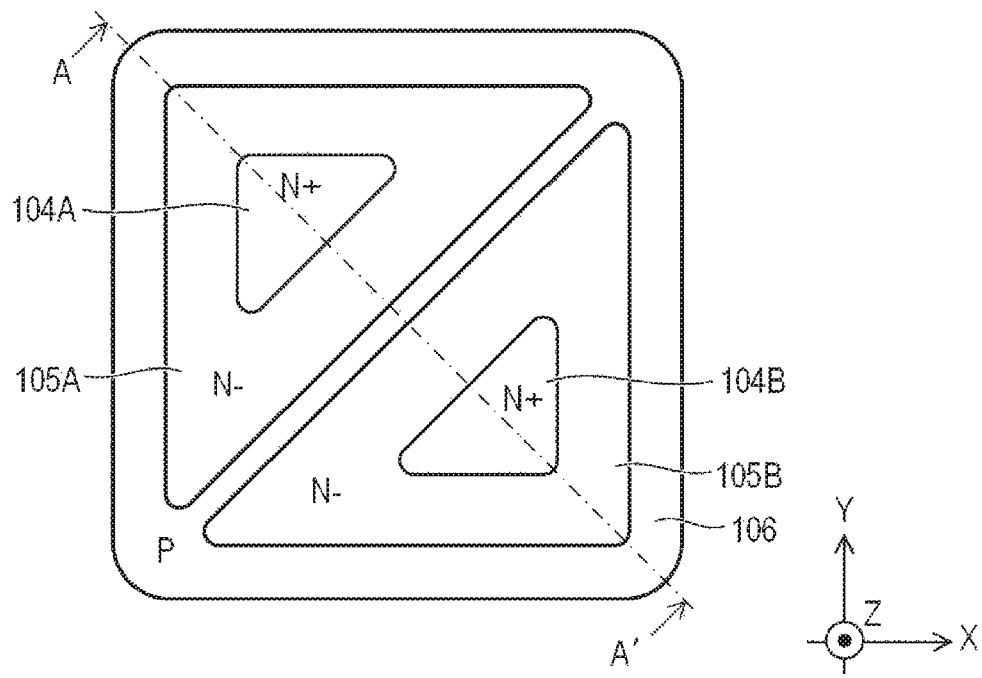
FIG. 9A is a plan view (No. 2) illustrating the structure of an imaging device according to a variation on the first embodiment of the present invention.
Figure 9B:
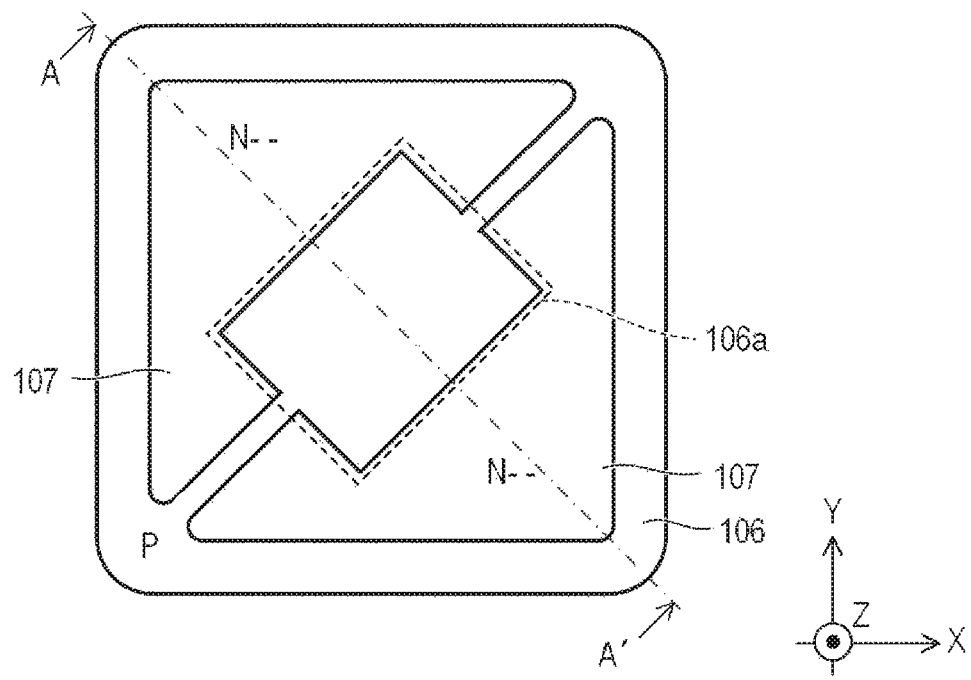
FIG. 9B is a plan view (No. 2) illustrating the structure of an imaging device according to a variation on the first embodiment of the present invention.

FIG. 9A and FIG. 9B are examples of a layout when pupil division is performed along a downward-right diagonal direction. FIG. 9A is a plan view of a plane, parallel to a surface of the semiconductor substrate 101, which contains the line B-B' in FIG. 3. FIG. 9B is a plan view of a plane, parallel to a surface of the semiconductor substrate 101, which contains the line C-C' in FIG. 3. Note that a cross-sectional view along the line A-A' in FIG. 9A and FIG. 9B is the same as in FIG. 3. Additionally, a plan view of a plane, parallel to the surface of the semiconductor substrate 101, which contains the line D-D' in FIG. 3, is the same as FIG. 6.

Figure 10A:
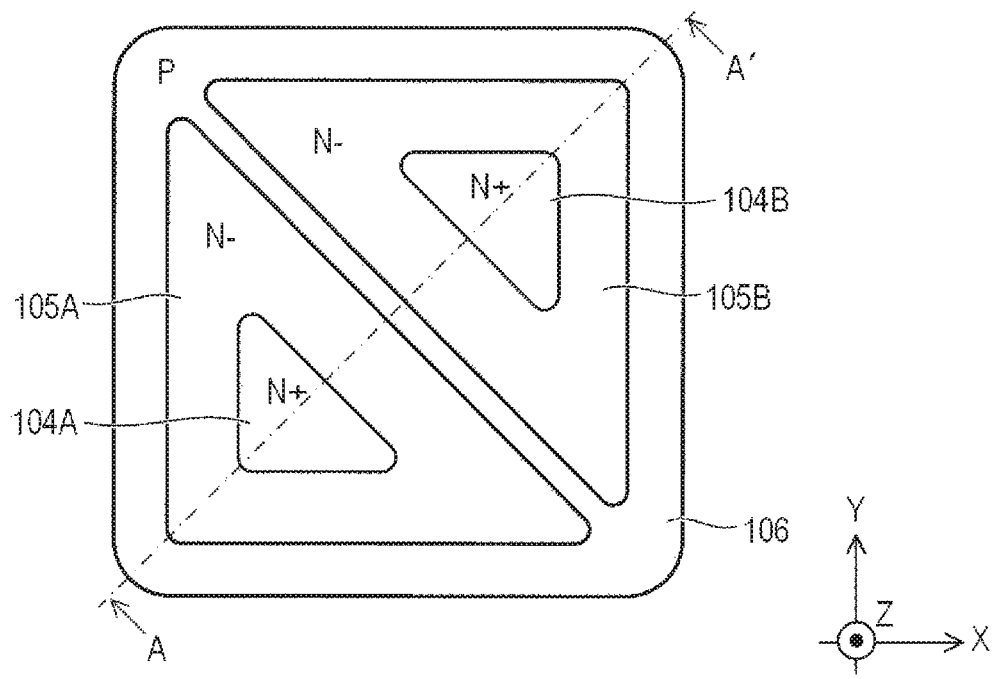
FIG. 10A is a plan view (No. 3) illustrating the structure of an imaging device according to a variation on the first embodiment of the present invention.
Figure 10B:
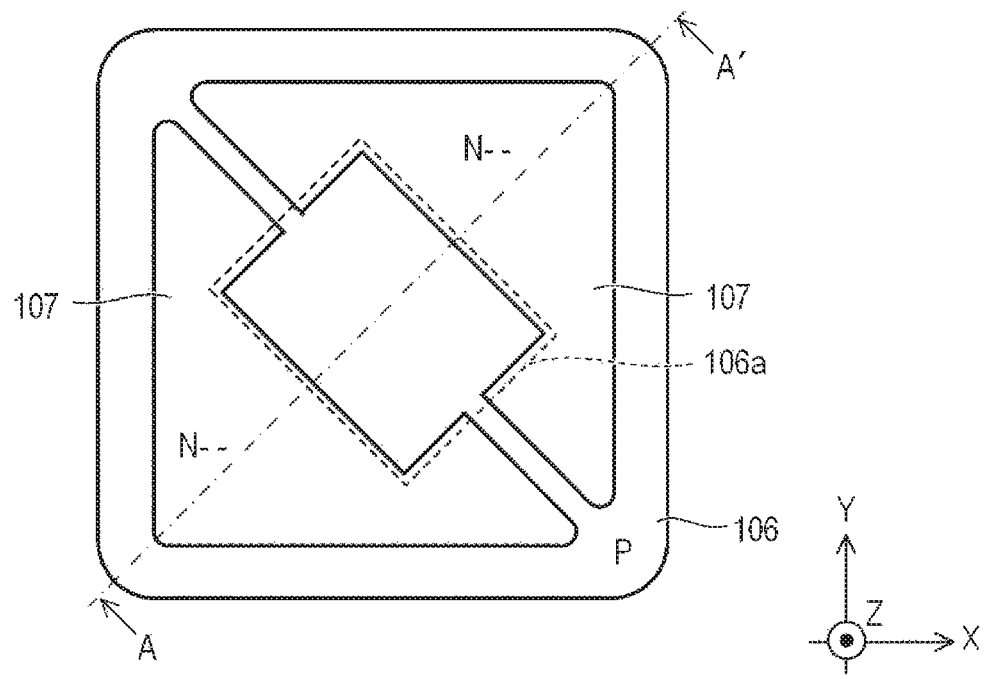
FIG. 10B is a plan view (No. 3) illustrating the structure of an imaging device according to a variation on the first embodiment of the present invention.

FIG. 10A and FIG. 10B are examples of a layout when pupil division is performed along a downward-left diagonal direction. FIG. 10A is a plan view of a plane, parallel to a surface of the semiconductor substrate 101, which contains the line B-B' in FIG. 3. FIG. 10B is a plan view of a plane, parallel to a surface of the semiconductor substrate 101, which contains the line C-C' in FIG. 3. Note that a cross-sectional view along the line A-A' in FIG. 10A and FIG. 10B is the same as in FIG. 3. Additionally, a plan view of a plane, parallel to the surface of the semiconductor substrate 101, which contains the line D-D' in FIG. 3, is the same as FIG. 6.

By disposing pixels 12 having different pupil division directions within the pixel arrangement illustrated in FIG. 1, pupil division in different directions can be realized, and thus can be used in focus detection. FIG. 11 is an example of a pixel arrangement using pixels 12 in which pupil division has been performed in the downward-right diagonal direction (FIG. 9A and FIG. 9B) and pixels 12 in which pupil division has been performed in the downward-left diagonal direction (FIG. 10A and FIG. 10B). Here, the pixel arrangement is illustrated using a plan view of a plane parallel to the surface of the semiconductor substrate 101 including the line C-C' in FIG. 3, so that the pupil division directions can be seen. In FIG. 11, in a Bayer pattern pixel arrangement, pixels 12 pupil-divided in the downward-right diagonal direction and pixels 12 pupil-divided in the downward-left diagonal direction are disposed in alternating groups of two rows each. The letters R. G, and B added to the pixels 12 in FIG. 11 indicate that red, green, or blue color filters have been provided for those pixels. By using such an arrangement, a pupil division direction at which a longer baseline length can be achieved can be selected in a peripheral region of the screen, where aperture vignetting arises due to the lens frame, and this makes it possible to realize highly-accurate focus detection.

A configuration in which pixels 12 pupil-divided in the vertical direction, as indicated in FIG. 8A and FIG. 8B, are disposed in part of a region where pixels 12 pupil-divided in the horizontal direction, as indicated in FIG. 5 to FIG. 7B, are arranged, can be given as another example of a pixel arrangement. Doing so makes it possible to realize focus detection for subjects having both vertical lines and horizontal lines.

Note that the pupil division direction is not limited to the four division directions described in the present embodiment. Furthermore, the method of configuring the pixel arrangement using pixels having different pupil division directions is not limited to that described in the present embodiment.

Figure 12:
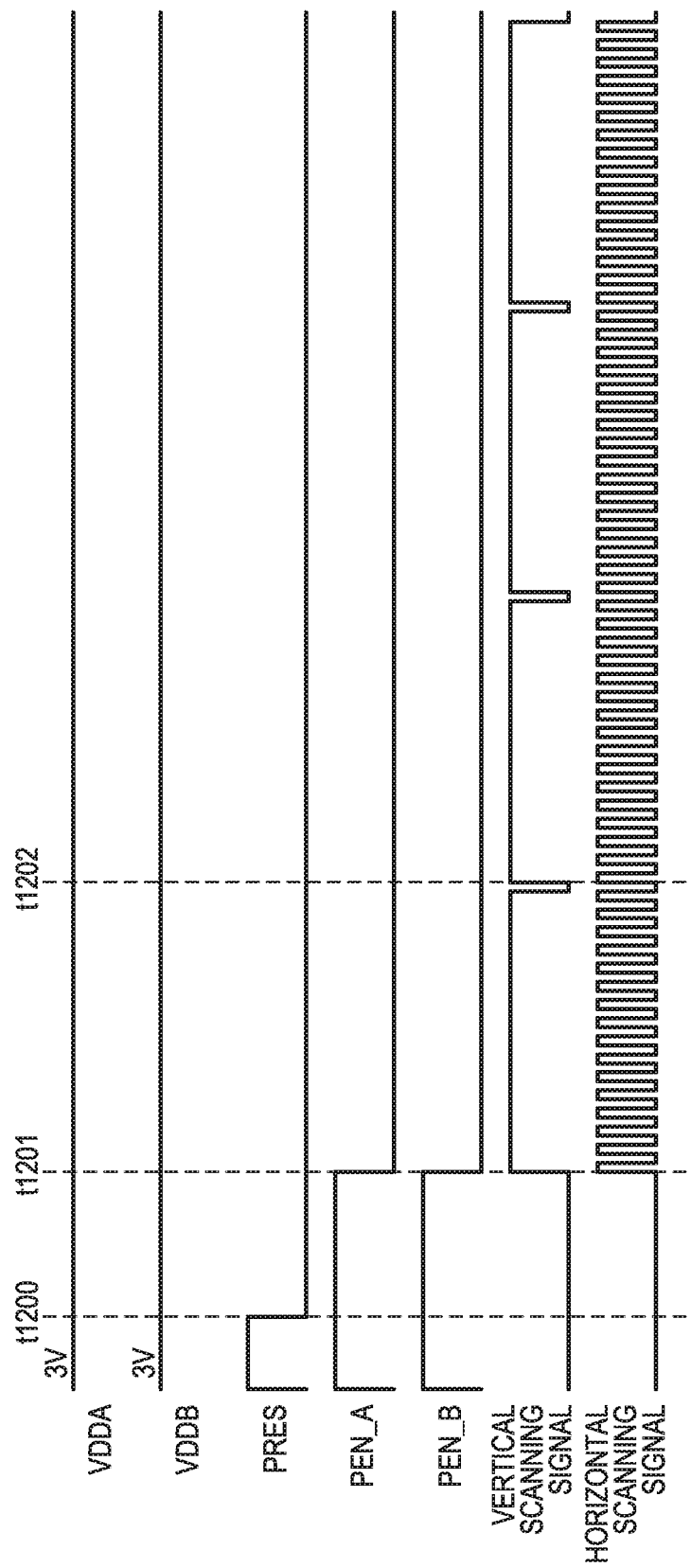
FIG. 12 is a timing chart (No. 1) illustrating a driving method of the imaging device according to the first embodiment of the present invention.
Figure 13:
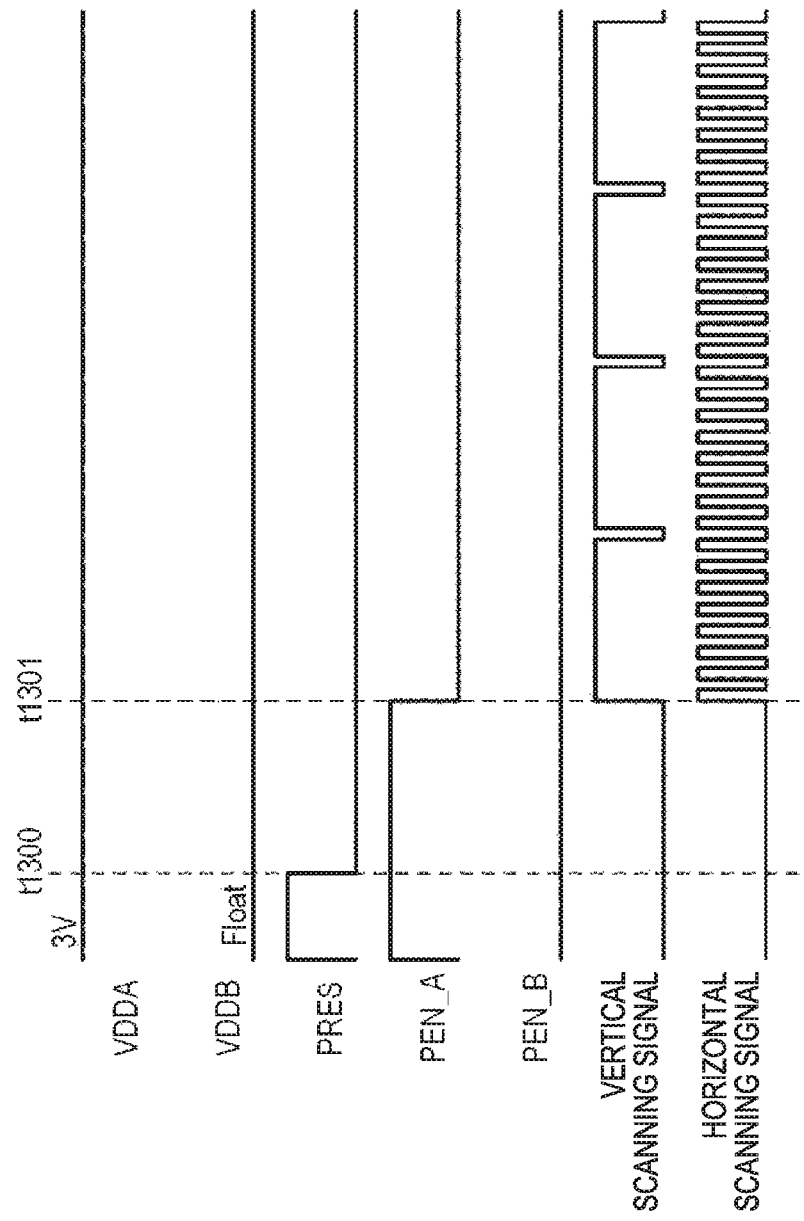
FIG. 13 is a timing chart (No. 2) illustrating a driving method of the imaging device according to the first embodiment of the present invention.

An imaging device and a driving method thereof according to the present embodiment will be described next with reference to FIG. 12 and FIG. 13. FIG. 12 and FIG. 13 are timing charts illustrating a driving method of the imaging device according to the present embodiment.

Although not particularly limited thereto, the imaging device according to the present embodiment can operate in, for example, a first driving mode, which is illustrated in FIG. 12, and a second driving mode, which is illustrated in FIG. 13.

FIG. 12 is an example of a timing chart indicating the first driving mode, which obtains phase difference detection signals. A positive voltage (e.g., 3 V) is applied to each pixel 12 as both the voltage VDDA and the voltage VDDB, which induces avalanche multiplication in the high-electrical field region 108 and puts the pixels into a state where the pixels can operate in Geiger mode.

At time t200, the timing generation circuit 20 puts the reset signal PRES to low level (Lo) to cancel the reset state of the counter circuit CNT_A and the counter circuit CNT_B. At this time, if the enable signal PEN_A is high level (Hi), the counter circuit CNT_A counts the number of voltage pulses resulting from the Geiger mode operation arising in the photodiode PD_A. Likewise, if the enable signal PEN_B is high level (Hi), the counter circuit CNT_B counts the number of voltage pulses resulting from the Geiger mode operation arising in the photodiode PD_B. The counter circuits CNT_A and CNT_B count the number of voltage pulses until, at time t1201, the timing generation circuit 20 sets the enable signals PEN_A and PEN_B to Lo (the counting period described above).

Next, from time 1201 on, the count values counted by the counter circuits CNT_A and CNT_B of the pixels 12 are readout. First, at time t1201, a vertical scanning signal goes to Hi, and the 0th row is selected. Next, the horizontal scanning circuit 40 supplies a horizontal scanning signal to each row in sequence up until time t1202, when the vertical scanning signal again changes polarity and the first row is selected, and the count values of eight pixels 12, from the 0th column to the seventh column in the 0th row, are read out in sequence via the horizontal signal line HL. In FIG. 13, the horizontal scanning signal repeats the polarity change 16 times, equivalent to double the number of pixels 12, in order to read out the 16 count values corresponding to the counter circuits CNT_A and CNT_B in the pixels 12. Next, from time t1202 on, the readout is performed for the first row to the third row in the same manner as the readout of the 0th row described above.

An image capturing signal can be obtained by using an image processing unit (not shown) to add the count value of the counter circuit CNT_A and the count value of the counter circuit CNT_B, which have been read out as phase difference detection signals. However, if it is sufficient to read out only an image capturing signal from the imaging device 100, such as when a dedicated autofocus sensor is provided in addition to the imaging device of the present embodiment, a different driving method, such as that described below, can be executed instead.

FIG. 13 is an example of a timing chart indicating the second driving mode, which obtains only the image capturing signal. This timing chart is different from the timing chart in FIG. 12 in that the voltage VDDB is in a floating state such that the photodiode PD_B operates in a non-Geiger mode, and the enable signal PEN_B for the corresponding counter circuit CNT_B is at Lo. Accordingly, only the photodiode PD_A operates in Geiger mode, and thus the image capturing signal concentrates on one side from the avalanche multiplication stage and is counted by the counter circuit CNT_A.

Even if a counting period corresponding to the period from time t1300 to time t1301 in the second driving mode is the same length as the period from time t1200 to time t1201 in the first driving mode, it is sufficient for the number of count values which are read out to be half of the number read out in the first driving mode. Accordingly, the readout period for each row from time t1301 on is a length which is half that in the first driving mode.

When the voltage VDDB is in a floating state, in the photodiode PD_B, the N-type semiconductor region 104B is in a non-reset state. As such, the photodiode PD_B is in a balanced state satisfied by the electrons produced in the previous frame, electrons produced by dark current, and so on, and electrons produced in the light-receiving region can no longer move as a result of new drifting. All new electrons produced in the light-receiving region therefore drift to the N-type semiconductor region 104A of the photodiode PD_A and contribute to avalanche multiplication, which makes it possible to concentrate the image capturing signal.

Note that if the configuration is such that the voltage VDDB is set on a row-by-row basis, setting the voltage VDDB to 3 V in a specific row and to a floating state in other rows makes it possible to perform phase difference detection limited to certain rows. For example, performing phase difference detection in a central part of an image where a main subject is often present, e.g., the first row and the second row, and obtaining an image capturing signal in other regions, makes it possible to both shorten the readout period and obtain a phase difference detection signal. Alternatively, the phase difference detection may be limited to the pixels in a specific column, in the same manner as when limiting the phase difference detection to pixels in a specific row.

Additionally, in the second driving mode, it is desirable that a potential difference between the voltage applied to the anode of the photodiode PD_A and the voltage VDDA be set to a value higher than the value set in the first driving mode. This is because doing so makes it possible for electrons to be collected from a broader range of the light-receiving region when electrons produced in the light-receiving region are caused to drift to the N-type semiconductor region 104A. Loss of detection efficiency with respect to normally-incident photons can be eliminated as a result, and a bokeh similar to that achieved when the photoelectric conversion units are not divided can be achieved.

In this manner, according to the present embodiment, in an imaging device which uses SPADs, focus detection using a phase difference detection method can be performed, and a bokeh similar to that which is obtained when not dividing pupils when capturing an image can be achieved.

Second Embodiment

An imaging device according to a second embodiment of the present invention will be described with reference to FIG. 14 to FIG. 15B. Constituent elements which are the same as in the imaging device according to the first embodiment will be given the same reference signs, and descriptions thereof will be omitted or simplified.

Figure 14:
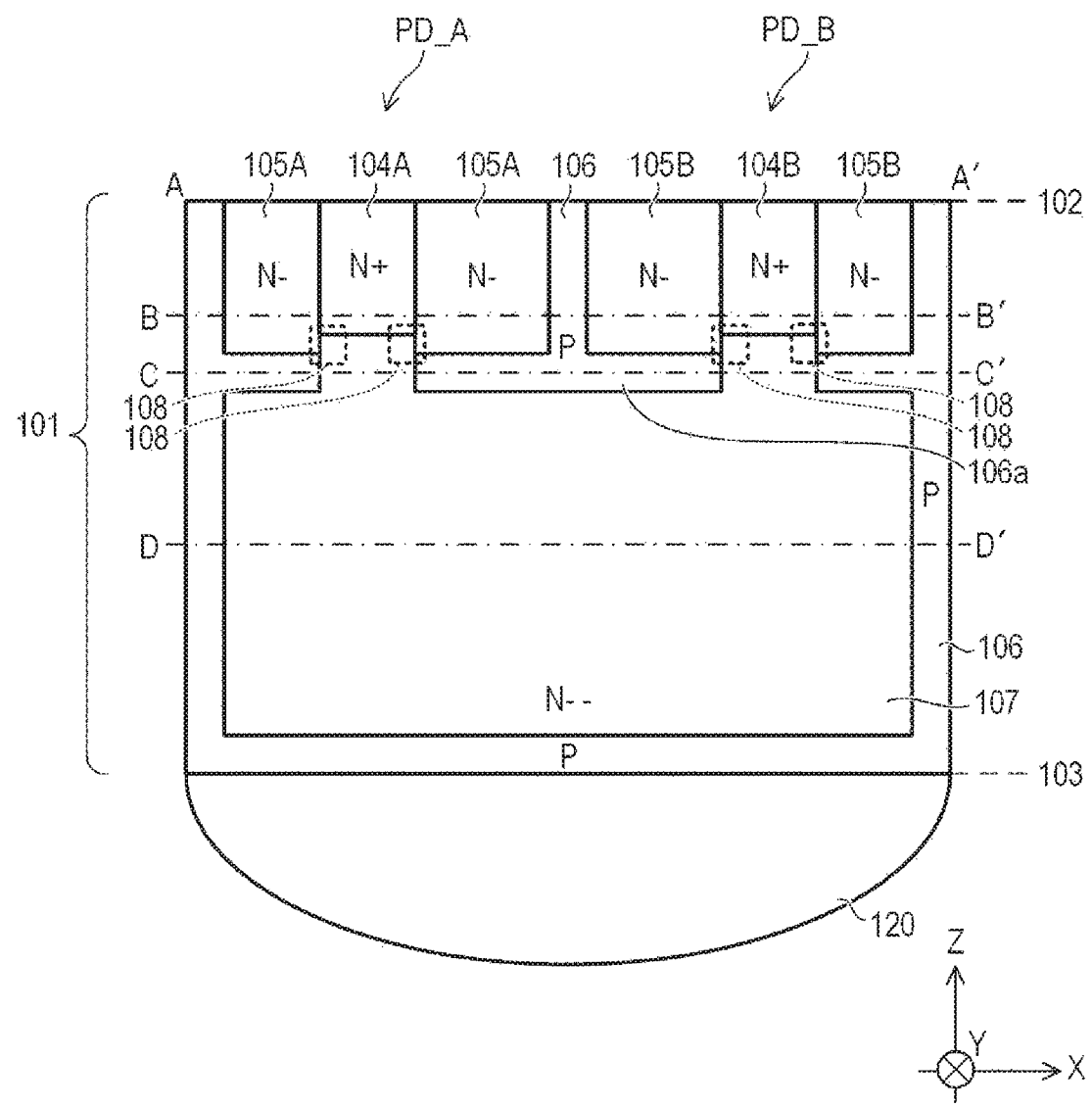
FIG. 14 is an overall cross-sectional view illustrating the structure of a pixel in an imaging device according to a second embodiment of the present invention.
Figure 15A:
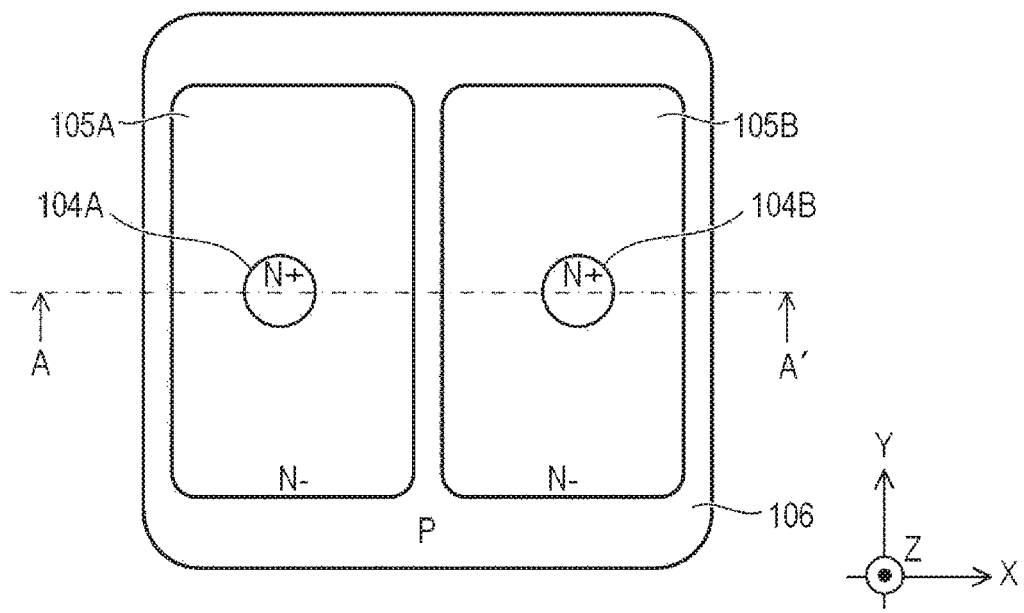
FIG. 15A is a plan view illustrating the structure of a pixel in the imaging device according to the second embodiment of the present invention.
Figure 15B:
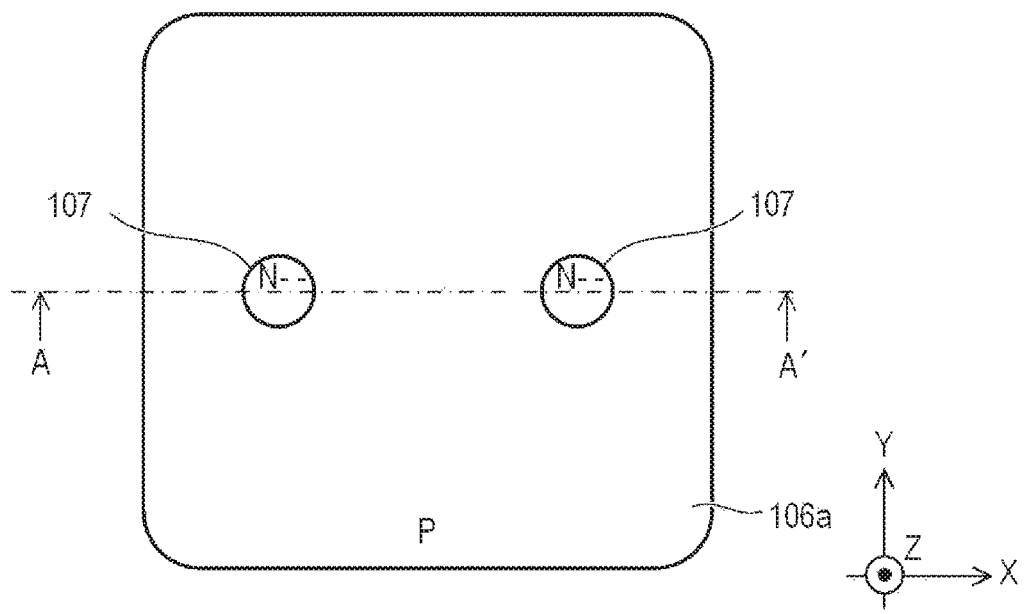
FIG. 15B is a plan view illustrating the structure of a pixel in the imaging device according to the second embodiment of the present invention.

FIG. 14 is an overall cross-sectional view illustrating the structure of a pixel in the imaging device according to the present embodiment. FIG. 14 illustrates the structure of the photodiode PD_A and the photodiode PD_B in a single pixel 12. FIG. 15A and FIG. 15B are plan views illustrating the structure of the pixel in the imaging device according to the present embodiment. FIG. 15A is a plan view of a plane, parallel to a surface of the semiconductor substrate 101, which contains the line B-B' in FIG. 14. FIG. 15B is a plan view of a plane, parallel to a surface of the semiconductor substrate 101, which contains the line C-C' in FIG. 14. A plan view of a plane, parallel to the surface of the semiconductor substrate 101, which contains the line D-D' in FIG. 14, is the same as in the imaging device according to the first embodiment, illustrated in FIG. 6. Note that FIG. 14 is a cross-sectional view taken along the line A-A' in FIG. 15A and FIG. 15B.

As illustrated in FIG. 14, the imaging device according to the present embodiment is the same as the imaging device according to the first embodiment, with the exception of the planar layout of the P-type semiconductor region 106a. That is, in the imaging device according to the present embodiment, the P-type semiconductor region 106a is provided not only in a region between the N-type semiconductor region 104A and the N-type semiconductor region 104B, but also so as to cover the entire bottom parts of the N-type semiconductor regions 105A and 105B. As illustrated in FIG. 15B, when seen in plan view at the depth to which the P-type semiconductor region 106a is provided, the P-type semiconductor region 106a is provided across the entire surface in plan view, with the exception of the regions overlapping with the N-type semiconductor regions 104A and 104B.

By disposing the P-type semiconductor region 106a in this manner, the high-electrical field region 108 between the P-type semiconductor region 106 and the N-type semiconductor regions 104A and 104B is formed in an annular region following the shapes of the perimeters of the N-type semiconductor regions 104A and 104B, as seen in plan view. Accordingly, electrons produced through photoelectric conversion in a light-receiving region close to the microlens 120 but far from the N-type semiconductor regions 104A and 104B can also be reliably conducted to the high-electrical field region 108 and caused to contribute to the avalanche multiplication. This suppresses a drop in sensitivity when capturing images of short-wavelength light in an imaging device having a backside-illuminated structure, and makes it possible to achieve a bokeh similar to that achieved when the photoelectric conversion units are not pupil-divided.

Note that in the present embodiment, the N-type semiconductor regions 104A and 104B are circular in shape when viewed in plan view, as illustrated in FIG. 15A. This is because a circular shape is most favorable in terms of suppressing edge breakdown arising due to an electrical field acting between the P-type semiconductor region 106 and the N-type semiconductor regions 104A and 104B becoming uniform and concentrating locally. In a situation such as where local electrical field concentration will not arise in an actual state of use, the N-type semiconductor regions 104A and 104B do not absolutely have to be circular in shape when viewed in plan view. Additionally, it is not absolutely necessary for the P-type semiconductor region 106a to be provided across the entire perimeters of the N-type semiconductor regions 104A and 104B when viewed in plan view. The same can be said for the first embodiment as well.

In this manner, according to the present embodiment, in an imaging device which uses SPADs, focus detection using a phase difference detection method can be performed, and a bokeh similar to that which is obtained when not dividing pupils when capturing an image can be achieved.

Third Embodiment

An imaging device according to a third embodiment of the present invention will be described with reference to FIG. 16 and FIG. 17. Constituent elements which are the same as in the imaging devices according to the first and second embodiments will be given the same reference signs, and descriptions thereof will be omitted or simplified.

Figure 16:
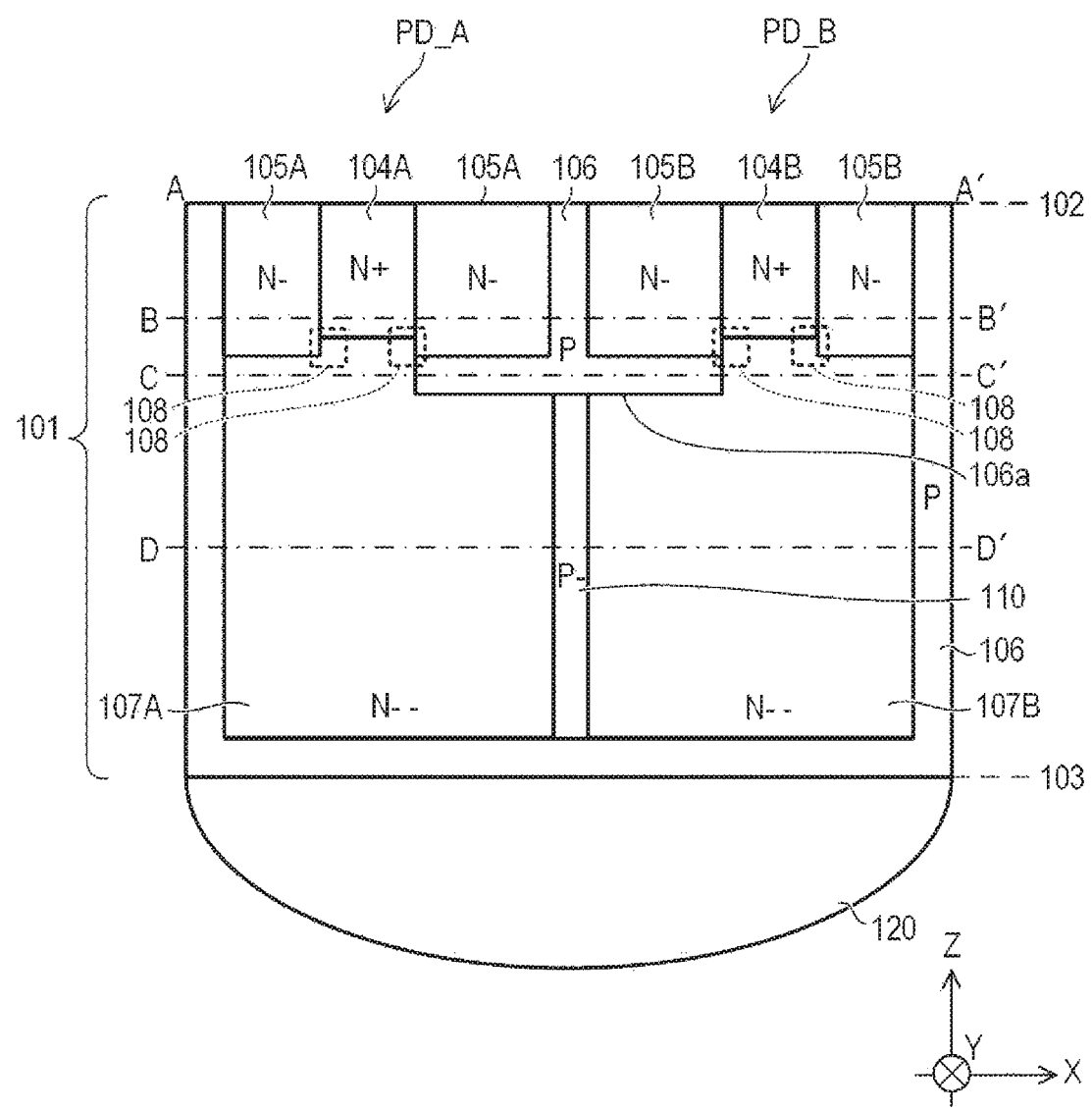
FIG. 16 is an overall cross-sectional view illustrating the structure of a pixel in an imaging device according to a third embodiment of the present invention.
Figure 17:
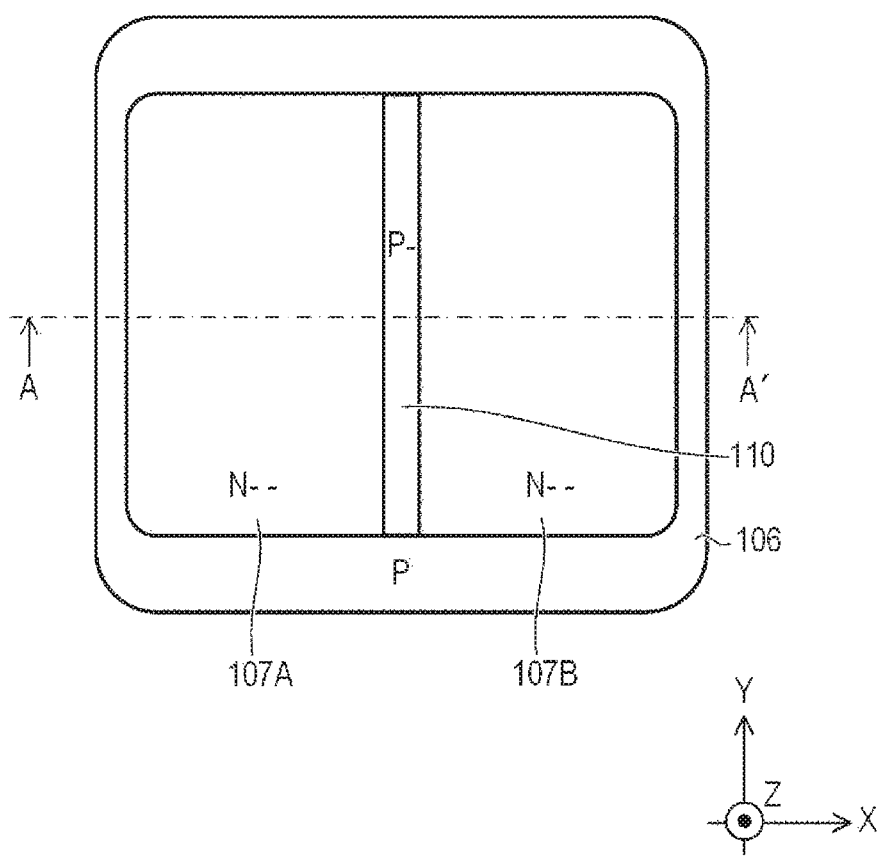
FIG. 17 is a plan view illustrating the structure of a pixel in the imaging device according to the third embodiment of the present invention.

FIG. 16 is an overall cross-sectional view illustrating the structure of a pixel in the imaging device according to the present embodiment. FIG. 16 illustrates the structure of the photodiode PD_A and the photodiode PD_B in a single pixel 12. FIG. 17 is a plan view illustrating the structure of the pixel in the imaging device according to the present embodiment. FIG. 17 is a plan view of a plane, parallel to the surface of the semiconductor substrate 101, which contains the line D-D' in FIG. 16. A plan view of a plane, parallel to the surface of the semiconductor substrate 101, which contains the line B-B' in FIG. 16, and a plan view of a plane, parallel to the surface of the semiconductor substrate 101, which contains the line C-C' in FIG. 16, are the same as in the imaging device according to the second embodiment, illustrated in FIG. 15A and FIG. 15B. Note that FIG. 16 is a cross-sectional view taken along the line A-A' in FIG. 17.

As illustrated in FIG. 16, in the imaging device according to the present embodiment, the N-type semiconductor region 107 in the imaging device according to the second embodiment is divided into an N-type semiconductor region 107A connected to the N-type semiconductor region 104A and an N-type semiconductor region 107B connected to the N-type semiconductor region 104B. The N-type semiconductor region 107A and the N-type semiconductor region 107B are electrically separated by a P-type semiconductor region 110 provided therebetween, the P-type semiconductor region 110 having a lower (P−) impurity concentration than the P-type semiconductor region 106. As illustrated in FIG. 16 and FIG. 17, the P-type semiconductor region 110 is connected to the P-type semiconductor region 106a on the first surface 102 side of the semiconductor substrate 101, and is connected to the P-type semiconductor region 106 at the second surface side and side surface sides of the semiconductor substrate 101. The imaging device is the same as that according to the second embodiment in other aspects.

The P-type semiconductor region 110 has a lower concentration than the P-type semiconductor region 106, and does not produce an electrical field strong enough to induce avalanche multiplication with the N-type semiconductor region 107. However, by providing the P-type semiconductor region 110, electrons produced through photoelectric conversion in a light-receiving region close to the microlens 120 but far from the N-type semiconductor regions 104A and 104B can also be more reliably caused to drift toward the N-type semiconductor regions 104A and 104B. This makes it possible to achieve a bokeh similar to that achieved when the photoelectric conversion units are not pupil-divided, when capturing images of short-wavelength light in an imaging device having a backside-illuminated structure.

In this manner, according to the present embodiment, in an imaging device which uses SPADs, focus detection using a phase difference detection method can be performed, and a bokeh similar to that which is obtained when not dividing pupils when capturing an image can be achieved.

Fourth Embodiment

An imaging device according to a fourth embodiment of the present invention will be described with reference to FIG. 18A to FIG. 22. Constituent elements which are the same as in the imaging devices according to the first to third embodiments will be given the same reference signs, and descriptions thereof will be omitted or simplified.

The present embodiment will describe an imaging device in which a single pixel 12 includes four photodiodes pupil-divided in two directions, as well as a driving method for the device.

Figure 18A:
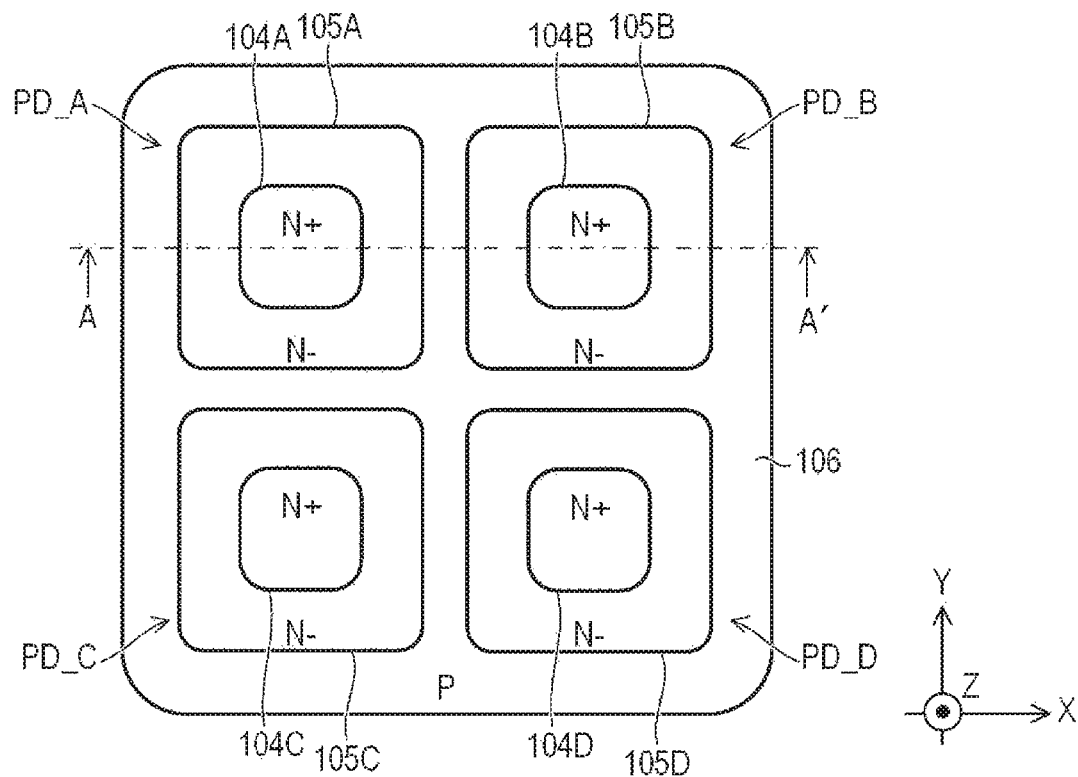
FIG. 18A is a plan view illustrating the structure of a pixel in an imaging device according to a fourth embodiment of the present invention.
Figure 18B:
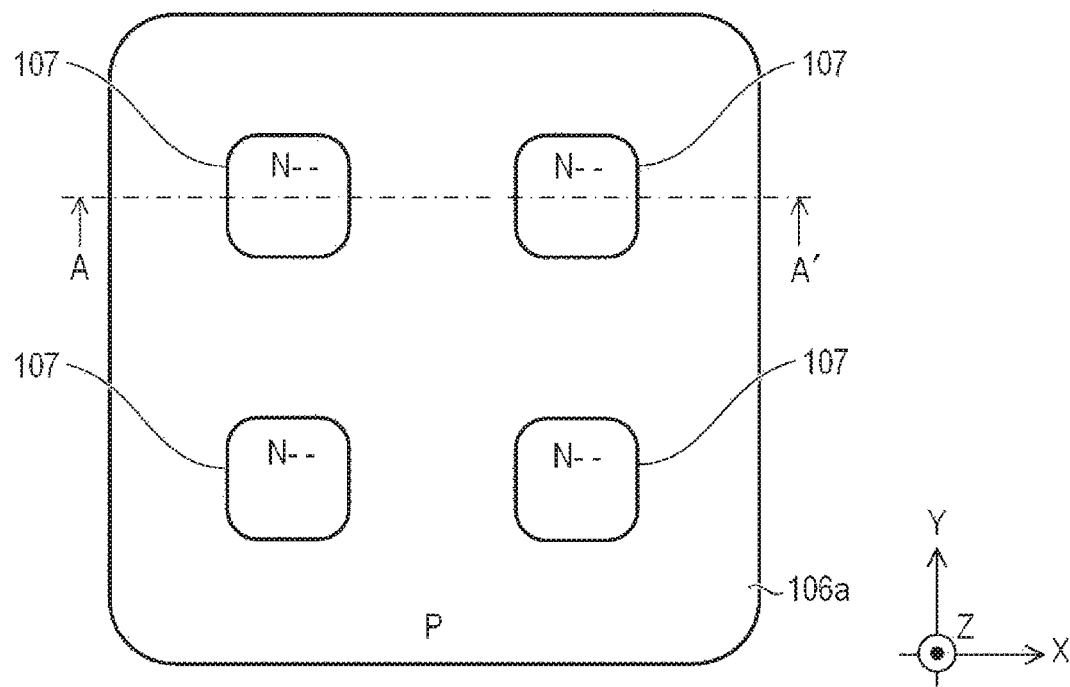
FIG. 18B is a plan view illustrating the structure of a pixel in the imaging device according to the fourth embodiment of the present invention.

First, the structure of the imaging device according to the present embodiment will be described with reference to FIG. 18A and FIG. 18B. FIG. 18A and FIG. 18B are plan views illustrating the structure of the pixel in the imaging device according to the present embodiment. FIG. 18A is a plan view of a plane, parallel to a surface of the semiconductor substrate 101, which contains the line B-B' in FIG. 14. FIG. 18B is a plan view of a plane, parallel to a surface of the semiconductor substrate 101, which contains the line C-C' in FIG. 14. A plan view of a plane, parallel to the surface of the semiconductor substrate 101, which contains the line D-D' in FIG. 14, is the same as in the imaging device according to the first embodiment, illustrated in FIG. 6. Note that because the line A-A' cross-sectional views of the imaging device according to the present embodiment in FIG. 18A and FIG. 18B are the same as for the imaging device according to the second embodiment and illustrated in FIG. 14, those cross-sectional views are not shown here.

As illustrated in FIG. 18A and FIG. 18B, the imaging device according to the present embodiment includes the photodiode PD_A which takes the N-type semiconductor region 104A as its cathode, and the photodiode PD_B which takes the N-type semiconductor region 104B as its cathode, in the same manner as the imaging device according to the second embodiment. The imaging device according to the present embodiment further includes a photodiode PD_C which takes an N-type semiconductor region 104C as its cathode, and a photodiode PD_D which takes an N-type semiconductor region 104D as its cathode. The photodiode PD_A and the photodiode PD_B are disposed adjacent to each other in the X direction. The photodiode PD_C and the photodiode PD_D are disposed adjacent to each other in the X direction. Additionally, the photodiode PD_A and the photodiode PD_C are disposed adjacent to each other in the Y direction. Likewise, the photodiode PD_B and the photodiode PD_D are disposed adjacent to each other in the Y direction. The structures between adjacent photodiodes are the same as the structure between the photodiode PD_A and the photodiode PD_B in the second embodiment.

The N-type semiconductor region 104A constituting the photodiode PD_A and the N-type semiconductor region 104D constituting the photodiode PD_D are disposed adjacent to each other in the first direction, with the center of the light-receiving unit located therebetween, in a plan view. Likewise, the N-type semiconductor region 104B constituting the photodiode PD_B and the N-type semiconductor region 104C constituting the photodiode PD_C are disposed adjacent to each other in the second direction, which is orthogonal to the first direction, with the center of the light-receiving unit located therebetween, in a plan view.

With the imaging device according to the present embodiment, the pupil division direction can be switched by appropriately selecting the photodiodes which are to output signals, and combinations of those photodiodes, as will be described below.

Figure 20:
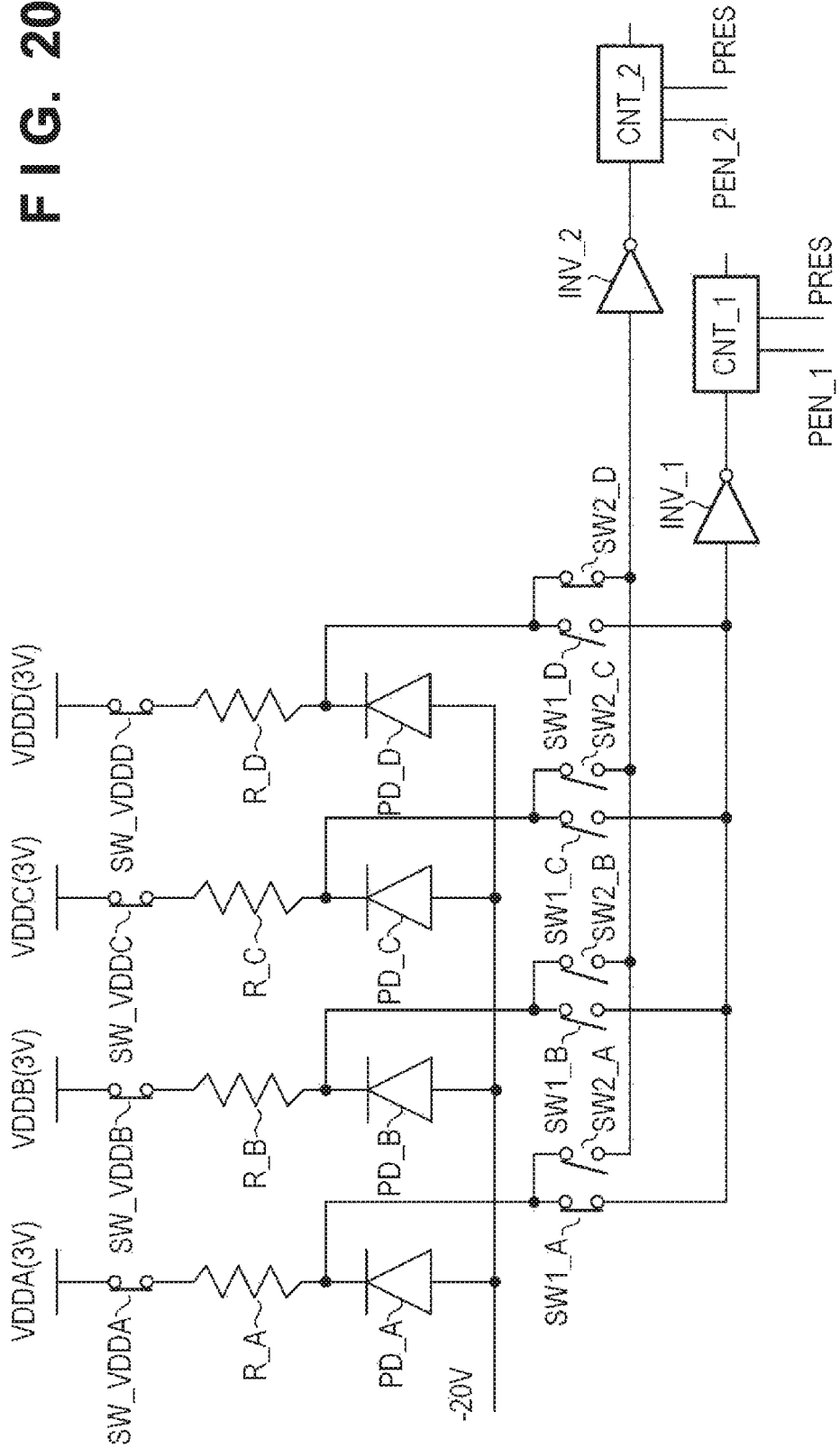
FIG. 20 is a circuit diagram (No. 2) illustrating an example of the configuration and an example of the driving of a pixel in the imaging device according to the fourth embodiment of the present invention.
Figure 21:
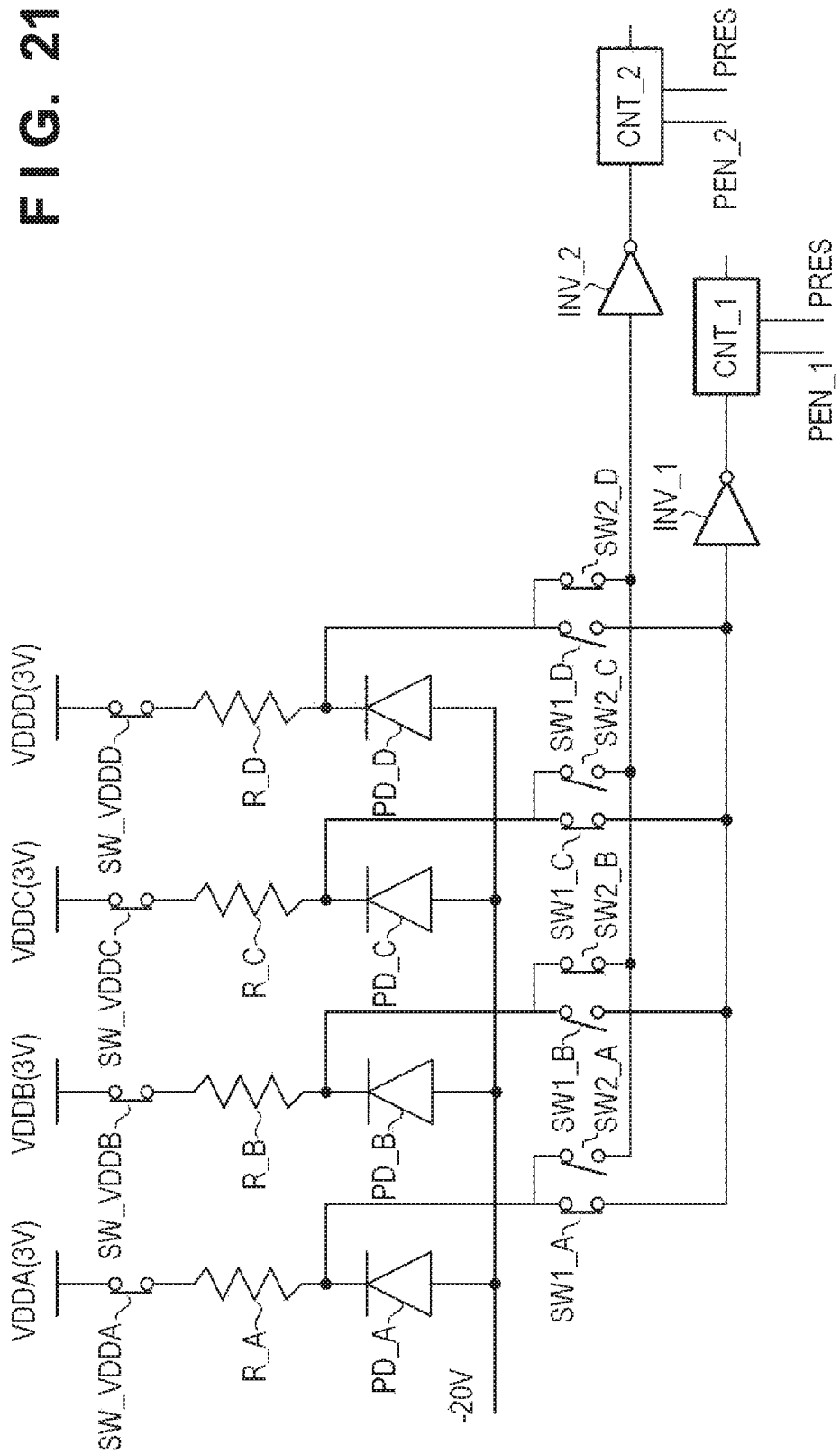
FIG. 21 is a circuit diagram (No. 3) illustrating an example of the configuration and an example of the driving of a pixel in the imaging device according to the fourth embodiment of the present invention.
Figure 22:
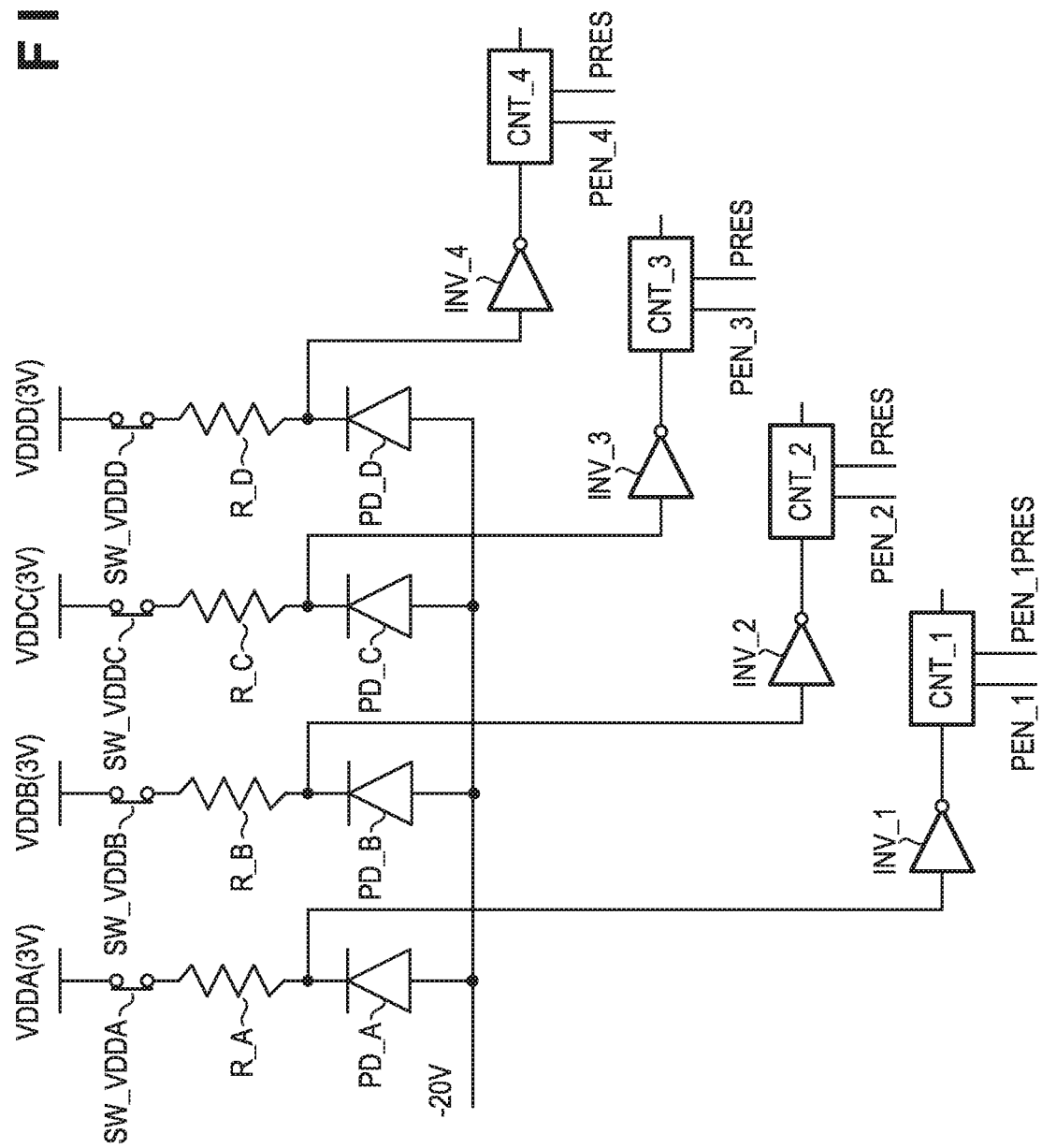
FIG. 22 is a circuit diagram (No. 4) illustrating an example of the configuration and an example of the driving of a pixel in the imaging device according to the fourth embodiment of the present invention.

FIG. 19 to FIG. 22 are circuit diagrams illustrating an example of the configuration and an example of the driving of a pixel in the imaging device according to the present embodiment. In FIG. 19 to FIG. 21, the circuit configuration is the same whereas the control of the switches is different. FIG. 22 illustrates a different circuit configuration from FIG. 19 to FIG. 21.

A negative voltage (e.g., −20V) is supplied to anodes of the photodiodes PD_A, PD_B, PD_C, and PD_D from a voltage supply unit (not shown). One terminal of the resistor R_A is connected to a cathode of the photodiode PD_A. A positive voltage (VDDA; 3 V, for example) is supplied to another terminal of the resistor R_A from the voltage supply unit (not shown) via a switch SW_VDDA. Likewise, one terminal of the resistor R_B is connected to a cathode of the photodiode PD_B. A positive voltage (VDDB; 3 V, for example) is supplied to another terminal of the resistor R_B from the voltage supply unit (not shown) via a switch SW_VDDB. Additionally, one terminal of a resistor R_C is connected to a cathode of the photodiode PD_C. A positive voltage (VDDC; 3 V, for example) is supplied to another terminal of the resistor R_C from the voltage supply unit (not shown) via a switch SW_VDDC. Additionally, one terminal of a resistor R_D is connected to a cathode of the photodiode PD_D. A positive voltage (VDDD; 3 V, for example) is supplied to another terminal of the resistor R_D from the voltage supply unit (not shown) via a switch SW_VDDD.

A connection node between the photodiode PD_A and the resistor R_A is connected to an input terminal of an inverter circuit INV_1 via a switch SW1_A, and is connected to an input terminal of an inverter circuit INV_2 via a switch SW2_A. Likewise, a connection node between the photodiode PD_B and the resistor R_B is connected to the input terminal of the inverter circuit INV_1 via a switch SW1_B, and is connected to the input terminal of the inverter circuit INV_2 via a switch SW2_B. Furthermore, a connection node between the photodiode PD_C and the resistor R_C is connected to the input terminal of the inverter circuit INV_1 via a switch SW1_C, and is connected to the input terminal of the inverter circuit INV_2 via a switch SW2_C. Finally, a connection node between the photodiode PD_D and the resistor R_D is connected to the input terminal of the inverter circuit INV_1 via a switch SW1_D, and is connected to the input terminal of the inverter circuit INV_2 via a switch SW2_D.

A counter circuit CNT_1 is connected to an output terminal of the inverter circuit INV_1. An enable signal PEN_1 and the reset signal PRES are supplied to the counter circuit CNT_1 from the timing generation circuit 20. An output of the counter circuit CNT_1 serves as one output of the pixel 12. Likewise, a counter circuit CNT_2 is connected to an output terminal of the inverter circuit INV_2. An enable signal PEN_2 and the reset signal PRES are supplied to the counter circuit CNT_2 from the timing generation circuit 20. An output of the counter circuit CNT_2 serves as another output of the pixel 12.

The switches SW_VDDA, SW_VDDB, SW_VDDC, and SW_VDDD are switches which select the photodiodes PD_A, PD_B, PD_C, and PD_D to operate in Geiger mode. The switches SW1_A, SW1_B, SW1_C, and SW1_D are switches which select the photodiodes to be counted by the counter circuit CNT_1. The switches SW2_A, SW2_B, SW2_C, and SW2_D are switches which select the photodiodes to be counted by the counter circuit CNT_2. The operations and timings of these switches are controlled by the timing generation circuit 20.

FIG. 19 illustrates a driving mode in which, of the four photodiodes PD_A, PD_B, PD_C, and PD_D, the two photodiodes PD_A and PD_D are selected, and the pupil division direction is set to the same downward-right diagonal direction as that illustrated in FIG. 9A and FIG. 9B. As illustrated in FIG. 19, in this driving mode, the switches SW_VDDA, SW_VDDD, SW1_A, and SW2_D are on, and the other switches are set to off.

In the driving mode illustrated in FIG. 19, turning the switch SW_VDDA and the switch SW_VDDD on sets the photodiode PD_A and the photodiode PD_D to operate in Geiger mode. At this time, in addition to turning the switch SW_VDDB and the switch SW_VDDC off, the terminal voltages of the resistors R_B and R_C may be clipped to −20 V. In response to the switch SW1_A turning on, the counter circuit CNT_1 counts the voltage pulses obtained from the photodiode PD_A. Likewise, in response to the switch SW2_D turning on, the counter circuit CNT_2 counts the voltage pulses obtained from the photodiode PD_D. By switching the switches in this manner, the pupil division direction can be set to the downward-right diagonal direction.

FIG. 20 illustrates a driving mode in which not only the photodiodes PD_A and PD_D which perform counting, but also the photodiodes PD_B and PD_C which do not perform counting, are operated in Geiger mode. In this driving mode, by further setting the switches SW_VDDB and SW_VDDC on, the photodiodes PD_B and PD_C which do not perform counting can also be operated in Geiger mode. In this case, the electrons produced at the light-receiving regions of the photodiodes PD_B and PD_C are avalanche-multiplied in the photodiodes PD_B and PD_C, and thus a situation where electrons drift and are avalanche-multiplied in PD_A and PD_D no longer occurs. As such, compared to a case where the switches SW_VDDB and SW_VDDC are set to off, the separation characteristics of the photodiodes PD_A and PD_D can be improved, and a longer baseline length can be achieved.

FIG. 21 illustrates a driving mode in which voltage pulses from a plurality of photodiodes are counted by a single counter circuit. In FIG. 21, the switches SW_VDDA, SW_VDDB, SW_VDDC, SW_VDDD, SW1_A, SW2_B, SW1_C, and SW2_D are on, and the other switches are set to off. In this case, the voltage pulses output from the photodiode PD_A and the photodiode PD_C are counted by the counter circuit CNT_1, and the voltage pulses output from the photodiode PD_B and the photodiode PD_D are counted by the counter circuit CNT_2. This makes it possible to set the pupil division direction to the X direction.

FIG. 22 illustrates a configuration in which a single counter circuit is provided for a single photodiode. In other words, a negative voltage (e.g., −20 V) is supplied to the anodes of the photodiodes PD_A, PD_B, PD_C, and PD_D from a voltage supply unit (not shown). One terminal of the resistor R_A is connected to a cathode of the photodiode PD_A. A positive voltage (VDDA; 3 V, for example) is supplied to another terminal of the resistor R_A from the voltage supply unit (not shown) via the switch SW_VDDA. Likewise, one terminal of the resistor R_B is connected to a cathode of the photodiode PD_B. A positive voltage (VDDB; 3 V, for example) is supplied to another terminal of the resistor R_B from the voltage supply unit (not shown) via the switch SW_VDDB. Additionally, one terminal of the resistor R_C is connected to a cathode of the photodiode PD_C. A positive voltage (VDDC; 3 V, for example) is supplied to another terminal of the resistor R_C from the voltage supply unit (not shown) via the switch SW_VDDC. Additionally, one terminal of the resistor R_D is connected to a cathode of the photodiode PD_D. A positive voltage (VDDD; 3 V, for example) is supplied to another terminal of the resistor R_D from the voltage supply unit (not shown) via the switch SW_VDDD.

The input terminal of the inverter circuit INV_1 is connected to a connection node between the photodiode PD_A and the resistor R_A. An input terminal of the counter circuit CNT_1 is connected to the output terminal of the inverter circuit INV_1. The enable signal PEN_1 and the reset signal PRES are supplied to the counter circuit CNT_1 from the timing generation circuit 20. Likewise, the input terminal of the inverter circuit INV_2 is connected to a connection node between the photodiode PD_B and the resistor R_B. The output terminal of the inverter circuit INV_2 is connected to an input terminal of the counter circuit CNT_2. The enable signal PEN_2 and the reset signal PRES are supplied to the counter circuit CNT_2 from the timing generation circuit 20. An input terminal of an inverter circuit INV_3 is connected to a connection node between the photodiode PD_C and the resistor R_C. An output terminal of the inverter circuit INV_3 is connected to an input terminal of a counter circuit CNT_3. An enable signal PEN_3 and the reset signal PRES are supplied to the counter circuit CNT_3 from the timing generation circuit 20. An input terminal of an inverter circuit INV_4 is connected to a connection node between the photodiode PD_D and the resistor R_D. An output terminal of the inverter circuit INV_4 is connected to an input terminal of a counter circuit CNT_4. An enable signal PEN_4 and the reset signal PRES are supplied to the counter circuit CNT_4 from the timing generation circuit 20.

According to the circuit configuration illustrated in FIG. 22, a focus detection signal generating unit (not shown) provided in the imaging device can generate a focus detection signal realizing pupil division in any given direction on the basis of the count values obtained from the counter circuits.

Note that in addition to the configuration illustrated in FIG. 22, a switch serving as a counter circuit selecting unit may be provided to implement a configuration in which the photodiodes connected to the counter circuit are selected, with the voltage pulses from a plurality of photodiodes being counted by a single counter circuit.

Additionally, the number of counter circuits illustrated in the equivalent circuits shown in FIG. 19 to FIG. 22 does not absolutely have to be two or the same as the number of photodiodes. Additionally, the configuration may be such that a plurality of counter circuits simultaneously count the voltage pulses from different combinations of pluralities of photodiodes.

In this manner, according to the present embodiment, in an imaging device which uses SPADs, focus detection using a phase difference detection method can be performed, and a bokeh similar to that which is obtained when not dividing pupils when capturing an image can be achieved. Additionally, the pupil division direction can be switched to any desired direction.

Fifth Embodiment

An imaging device according to a fifth embodiment of the present invention will be described with reference to FIG. 23 to FIG. 24B. Constituent elements which are the same as in the imaging devices according to the first to fourth embodiments will be given the same reference signs, and descriptions thereof will be omitted or simplified.

Figure 23:
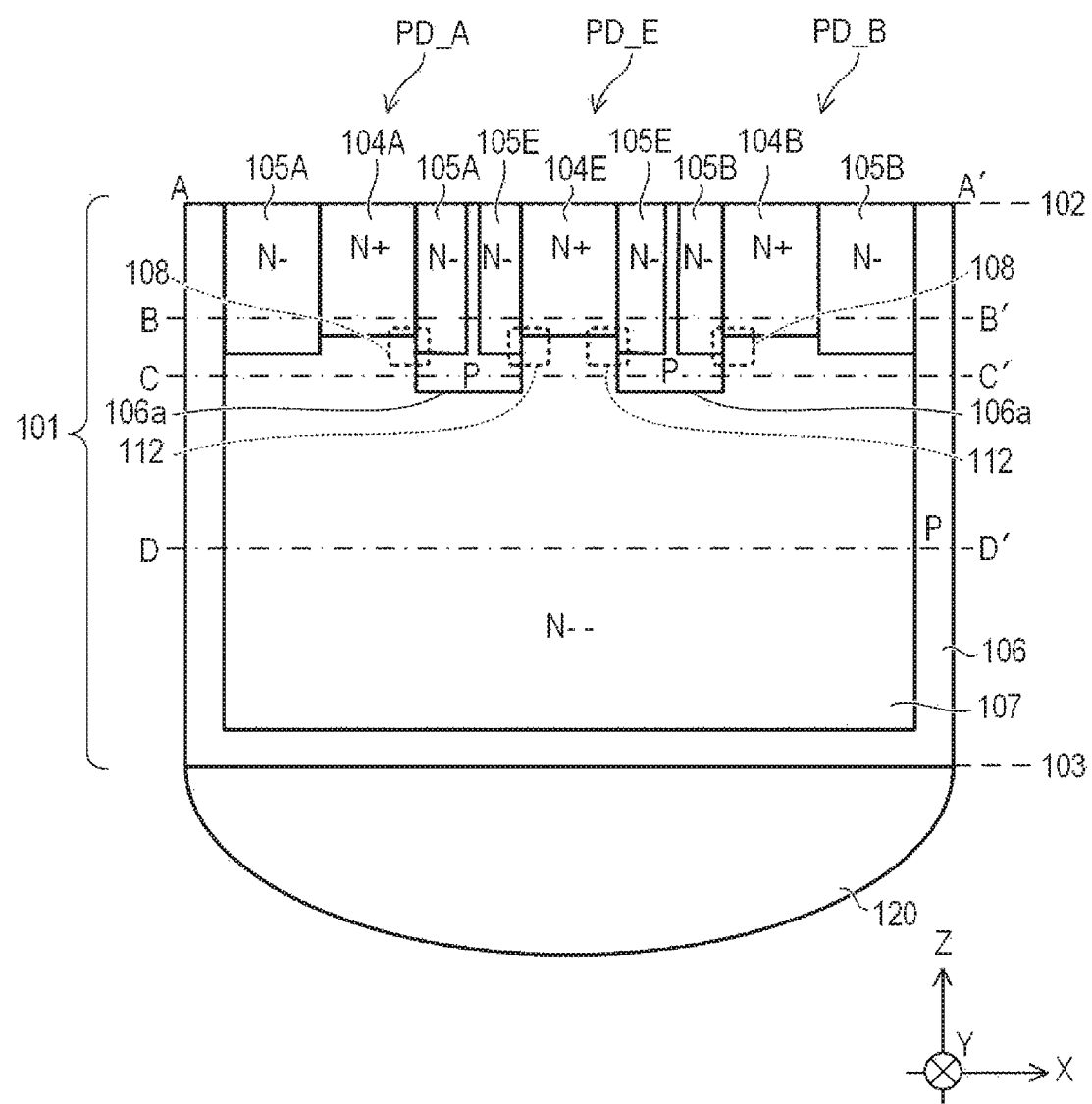
FIG. 23 is an overall cross-sectional view illustrating the structure of a pixel in an imaging device according to a fifth embodiment of the present invention.
Figure 24A:
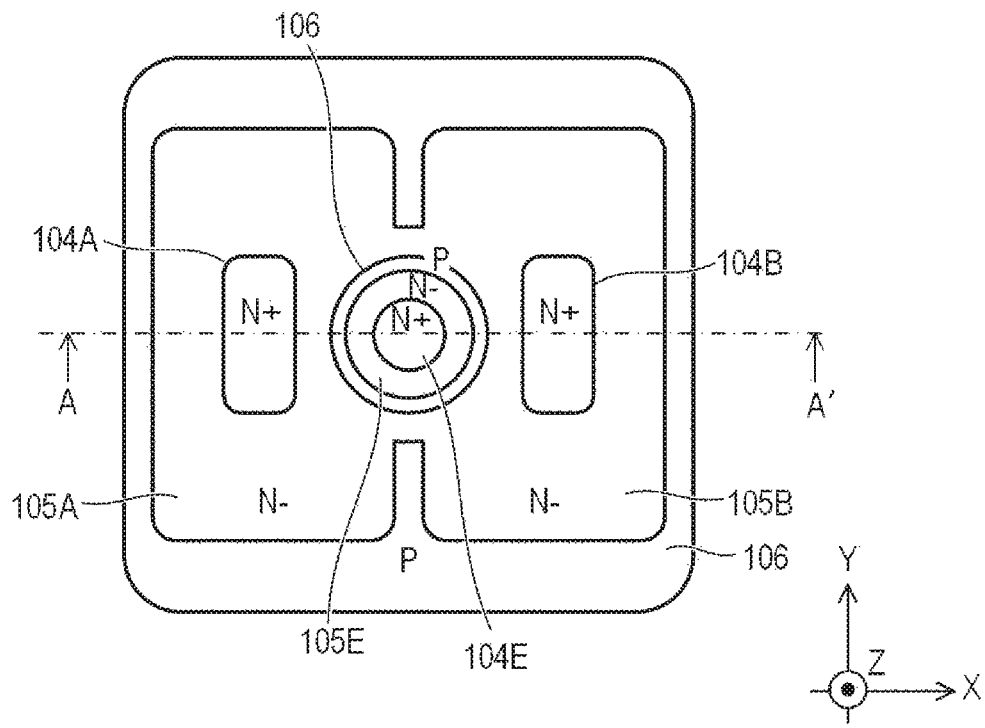
FIG. 24A is a plan view illustrating the structure of a pixel in the imaging device according to the fifth embodiment of the present invention.

FIG. 23 is an overall cross-sectional view illustrating the structure of a pixel in the imaging device according to the present embodiment. FIG. 24A and FIG. 24B are plan views illustrating the structure of the pixel in the imaging device according to the present embodiment. FIG. 24A is a plan view of a plane, parallel to a surface of the semiconductor substrate 101, which contains the line B-B' in FIG. 23. FIG. 24B is a plan view of a plane, parallel to a surface of the semiconductor substrate 101, which contains the line C-C' in FIG. 23. A plan view of a plane, parallel to the surface of the semiconductor substrate 101, which contains the line D-D' in FIG. 24A and FIG. 24B, is the same as in the imaging device according to the first embodiment, illustrated in FIG. 6. Note that FIG. 23 is a cross-sectional view taken along the line A-A' in FIG. 24A and FIG. 24B.

Figure 24B:
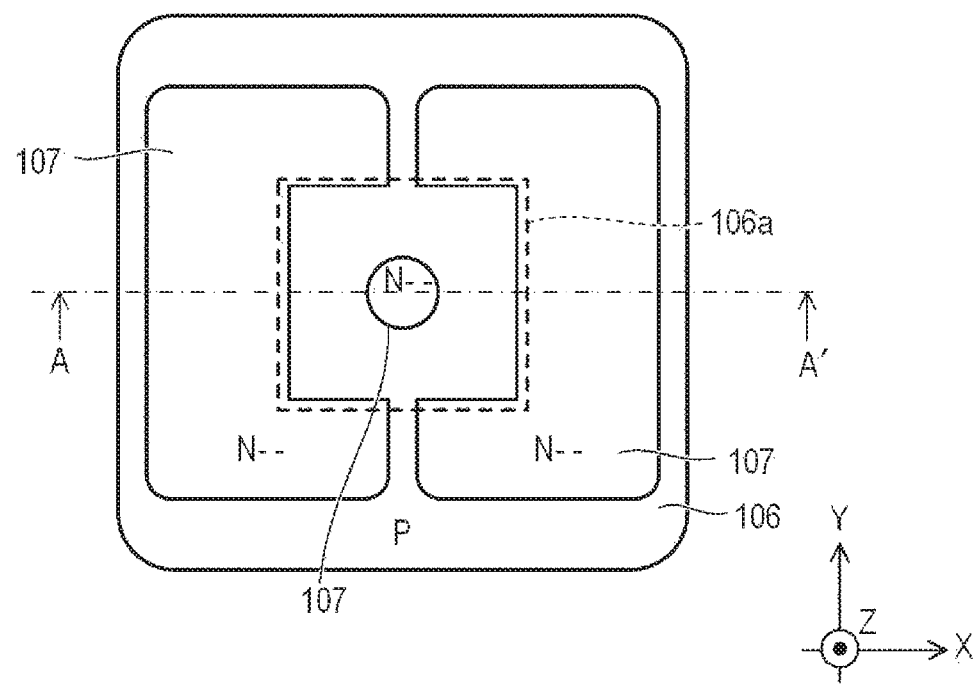
FIG. 24B is a plan view illustrating the structure of a pixel in the imaging device according to the fifth embodiment of the present invention.

As illustrated in FIG. 23 to FIG. 24B, the imaging device according to the present embodiment differs from the imaging device according to the first embodiment in that a photodiode PD_E is further provided between the photodiode PD_A and the photodiode PD_B.

The photodiode PD_E includes a high-concentration (N+) N-type semiconductor region 104E constituting a cathode and a low-concentration (N−) N-type semiconductor region 105E constituting a guard ring. The N-type semiconductor region 104E is provided between, and distanced from, the N-type semiconductor region 104A and the N-type semiconductor region 104B on the first surface 102 side of the semiconductor substrate 101. The N-type semiconductor region 105E is provided on the first surface 102 side of the semiconductor substrate 101, in a ring shape which surrounds the side surfaces of the N-type semiconductor region 104E. The N-type semiconductor region 105E is provided to a deeper position, from the first surface 102 of the semiconductor substrate 101, than a bottom part of the N-type semiconductor region 104E.

The P-type semiconductor region 106, which has a ring shape so as to surround the side surfaces of the N-type semiconductor region 105E, is provided between the N-type semiconductor region 105E and the N-type semiconductor regions 105A and 105B. The P-type semiconductor region 106a disposed on the bottom parts of the N-type semiconductor regions 105A and 105B extends to a bottom part of the N-type semiconductor region 105E as well. As illustrated in FIG. 24B, when seen in plan view at the depth to which the P-type semiconductor region 106a is provided, the P-type semiconductor region 106a is provided in regions overlapping with the N-type semiconductor regions 104A, 104B, and 104E when viewed in plan view.

By employing such a configuration, the P-type semiconductor region 106 can form the high-electrical field region 108 at parts closest to the N-type semiconductor regions 104A and 104B, and electrons produced by incident photons can be avalanche-multiplied. This provides good separation characteristics for use in phase difference detection.

Additionally, because the ring-shaped N-type semiconductor region 107 surrounding the P-type semiconductor region 106 in the central part and making contact with the N-type semiconductor region 104E is provided, a high-electrical field region 112 can be formed between the P-type semiconductor region 106a and the N-type semiconductor region 104E. As a result, loss of detection efficiency with respect to normally-incident photons can be eliminated without greatly increasing the voltage applied to the N-type semiconductor regions 104A and 104B, and a bokeh similar to that achieved when the photoelectric conversion units are not divided can be achieved.

When using the imaging device according to the present embodiment, in the second driving mode for obtaining image capturing signals, it is preferable to use a positive voltage for a voltage VDDE applied to the N-type semiconductor region 104E, and to put the voltages VDDA and VDDB applied to the N-type semiconductor regions 104A and 104B into a floating state. The counter circuit CNT_A or the counter circuit CNT_B may, by using a switch (not shown), be used as the counter circuit for counting the number of voltage pulses produced through Geiger mode operation of the photodiode PD_E.

In this manner, according to the present embodiment, in an imaging device which uses SPADs, focus detection using a phase difference detection method can be performed, and a bokeh similar to that which is obtained when not dividing pupils when capturing an image can be achieved.

Sixth Embodiment

An imaging device according to a sixth embodiment of the present invention will be described with reference to FIG. 25 to FIG. 28B. Constituent elements which are the same as in the imaging devices according to the first to fifth embodiments will be given the same reference signs, and descriptions thereof will be omitted or simplified.

Figure 25:
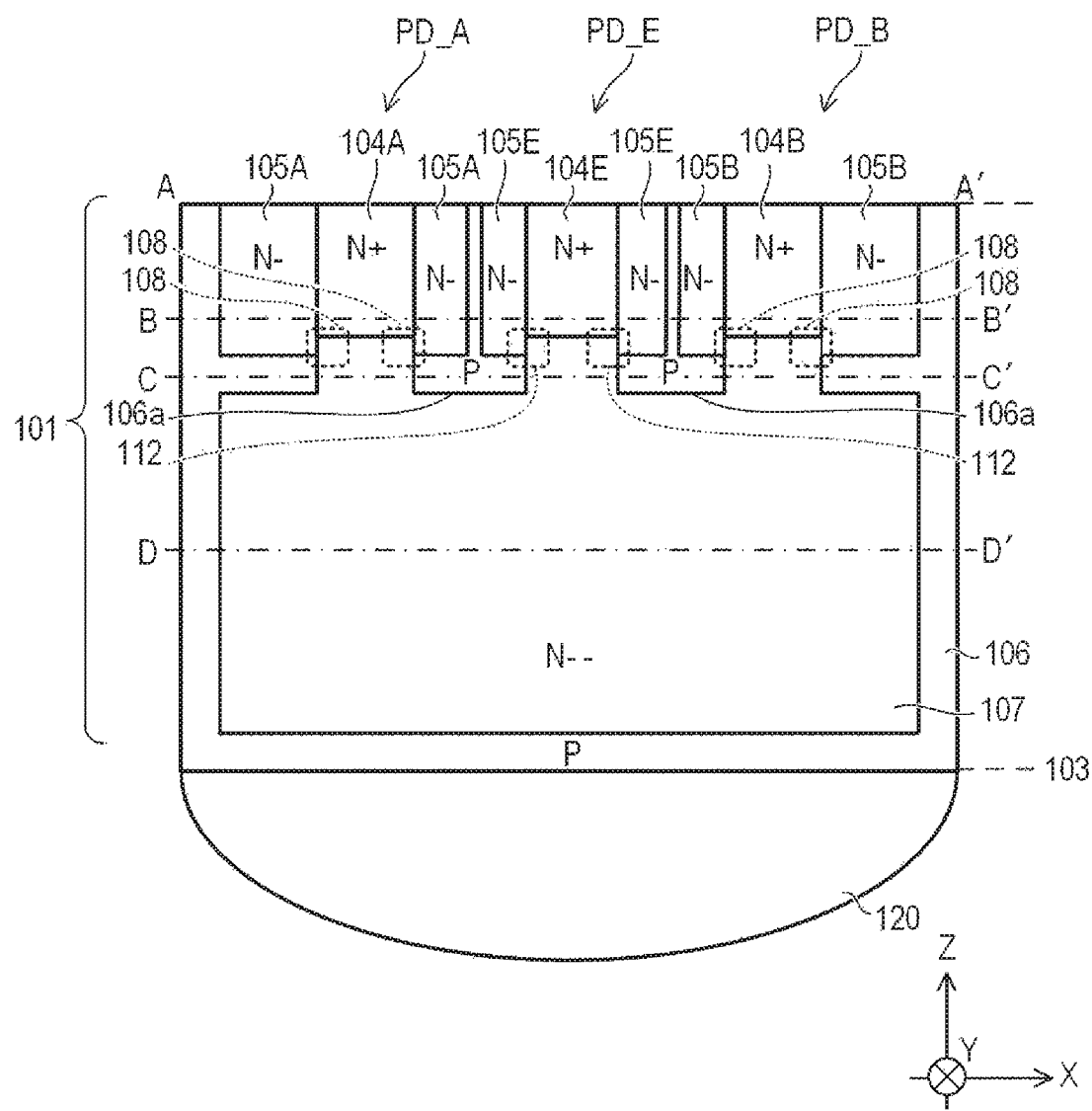
FIG. 25 is an overall cross-sectional view illustrating the structure of a pixel in an imaging device according to a sixth embodiment of the present invention.
Figure 26A:
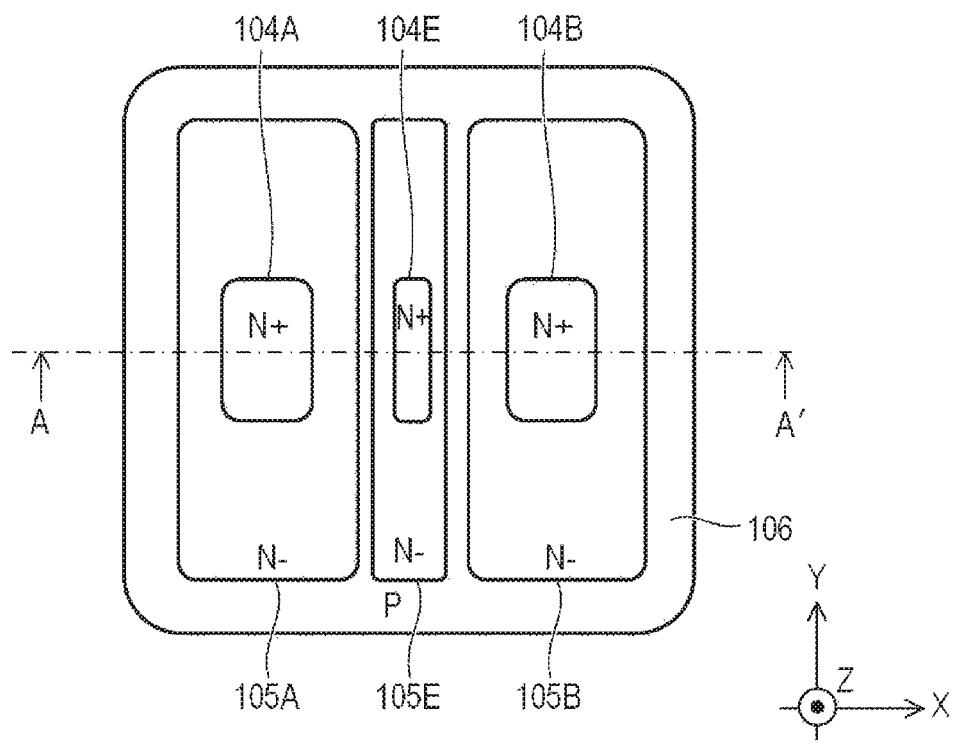
FIG. 26A is a plan view illustrating the structure of a pixel in the imaging device according to the sixth embodiment of the present invention.
Figure 26B:
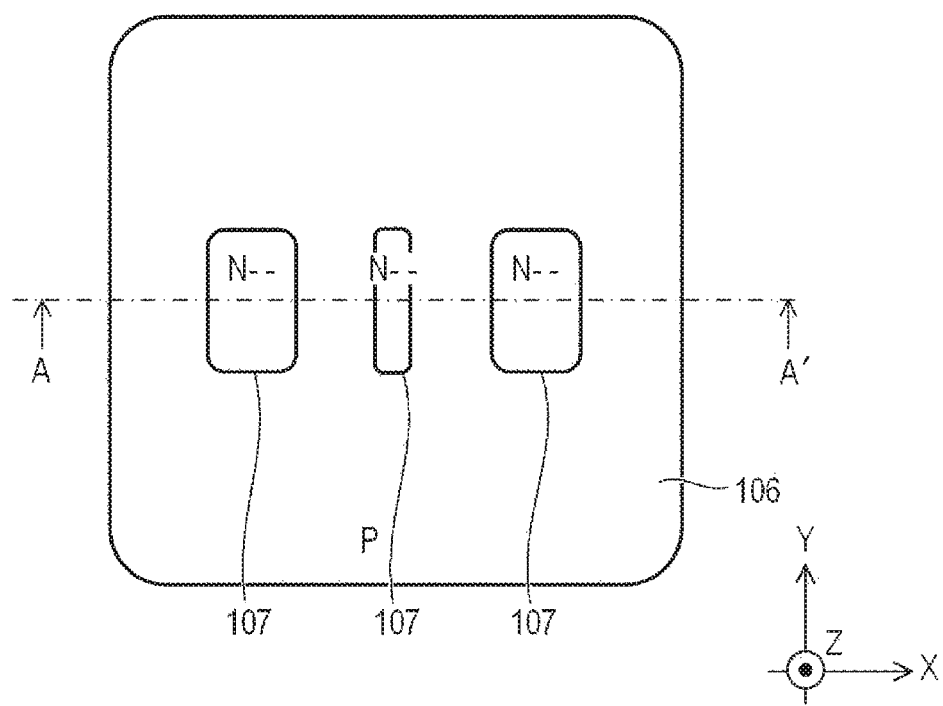
FIG. 26B is a plan view illustrating the structure of a pixel in the imaging device according to the sixth embodiment of the present invention.

The structure of the imaging device according to the present embodiment will be described with reference to FIG. 25 to FIG. 26B. FIG. 25 is an overall cross-sectional view illustrating the structure of a pixel in the imaging device according to the present embodiment. FIG. 26A and FIG. 26B are plan views illustrating the structure of the pixel in the imaging device according to the present embodiment. FIG. 26A is a plan view of a plane, parallel to a surface of the semiconductor substrate 101, which contains the line B-B' in FIG. 25. FIG. 26B is a plan view of a plane, parallel to a surface of the semiconductor substrate 101, which contains the line C-C' in FIG. 25. A plan view of a plane, parallel to the surface of the semiconductor substrate 101, which contains the line D-D' in FIG. 25, is the same as in the imaging device according to the first embodiment, illustrated in FIG. 6. Note that FIG. 25 is a cross-sectional view taken along the line A-A' in FIG. 26A and FIG. 26B.

As illustrated in FIG. 25 to FIG. 26B, the imaging device according to the present embodiment differs from the imaging device according to the second embodiment in that the photodiode PD_E is further provided between the photodiode PD_A and the photodiode PD_B.

The photodiode PD_E includes the high-concentration (N+) N-type semiconductor region 104E constituting a cathode and the low-concentration (N−) N-type semiconductor region 105E constituting a guard ring. The N-type semiconductor region 104E is disposed between, and distanced from, the N-type semiconductor region 104A and the N-type semiconductor region 104B on the first surface 102 side of the semiconductor substrate 101. The N-type semiconductor region 105E is provided on the first surface 102 side of the semiconductor substrate 101, surrounding the side surfaces of the N-type semiconductor region 104E. The N-type semiconductor region 105E is provided to a deeper position, from the first surface 102 of the semiconductor substrate 101, than the bottom part of the N-type semiconductor region 104E.

The P-type semiconductor region 106 is provided between the N-type semiconductor region 105E and the N-type semiconductor regions 105A and 105B. The P-type semiconductor region 106a disposed on the bottom parts of the N-type semiconductor regions 105A and 105B extends to the bottom part of the N-type semiconductor region 105E as well. As illustrated in FIG. 26B, when seen in plan view at the depth to which the P-type semiconductor region 106a is provided, the P-type semiconductor region 106a is provided across the entire surface in plan view, with the exception of the regions overlapping with the N-type semiconductor regions 104A, 104B, and 104E.

By employing such a configuration, the high-electrical field region 112, which is similar to the high-electrical field region 108 formed between the P-type semiconductor region 106a and the N-type semiconductor regions 104A and 104B, can be formed between the P-type semiconductor region 106a and the N-type semiconductor region 104E. Accordingly, electrons photoelectrically converted at a light-receiving region between the N-type semiconductor region 104A and the N-type semiconductor region 104B can be avalanche-multiplied in the high-electrical field region 112. This makes it possible to improve the detection efficiency for photons incident on a central part of the light-receiving region of the pixel 12.

With the imaging device according to the present embodiment, a configuration in which a counter circuit is provided for each of the photodiodes can be employed, as illustrated in FIG. 22. When capturing an image, bokeh similar to that achieved when not using pupil division can be realized by using the count values obtained from the three photodiodes PD_A, PD_B, and PD_E. When performing focus detection, highly-accurate focus detection enabled by securing a sufficient baseline length can be realized by using the count values obtained from the two photodiodes PD_A and PD_B.

Figure 27A:
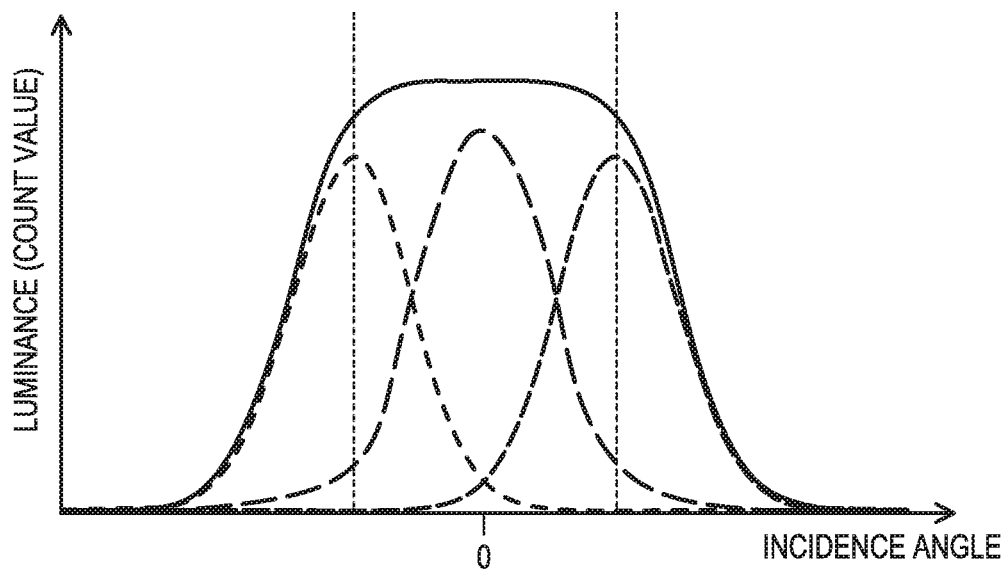
FIG. 27A is a diagram illustrating light incidence angle properties of a pixel.
Figure 27B:
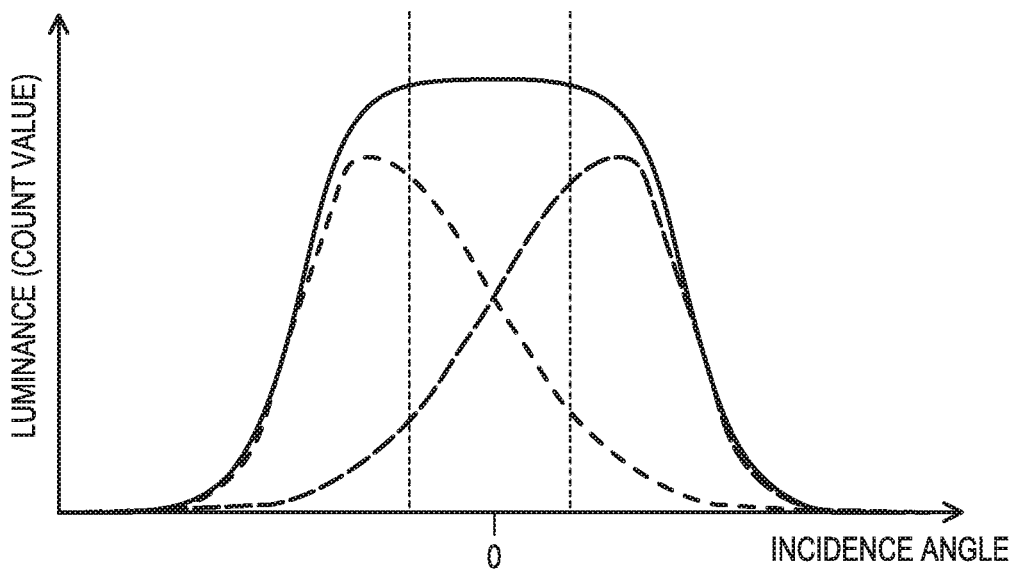
FIG. 27B is a diagram illustrating light incidence angle properties of a pixel.

FIG. 27A and FIG. 27B are graphs illustrating light incidence angle characteristics of the pixel 12. FIG. 27A is a graph illustrating the light incidence angle properties of a pixel in the imaging device according to the present embodiment. In the graph, the dotted line represents the light incidence angle properties of the photodiode PD_A, the dot-dash line represents the light incidence angle properties of the photodiode PD_B, and the double dot-dash line represents the light incidence angle properties of the photodiode PD_E. The solid line represents the sum of the photodiodes PD_A, PD_B, and PD_E. In the graph, the vertical dotted lines represent the positions of the centers of distributions of the light incidence angle properties of the photodiodes PD_A and PD_B, and the interval between these dotted lines represents the baseline length. FIG. 27B is a graph illustrating the light incidence angle properties of a pixel in the imaging device according to the first embodiment. In the graph, the dotted line represents the light incidence angle properties of the photodiode PD_A, the dot-dash line represents the light incidence angle properties of the photodiode PD_B, and the solid line represents the sum of the photodiodes PD_A and PD_B. In the graph, the vertical dotted lines represent the positions of the centers of distributions of the light incidence angle properties of the photodiodes PD_A and PD_B, and the interval between these dotted lines represents the baseline length.

As illustrated in FIG. 27A and FIG. 27B, in the imaging device according to the present embodiment, the photodiode PD_E is disposed between the photodiode PD_A and the photodiode PD_B, and thus the slopes of the light incidence angle properties of the photodiodes PD_A and PD_B for low incident angles becomes sharp. As such, compared to the imaging device according to the first embodiment, the imaging device according to the present embodiment can increase the difference between the positions of the centers of the distributions of the light incidence angle properties of the photodiodes PD_A and PD_B (the baseline length). Thus, according to the imaging device of the present embodiment, a dead band can be prevented from arising in a central part of the light-receiving region during image capturing, and the focus detection accuracy can be improved by increasing the baseline length during focus detection.

Additionally, by disposing the photodiode PD_E in a central part of the light-receiving region of the pixel 12, the detection efficiency of normally-incident photons can be improved. As such, an increase in the setting value of the voltages VDDA and VDDB in the second driving mode, described in the first embodiment, can be suppressed.

Although the present embodiment describes a case of pupil division in the X direction, the pupil division direction is not limited to the X direction. For example, in the configuration described in the first embodiment with reference to FIG. 8A to FIG. 10B, the photodiode PD_E may be provided in a region between the photodiode PD_A and the photodiode PD_B.

Additionally, the number of pupil region divisions for focus detection is not limited to the number illustrated in FIG. 25 to FIG. 26B (two divisions). For example, there may be four pupil region divisions, as illustrated in FIG. 28A and FIG. 28B.

Figure 28A:
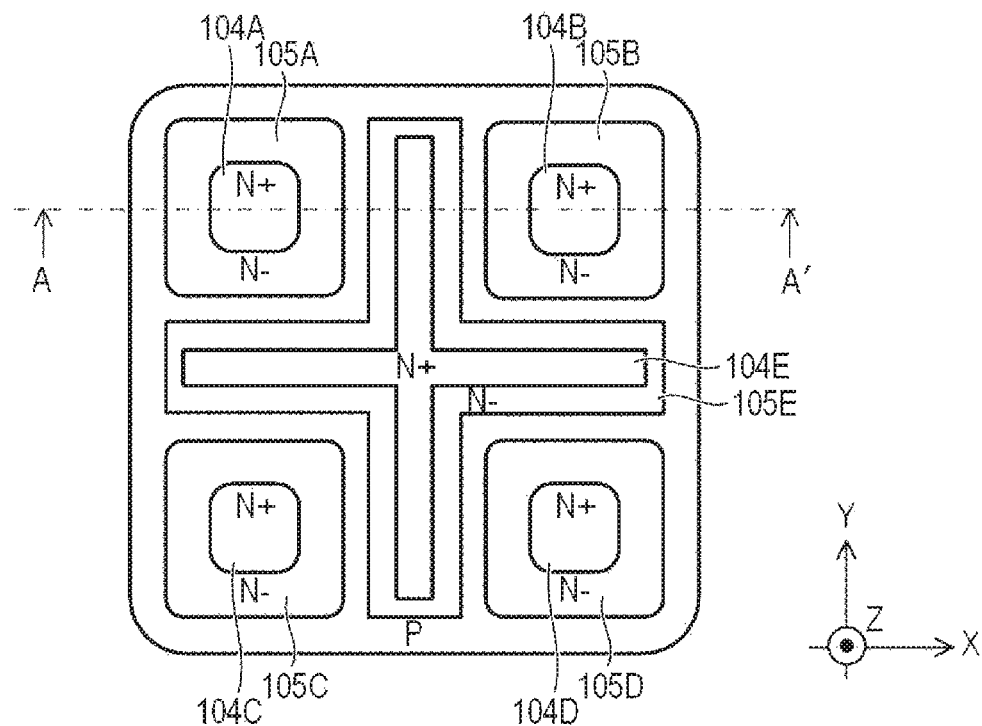
FIG. 28A is a plan view illustrating the structure of a pixel in an imaging device according to a variation on the sixth embodiment of the present invention.
Figure 28B:
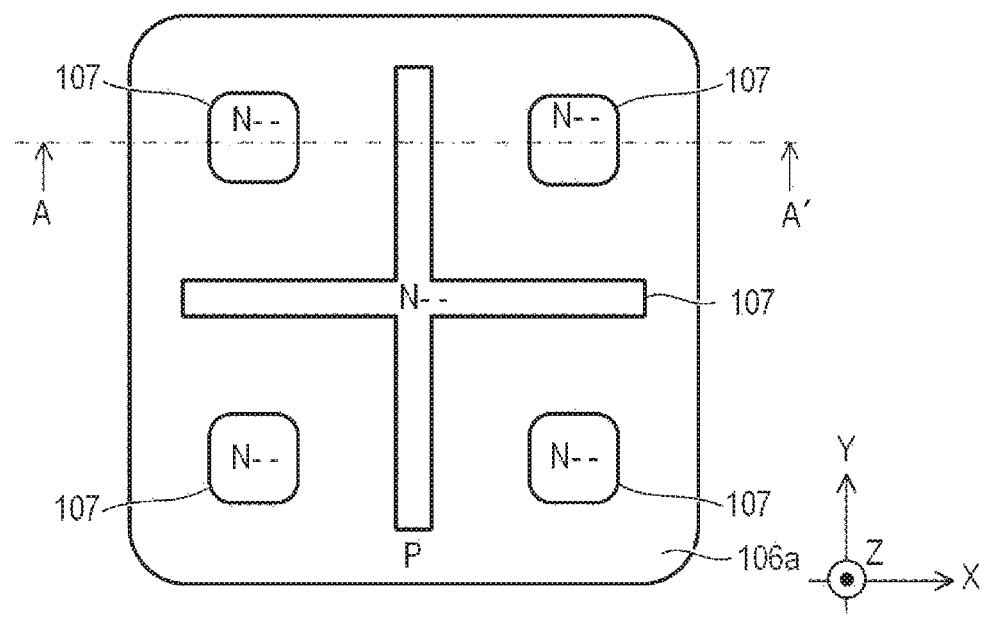
FIG. 28B is a plan view illustrating the structure of a pixel in an imaging device according to a variation on the sixth embodiment of the present invention.

FIG. 28A and FIG. 28B are plan views illustrating an example of a configuration when there are four pupil region divisions. FIG. 28A is a plan view of a plane, parallel to a surface of the semiconductor substrate 101, which contains the line B-B' in FIG. 25. FIG. 28B is a plan view of a plane, parallel to a surface of the semiconductor substrate 101, which contains the line C-C' in FIG. 25. FIG. 25 corresponds to a cross-sectional view taken along the line A-A' in FIG. 28A and FIG. 28B. A plan view of a plane, parallel to the surface of the semiconductor substrate 101, which contains the line D-D' in FIG. 25, is the same as in the imaging device according to the first embodiment, illustrated in FIG. 6.

When there are four pupil region divisions, the photodiode PD_E can be formed in, for example, a plus-sign shape in a plan view, as illustrated in FIG. 28A and FIG. 28B. By using such a shape, the separation characteristics among the photodiodes PD_A, PD_B, PD_C, and PD_D can be improved, and the baseline lengths between adjacent photodiodes can be increased.

In this manner, according to the present embodiment, in an imaging device which uses SPADs, focus detection using a phase difference detection method can be performed, and a bokeh similar to that which is obtained when not dividing pupils when capturing an image can be achieved. Additionally, the separation characteristics during phase difference detection can be improved, which makes it possible to improve the focus detection accuracy.

Seventh Embodiment

An imaging device according to a seventh embodiment of the present invention will be described with reference to FIG. 29 to FIG. 32. Constituent elements which are the same as in the imaging devices according to the first to sixth embodiments will be given the same reference signs, and descriptions thereof will be omitted or simplified.

The present embodiment will describe an imaging device having a function for switching the pupil division in accordance with the state of an aperture stop of an imaging optical system so that a sufficient baseline length can be secured, as well as a driving method for the device.

Figure 29:
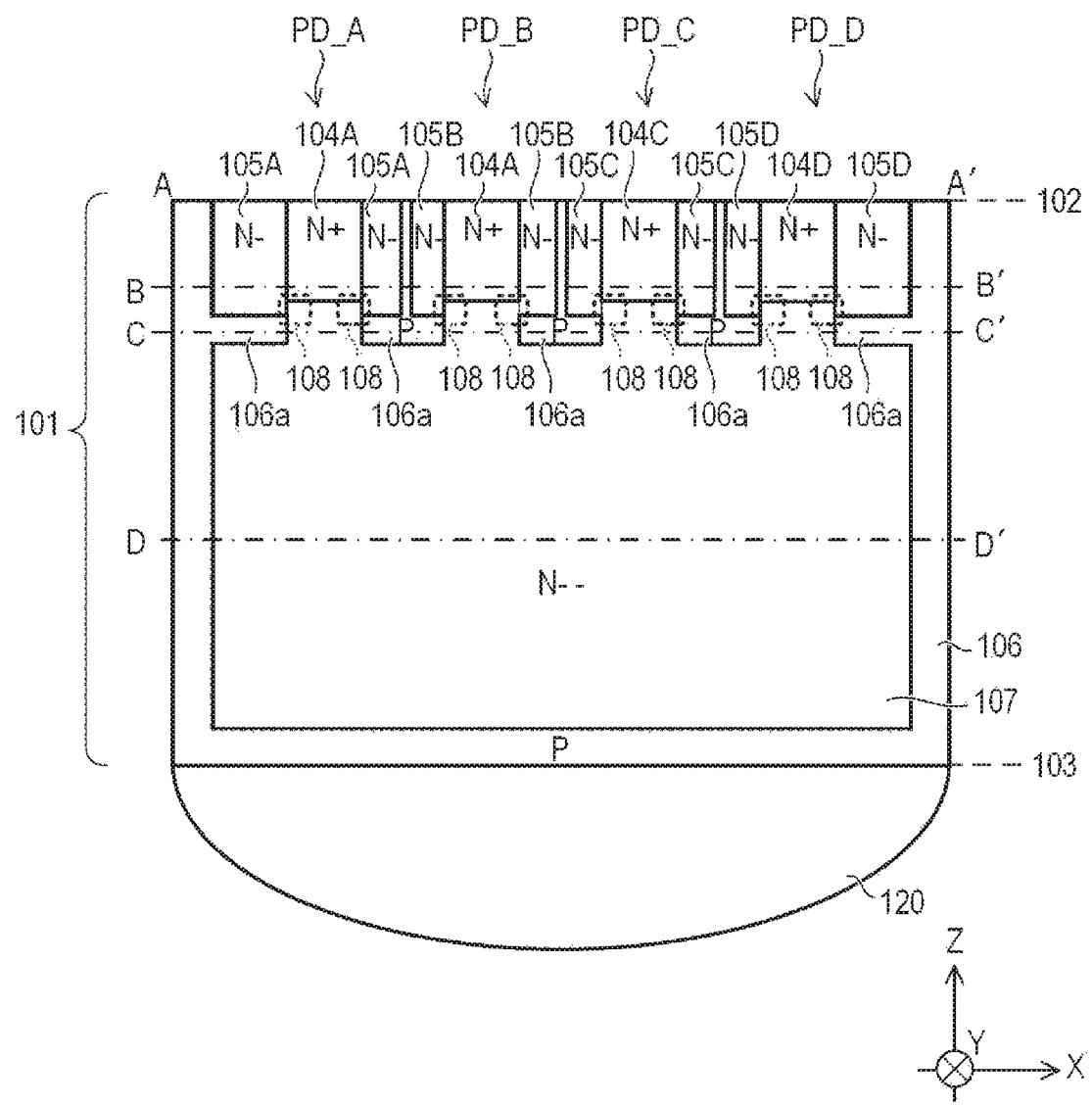
FIG. 29 is an overall cross-sectional view illustrating the structure of a pixel in an imaging device according to a seventh embodiment of the present invention.
Figure 30A:
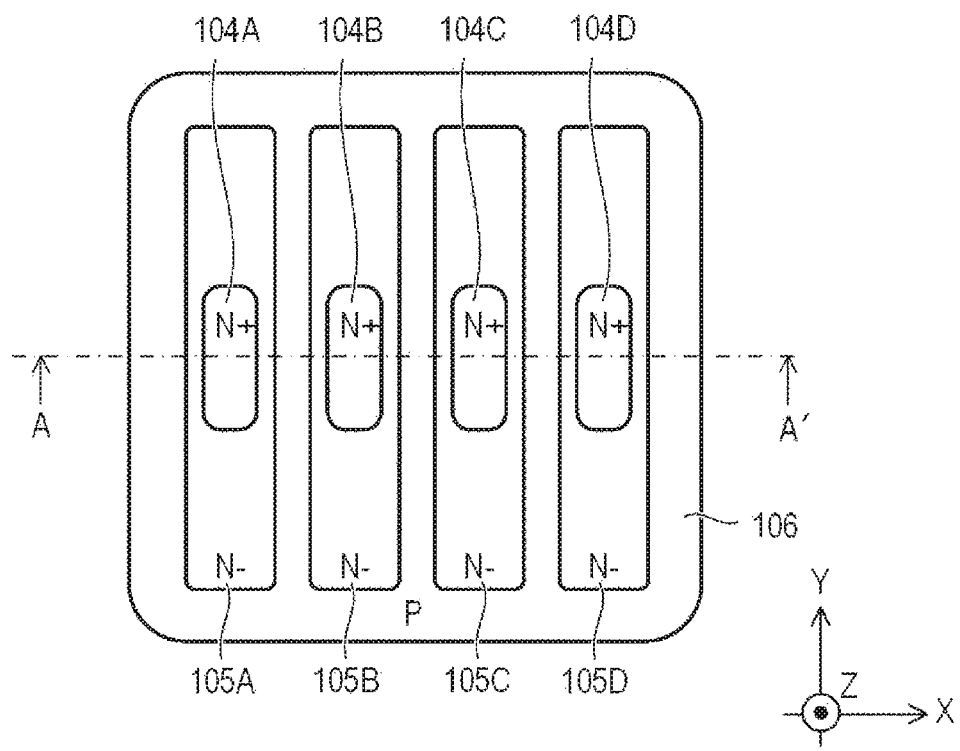
FIG. 30A is a plan view illustrating the structure of a pixel in the imaging device according to the seventh embodiment of the present invention.
Figure 30B:
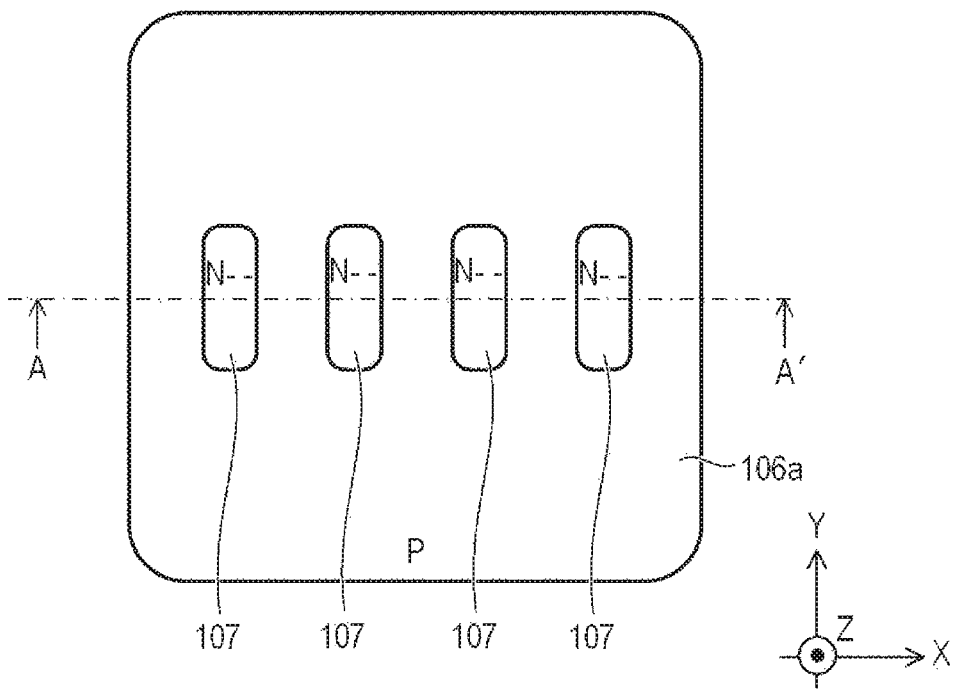
FIG. 30B is a plan view illustrating the structure of a pixel in the imaging device according to the seventh embodiment of the present invention.

FIG. 29 is an overall cross-sectional view illustrating the structure of a pixel in the imaging device according to the present embodiment. FIG. 30A and FIG. 30B are plan views illustrating the structure of the pixel in the imaging device according to the present embodiment. FIG. 30A is a plan view of a plane, parallel to a surface of the semiconductor substrate 101, which contains the line B-B' in FIG. 29. FIG. 30B is a plan view of a plane, parallel to a surface of the semiconductor substrate 101, which contains the line C-C' in FIG. 29. A plan view of a plane, parallel to the surface of the semiconductor substrate 101, which contains the line D-D' in FIG. 29, is the same as in the imaging device according to the first embodiment, illustrated in FIG. 6. Note that FIG. 29 is a cross-sectional view taken along the line A-A' in FIG. 30A and FIG. 30B.

As illustrated in FIG. 29 to FIG. 30B, the imaging device according to the present embodiment includes the four photodiodes PD_A, PD_B, PD_C, and PD_D. Viewed in plan view, the photodiodes PD_A, PD_B, PD_C, and PD_D have rectangular shapes, and are arranged in the X direction. Adjacent ones of the photodiode are separated by the P-type semiconductor region 106 in the same manner as in the second or sixth embodiment. Additionally, the P-type semiconductor region 106a extends along bottom parts of N-type semiconductor regions 105A, 105B. 105C, and 105D of the photodiodes PD_A, PD_B, PD_C, and PD_D.

Figure 31A:
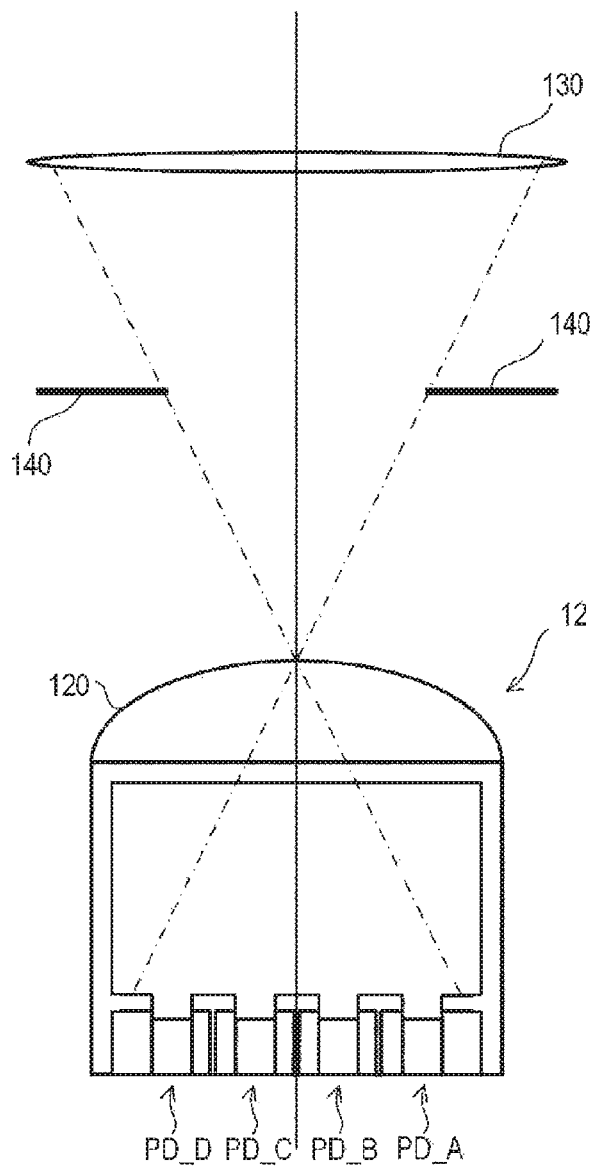
FIG. 31A is a schematic diagram illustrating changes in alight beam incident on a photodiode when the state of an aperture stop is changed in the imaging device according to the seventh embodiment of the present invention.
Figure 31B:
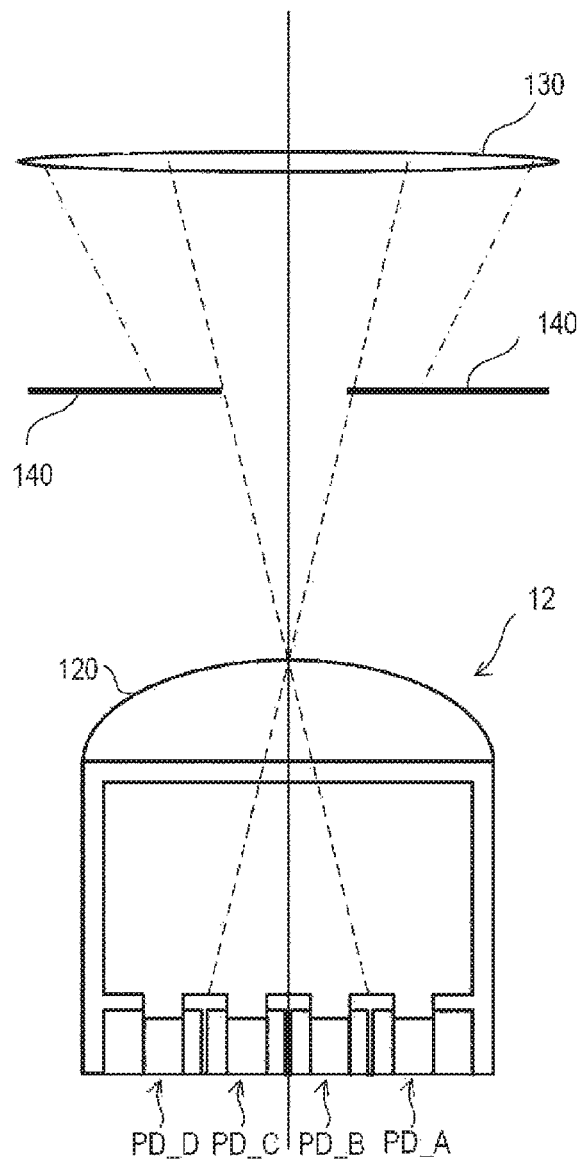
FIG. 31B is a schematic diagram illustrating changes in alight beam incident on a photodiode when the state of an aperture stop is changed in the imaging device according to the seventh embodiment of the present invention.

FIG. 31A and FIG. 31B are schematic diagrams illustrating changes in a light beam incident on a photodiode when the state of the aperture stop is changed in the imaging optical system. FIG. 31A illustrates a state when an aperture stop 140 is wide, and FIG. 31B illustrates a state where the aperture stop 140 is narrow.

Light incident on the pixel 12 through a lens 130 and the aperture stop 140 partially constituting the imaging optical system is incident on the photodiodes PD_A, PD_B, PD_C, and PD_D from the second surface 103 side of the semiconductor substrate 101, via the microlens 120. At this time, the regions on which the light is incident change depending on the diameter of the aperture stop 140 in the imaging optical system. For example, in a state where the diameter of the aperture stop 140 is wider as in FIG. 31A, light is incident from a region corresponding to the photodiode PD_A to a region corresponding to the photodiode PD_D. On the other hand, in a state where the diameter of the aperture stop 140 is narrower as in FIG. 31B, the light beam is limited by the aperture stop 140, and the light is incident only on a region corresponding to the photodiode PD_B and a region corresponding to the photodiode PD_C.

Figure 32:
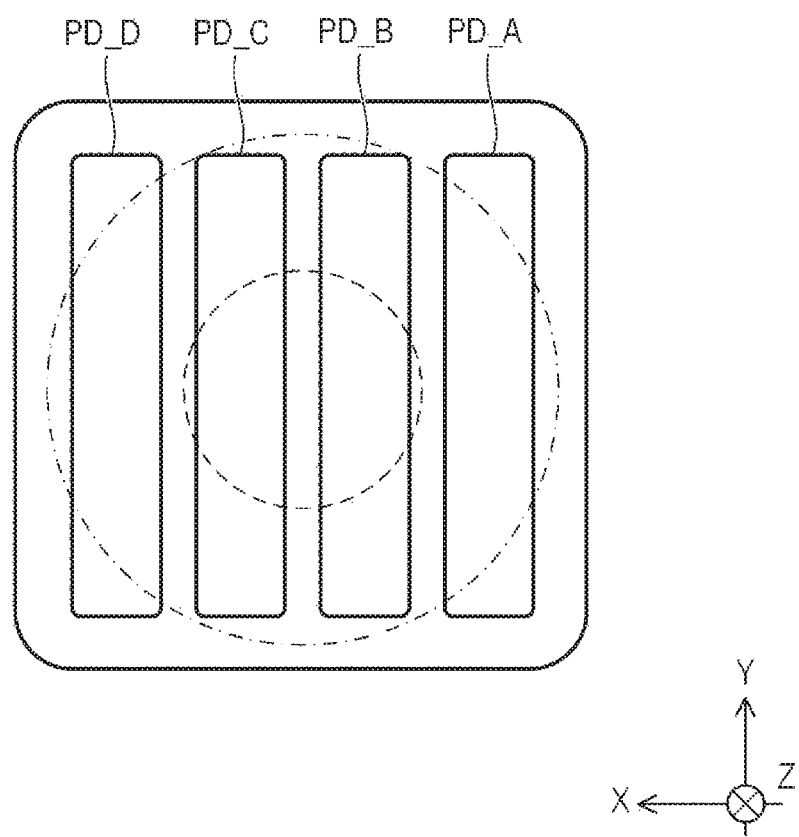
FIG. 32 is a plan view illustrating changes in a light beam incident on a photodiode when the state of an aperture stop is changed in the imaging device according to the seventh embodiment of the present invention.

FIG. 32 is a plan view illustrating changes in a light beam incident on a photodiode when the state of the aperture stop 140 is changed. Under conditions where the aperture stop 140 is wider, light is incident on a region from the photodiode PD_A to the photodiode PD_D, as indicated by the dot-dash line in FIG. 32. However, under conditions where the aperture stop 140 is narrower, the light beam is limited by the aperture stop 140, and the regions where light is incident correspond to the photodiodes PD_B and PD_C only, as indicated by the dotted line in FIG. 32.

Accordingly, the imaging device according to the present embodiment is configured so that the photodiodes to be driven are selected in accordance with the state of the aperture stop 140. For example, a reference table indicating relationships between states of the aperture stop 140 and the N-type semiconductor regions 104A, 104B, 104C, and 104D to which driving voltages (the voltages VDDA, VDDB, VDDC, and VDDD) are to be applied is prepared in advance. Then, a system control unit (not shown) obtains the state of the aperture stop 140, refers to the reference table and switches the photodiodes using the timing generation circuit 20. By the system control unit appropriately selecting the photodiodes in accordance with the state of the aperture stop 140, control can be performed for increasing the baseline length to the greatest extent possible.

Note that the circuit configuration of the readout circuitry may be the same as any of the configurations described with reference to FIG. 19 to FIG. 22. Additionally, the arrangement of the photodiodes are not limited to one using strip-shaped photodiodes, and may be any arrangement having a plurality of regions can be applied. Additionally, a voltage application region table is not limited to the state of the aperture stop 140, and may be created taking into account the effects of lens frame vignetting that changes with distance from the center of the optical axis of the imaging optical system.

In this manner, according to the present embodiment, in an imaging device which uses SPADs, focus detection using a phase difference detection method can be performed, and a bokeh similar to that which is obtained when not dividing pupils when capturing an image can be achieved. Furthermore, the separation characteristics can be optimized in accordance with the state of the aperture in the imaging optical system, which makes it possible to improve the focus detection accuracy.

Eighth Embodiment

An eighth embodiment of the present invention will be described next. As described in PTL 2, when a structure which electrically separates two divided photoelectric conversion regions is used, the performance of the pupil division is improved, but it is more difficult for a high electrical field to act on electrons produced between the photoelectric conversion regions. The electron detection efficiency (i.e., the sensitivity) drops as a result.

From the standpoint of focus detection performance, it is preferable that the photoelectric conversion regions be electrically separated, but from the standpoint of image capturing performance, doing so reduces the sensitivity, and it is therefore preferable that the photoelectric conversion region not be electrically separated. In this manner, when a SPAD is operated with a configuration in which the photoelectric conversion regions are divided, the electrical separation between the photoelectric conversion regions results in a tradeoff between the focus detection performance and the image capturing performance. The present embodiment proposes a structure which achieves both focus detection performance and image capturing performance.

The configuration of the pixel 12 (parts pertaining to photoelectric conversion) in an imaging device according to the eighth embodiment of the present invention will be described with reference to FIG. 14 and FIG. 33A to FIG. 37C. Like the pixel described in the second embodiment, the pixel 12 according to the present embodiment has the cross-sectional structure illustrated in FIG. 14; however, the configuration in the depth direction is different.

Here, the pixel has a backside-illuminated configuration. This is because the detection efficiency of photons incident on the N-type semiconductor regions 105A and 105B, which serve as a guard ring, is extremely low. Almost all of the electrons produced by photoelectric conversion by the N-type semiconductor regions 105A and 105B move directly to the N-type semiconductor regions 104A and 104B without reaching the high-electrical field region 108 serving as an avalanche multiplication region. As such, if, for example, light is incident from the surface of a semiconductor substrate 101 having a front side-illuminated configuration (the side on which the N-type semiconductor regions 105A and 105B are formed, at the top of the drawings), the detection efficiency will drop mainly for short-wavelength light photoelectrically converted near the surfaces of the photodiodes. As such, a backside-illuminated configuration is employed to suppress a drop in the detection efficiency for short-wavelength light.

Almost all electrons produced from short-wavelength light are produced in shallow parts of the photoelectric conversion regions. Electrons produced in shallow parts of the photoelectric conversion regions in a backside-illuminated structure as illustrated in FIG. 14 must move a longer distance in order to reach the avalanche multiplication region. Thus, compared to electrons produced from long-wavelength light, there is a higher probability that the electrons will be detected not by the photodiode corresponding to the light incidence position, but by an adjacent photodiode instead, which reduces the separation performance.

Accordingly, in the present embodiment, a separating part constituted by a semiconductor region of the second conductivity type, which reaches a predetermined depth from the surface on the side opposite from a light-receiving surface, is provided in a semiconductor region of the first conductivity type which has the light-receiving surface, in order to suppress a worsening of the separation performance. Short-wavelength light produces almost no electrons at deep parts of the photoelectric conversion regions. Thus, a separating part provided at a deep part does not act as a dead band with respect to short-wavelength light.

On the other hand, considering long-wavelength light, such long-wavelength light produces electrons even at deep parts of the photoelectric conversion regions. Electrons produced at deep parts must travel a shorter distance to reach the avalanche multiplication region. Thus, compared to electrons produced by short-wavelength light, there is a lower probability that the separation performance will worsen. However, a separating part provided at a deep part can act as a dead band with respect to long-wavelength light.

Taking into account the difference in the main depths at which electrons are produced depending on the wavelength of incident light, the present embodiment varies the pixel structure depending on the wavelength of light to be detected.

An example of the configuration of the pixel 12 which detects long-wavelength light will be described first. As mentioned above, the cross-section structure is as illustrated in FIG. 14.

Note that although the P-type (second conductivity type) semiconductor region 106 is indicated as being divided in the vertical cross-section illustrated in FIG. 14, that region is connected in another cross-section, and is therefore formed as single entity. The P-type semiconductor region 106 has a function for absorbing, through drift, holes produced when photoelectrically converting a single photon that is incident on a depleted region formed between N-type regions to which a positive voltage has been applied, and discharging those holes to the exterior of the imaging device.

The N-type (first conductivity type) semiconductor regions 104A and 104B, which constitute separate photodiodes, are formed in a single pixel defined by the microlens 120 so as to be electrically independent from each other. The N-type semiconductor regions 104A and 104B are supplied with a positive voltage (e.g., 3 V) via the respective resistors R_A and R_B, which serve as quenching circuits, and function as cathode terminals of PN junction photodiodes formed with the P-type semiconductor region 106. As illustrated in FIG. 2, the N-type semiconductor regions 104A and 104B are connected to input side of INV_A and INV_B.

Additionally, the N-type semiconductor regions 104A and 104B absorb, though drift, electrons produced when photoelectrically converting a single photon that is incident on a depleted region formed with the P-type semiconductor region 106. The N-type semiconductor regions 104A and 104B induce avalanche multiplication in the high-electrical field region 108, where the distance to the P-type semiconductor region 106 is short.

The P-type semiconductor region 106 extends continuously between the N-type semiconductor regions 104A and 104B. The P-type semiconductor region 106 forms a junction surface with the N-type semiconductor region 107 without having a configuration for electrically separating the N-type semiconductor regions 104A and 104B. As a result, the P-type semiconductor region 106 prompts electrons produced in the depleted region formed with the N-type semiconductor regions 104A and 104B to drift toward the N-type semiconductor region 104A or 104B. Accordingly, electrons produced in the depleted region can all be moved to one high-electrical field region 108 before recombining, which makes it possible to induce avalanche multiplication.

According to this structure, a single photon which is normally incident between the N-type semiconductor region 104A and 104B through the microlens 120 has a 50% probability of being avalanche-multiplied at one high-electrical field region 108 between the N-type semiconductor region 104A and the P-type semiconductor region 106. There is a 50% probability that the photon will be avalanche-multiplied in one high-electrical field region 108 between the N-type semiconductor region 104B and the P-type semiconductor region 106. Accordingly, the photon can be detected without loss.

Figure 33A:
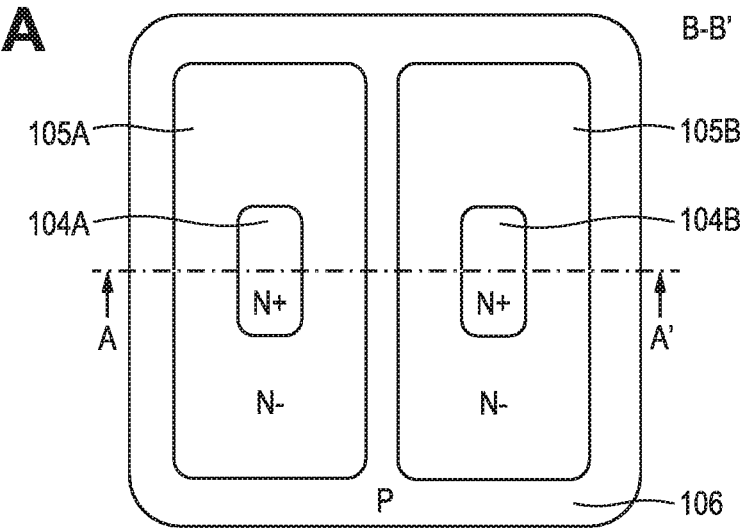
FIG. 33A is a diagram illustrating an example of the structure of a pixel in an imaging device according to an eighth embodiment of the present invention.
Figure 33B:
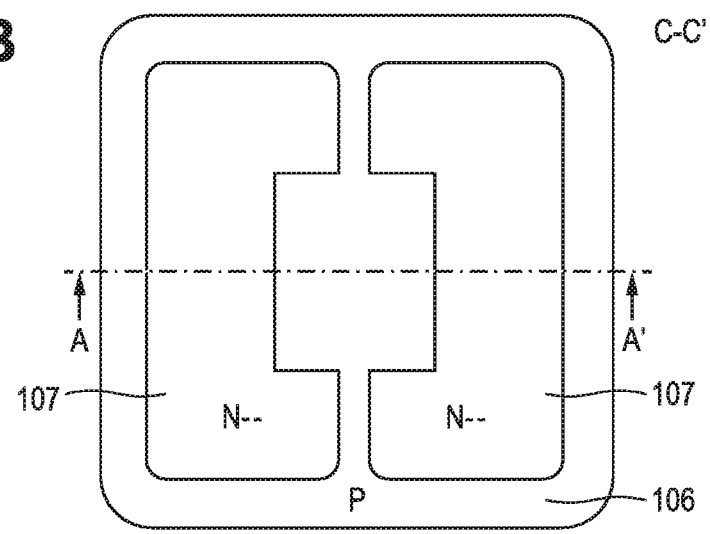
FIG. 33B is a diagram illustrating an example of the structure of a pixel in the imaging device according to the eighth embodiment of the present invention.
Figure 33C:
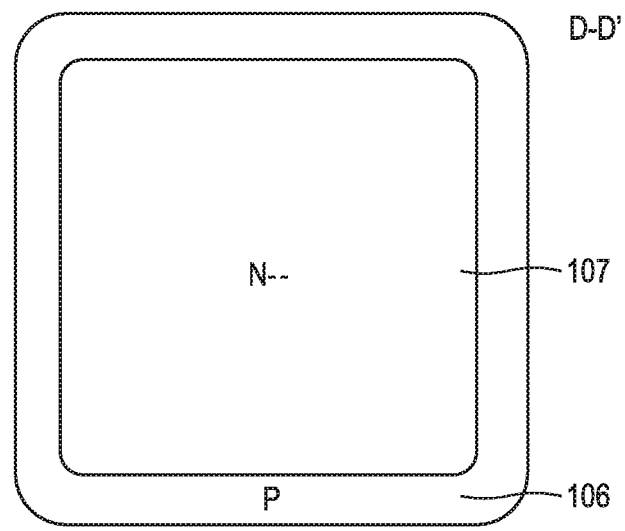
FIG. 33C is a diagram illustrating an example of the structure of a pixel in the imaging device according to the eighth embodiment of the present invention.

FIG. 33A to FIG. 33C are cross-sectional views of planes parallel to the surface of the semiconductor substrate 101, as positions indicated by the lines B-B', C-C', and D-D' indicated in FIG. 14. A cross-sectional view of a plane parallel to the surface of the semiconductor substrate 101 will be called a "horizontal cross-sectional view" hereinafter. Note that a cross-sectional view perpendicular to the surface of the semiconductor substrate 101, which contains the line A-A' in FIG. 33A to FIG. 33C, corresponds to FIG. 14.

As illustrated in FIG. 33A, in the cross-section along the line B-B', the P-type semiconductor region 106 has a form in which a part provided between pixels (an outer edge part) and a part provided between the N-type semiconductor regions 104A and 104B are connected. Additionally, the N-type semiconductor regions 105A and 105B are provided as guard rings between the N-type semiconductor regions 104A and 104B, and weaken the electrical field.

Additionally, as illustrated in FIG. 33B, in the cross-section taken along the line C-C', the P-type semiconductor region 106 extends continuously between the N-type semiconductor regions 104A and 104B so as to form a junction surface with the N-type semiconductor region 107, in addition to the part provided between the pixels (the outer edge part).

As illustrated in FIG. 33C, in the cross-section taken along the line D-D', the N-type semiconductor region 107 forming a junction surface with the P-type semiconductor region 106 is provided within the entirety of the P-type semiconductor region 106 provided in the outer edge part.

Note that it is not necessary for the P-type semiconductor region 106 to be provided between pixels. This is because the light receiving rate at the pixel boundary parts is extremely low due to the microlens 120 provided for each pixel. This is also because in the present embodiment, the detection efficiency is high between the N-type semiconductor region 104A and 104B, which have a high light receiving rate, and thus a relatively extremely low amount of color mixing will arise between pixels.

However, in an imaging device where adjacent pixels have different spectral properties or different spectral transmittances, such as when a Bayer color filter is provided, even slight color mixing between pixels can lead to a drop in image quality. As such, providing the P-type semiconductor region 106 between the pixels can suppress a drop in image quality.

Figure 34A:
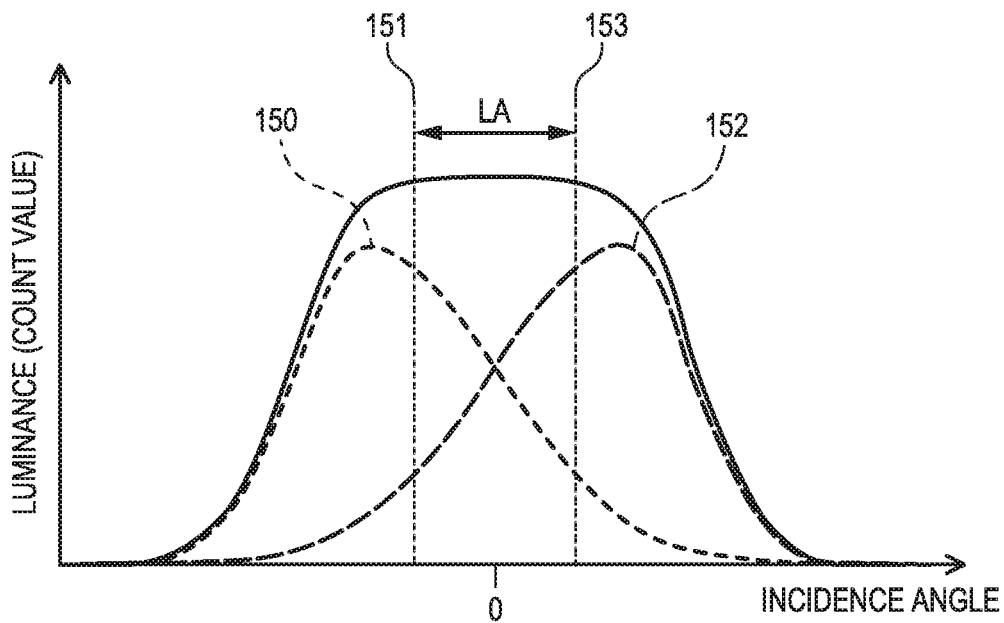
FIG. 34A is a diagram illustrating light incidence angle properties of a pixel.
Figure 34B:
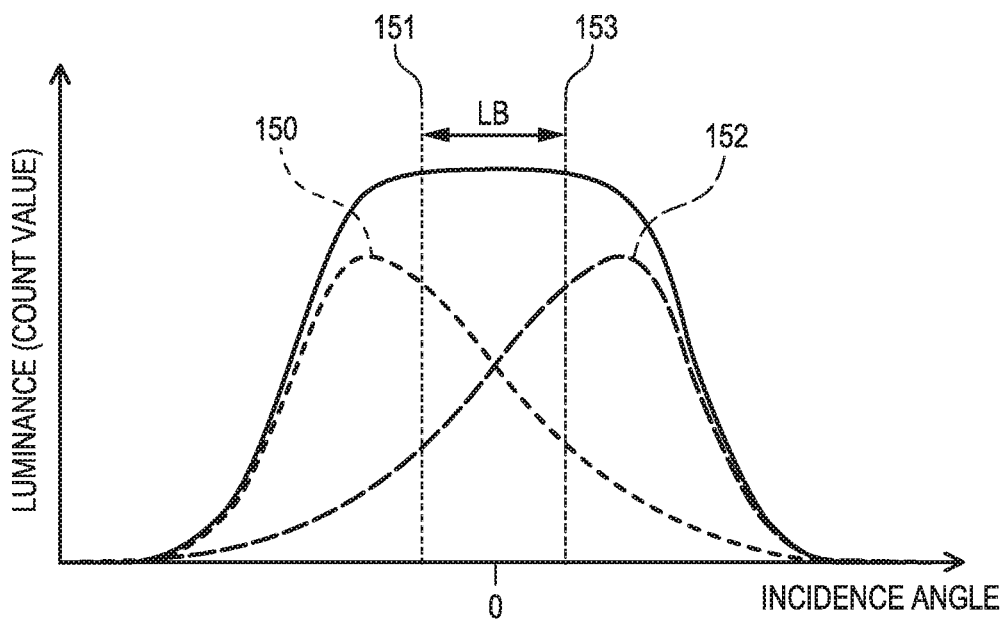
FIG. 34B is a diagram illustrating light incidence angle properties of a pixel.

FIG. 34A and FIG. 34B illustrate incidence angle properties of long-wavelength light and incidence angle properties of short-wavelength light with respect to a pixel having the configuration described above. Here, a broken line 151 represents the center position of a distribution 150, and a dot-dash line 153 represents the center position of a distribution 152. Distances LA and LB between the broken line 151 and the dot-dash line 153 express inter-center distances between the centers of the distributions. A longer inter-center distance indicates a better separation performance and a higher focus detection accuracy.

As mentioned above, with short-wavelength light, electrons are produced mainly in shallow parts, and thus a longer movement distance is required to induce avalanche multiplication. The separation performance therefore drops, and the inter-center distance LB in FIG. 34B becomes shorter than LA.

Figure 35A:
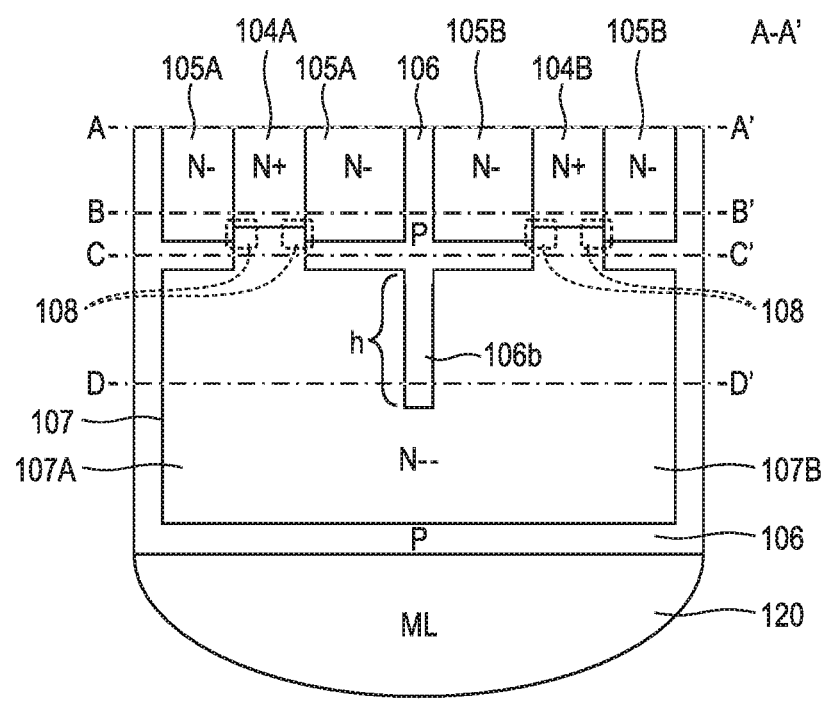
FIG. 35A is a diagram illustrating an example of the structure of a pixel in the imaging device according to the eighth embodiment of the present invention.
Figure 35B:
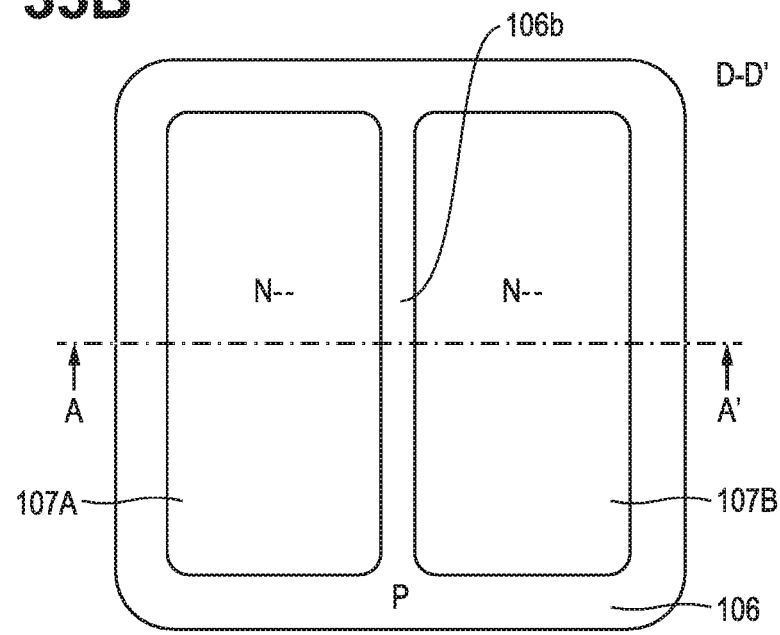
FIG. 35B is a diagram illustrating an example of the structure of a pixel in the imaging device according to the eighth embodiment of the present invention.

The present embodiment proposes a structure suited to a pixel which detects short-wavelength light, the structure suppressing a drop in the separation performance caused by the length of the distance over which electrons move. FIG. 35A and FIG. 35B illustrate an example of the pixel 12 which detects short-wavelength light, where FIG. 35A is a vertical cross-sectional view and FIG. 35B is a horizontal cross-sectional view from a position indicated by the line D-D'.

The difference from the vertical cross-sectional structure of the pixel which detects long-wavelength light (FIG. 14) is that the P-type semiconductor region 106 includes a wall-shaped part 106b which enters into the N-type semiconductor region 107 from between the N-type semiconductor regions 104A and 104B up to a predetermined depth from the surface opposite from the light-receiving surface. The wall-shaped part 106b functions as a separating part which electrically separates the N-type semiconductor regions 104A and 104B, and will therefore be called a "separating part" hereinafter. The separating part 106b is a part of the P-type semiconductor region 106 which enters into the N-type semiconductor region 107 from the junction surface with the N-type semiconductor region 107 (the surface of the N-type semiconductor region 107 opposite from the light-receiving surface). Additionally, the separating part 106b is provided in a position in which a wall-shaped part separating the N-type semiconductor regions 104A and 104B extends in the depth direction.

Movement of electrons produced on the N-type semiconductor region 104A side to the N-type semiconductor region 104B side (and in the opposite direction) can be suppressed by the separating part 106b, which is a P-type semiconductor region entering into the N-type semiconductor region 107 from between the N-type semiconductor regions 104A and 104B. In particular, by providing the separating part 106b at a deep part of the N-type semiconductor region 107 (a part distant from the light-receiving surface), the likelihood that the separating part 106b will act as a dead band with respect to short-wavelength light can be sufficiently reduced. This makes it possible to improve the separation performance while suppressing a drop in image quality. By employing the configuration illustrated in FIG. 35A and FIG. 35B for the pixel which detects short-wavelength light, the incidence angle properties with respect to short-wavelength light can be made closer to the state illustrated in FIG. 34A than the state illustrated in FIG. 34B.

Note that in the pixel having the vertical cross-section illustrated in FIG. 35A, the configuration along a horizontal cross-section at the position indicated by the line B-B' is the same as that illustrated in FIG. 33A. Likewise, the configuration at the horizontal cross-section at the position indicated by the line C-C' is the same as that illustrated in FIG. 33B. On the other hand, the horizontal cross-section at the position indicated by the line D-D' is the configuration illustrated in FIG. 35B.

In the horizontal cross-section at the position indicated by the line D-D', the separating part 106b, which is a P-type semiconductor region, is provided so as to divide the N-type semiconductor region 107 into two regions. This makes it possible to prevent electrons from moving from one N-type semiconductor region 107A/B to the other N-type semiconductor region 107B/A.

Here, the wavelengths of light were divided into short wavelengths and long wavelengths in order to simplify the descriptions of the technical spirit of the present embodiment. However, the fundamental technical spirit of the present embodiment pertains to determining whether or not to provide the separating part, the height (depth) of the separating part, and so on in accordance with the wavelength of light mainly detected by the pixel (i.e., the main wavelength of the pixel). Accordingly, the height (depth) of the separating part may be varied in accordance with the wavelength of light mainly detected by the pixel. "Long wavelength" and "short wavelength" do not refer to a specific range, and may be thought of as a wavelength where the separating part is likely to cause a drop in image quality and a wavelength where the separation performance can be improved with ease by the separating part.

FIG. 36A to FIG. 36C illustrate examples in which pixels having the above-described configuration for long wavelengths (without the separating part) and pixels having the configuration for short wavelengths (with the separating part) are allocated to pixels provided with a Bayer pattern color filter. In this case, the plurality of pixels 12 arranged in the pixel region 10 include a plurality of types of pixels having different spectral properties or spectral transmittances. R, G, and B indicate pixels provided with red, green, and blue color filters, respectively (these will be called "R pixels", "G pixels", and "B pixels", respectively). Here, the wavelength of light mainly detected is longest for the R pixels, and shorter for the G pixels and the B pixels, in that order.

FIG. 36A illustrates an example in which the configuration for short wavelengths (with the separating part) is applied only to the B pixels, and the configuration for long wavelengths (without the separating part) is applied to the R pixels and the G pixels. FIG. 36B illustrates an example in which the configuration for short wavelengths (with the separating part) is applied to the B pixels and the G pixels, and the configuration for long wavelengths (without the separating part) is applied only to the R pixels. FIG. 36C illustrates an example in which a configuration including the separating part is applied to all of the R pixels, the G pixels, and the B pixels, with the height of the separating part being B pixels >G pixels >R pixels. Note that in the case of FIG. 36B as well, the height of the separating parts provided in the B pixels may be higher than that of the separating parts provided in the G pixels. The height of the separating part can be determined in consideration of the depth to which the wavelength of light mainly detected reaches, the improvement in the separation performance, the drop in image quality, and so on.

Figure 37A:
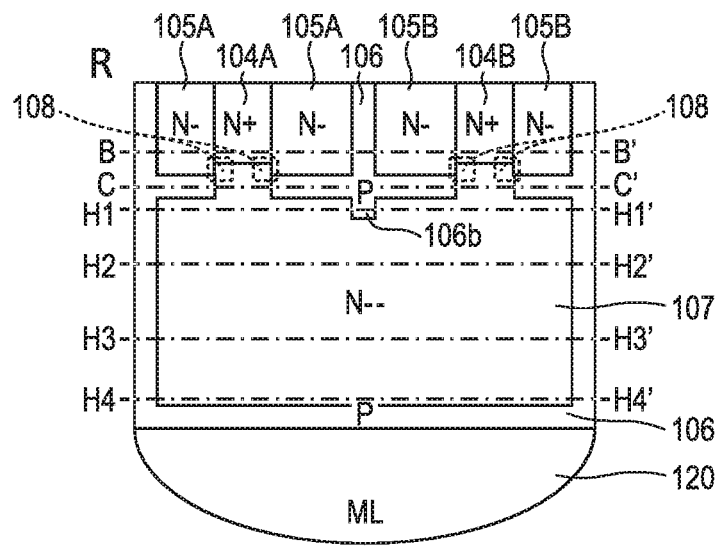
FIG. 37A is a diagram illustrating an example of the configuration of a pixel in the imaging device according to the eighth embodiment of the present invention.
Figure 37B:
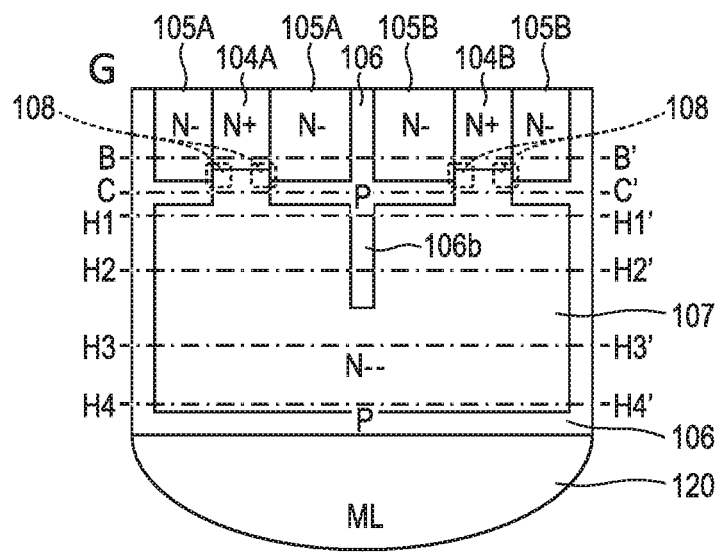
FIG. 37B is a diagram illustrating an example of the configuration of a pixel in the imaging device according to the eighth embodiment of the present invention.
Figure 37C:
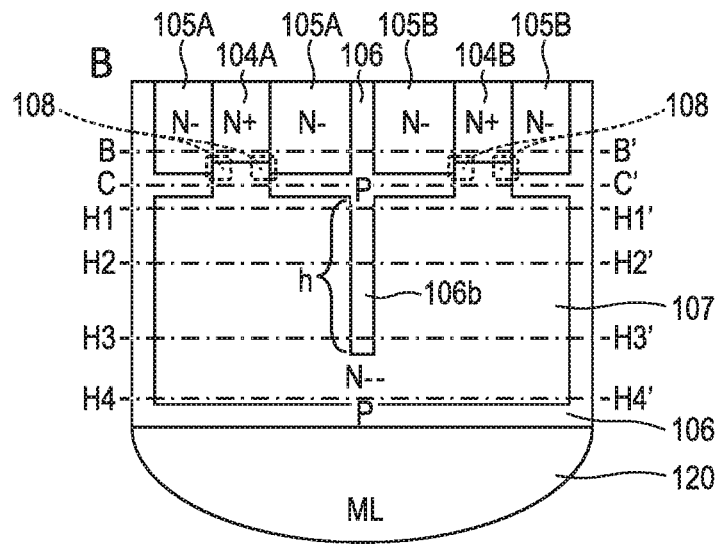
FIG. 37C is a diagram illustrating an example of the configuration of a pixel in the imaging device according to the eighth embodiment of the present invention.

FIG. 37A to FIG. 37C illustrate examples of the configurations of the R pixels, the G pixels, and the B pixels illustrated in FIG. 36C.

The wavelength of light mainly detected by the R pixels mainly produces electrons at a deep part of the N-type semiconductor region 107 (a part distant from the light-receiving surface). As such, the distance from the location where electrons are produced to the high-electrical field region 108 is short, and the drop in separation performance is lower than that for the G pixels and the B pixels from the outset. On the other hand, there is a higher likelihood that the separating part will act as a dead band and reduce the sensitivity than with the G pixels and the B pixels. As such, the height of the separating part provided in the R pixels is made lower than the height of the separating parts provided in the G pixels and the B pixels. Here, a height h of the separating part 106b is the length of a part that enters into the N-type semiconductor region 107, relative to the junction surface between the P-type semiconductor region 106 and the N-type semiconductor region 107 in a configuration where the separating part 106b is not provided, for example. In the example of FIG. 37A, the height h of the separating part 106b is H1<h<H2.

On the other hand, the wavelength of light mainly detected by the B pixels mainly produces electrons at a shallow part of the N-type semiconductor region 107 (a part near the light-receiving surface). As such, the distance from the location where electrons are produced to the high-electrical field region 108 is long, and the drop in separation performance is greater than that for the G pixels and the R pixels. On the other hand, there is a lower likelihood that the separating part will act as a dead band and reduce the sensitivity than with the G pixels and the R pixels. As such, the height of the separating part provided in the B pixels is made higher than the height of the separating parts provided in the G pixels and the R pixels. In the example of FIG. 37C, the height h of the separating part 106b is H2<H3<h<H4.

The wavelength of light mainly detected by the G pixels is longer than the main wavelength of light to be detected by the B pixels but shorter than the wavelength of light mainly detected by the R pixels. As such, the height of the separating part provided in the G pixels is between the height of the separating part provided in the R pixels and the height of the separating part provided in the B pixels. In the example of FIG. 37B, the height h of the separating part 106b is H2<h<H3.

Note that the horizontal cross-sectional structure at the respective positions of lines H1-H1', H2-H2', H3-H3', and H4-H4' is the structure illustrated in FIG. 35B, at planes where the separating part is present, and the structure illustrated in FIG. 33C, at planes where the separating part is not present.

As described thus far, according to the present embodiment, in a backside-illuminated pixel structure in which a plurality of photodiodes are formed, a semiconductor region of the second conductivity type (the separating part), which enters to a predetermined depth from the surface opposite from the light-receiving surface, is provided in the semiconductor region of the first conductivity type, which includes the light-receiving surface. The semiconductor region of the first conductivity type is electrically separated at the part where the semiconductor region of the second conductivity type enters. Accordingly, a situation where a photodiode not corresponding to the position where an electron is produced detects the electron can be suppressed, which makes it possible to improve the separation performance. Additionally, by adjusting the height (depth) of the separating part in accordance with the wavelength of light mainly detected by the pixel, the separation performance can be improved while suppressing a drop in image quality caused by the separating part.

Ninth Embodiment

The pixel 12 in an imaging device according to a ninth embodiment of the present invention will be described next.

In the present embodiment, the separating part 106b described in the eighth embodiment is provided in all of the pixels. The width (thickness) of the separating part is adjusted in accordance with the wavelength of light mainly detected by the pixel.

Specifically, in pixels that mainly detect long-wavelength light, the width (thickness) of the separating part acting as a dead band is made narrower (thinner) than the separating part provided in pixels that mainly detect short-wavelength light. This is done to suppress a decrease in the produced electrons caused by the separating part in pixels that detect long-wavelength light, where electrons are produced by photoelectric conversion even at a deep part of the N-type semiconductor region 107. Additionally, by adjusting the width of the separating part provided in pixels that mainly detect short-wavelength light, the degree to which a worsening of the separation performance is ameliorated can be adjusted, and the wavelength dependence of the separation performance can be reduced.

Figure 38A:
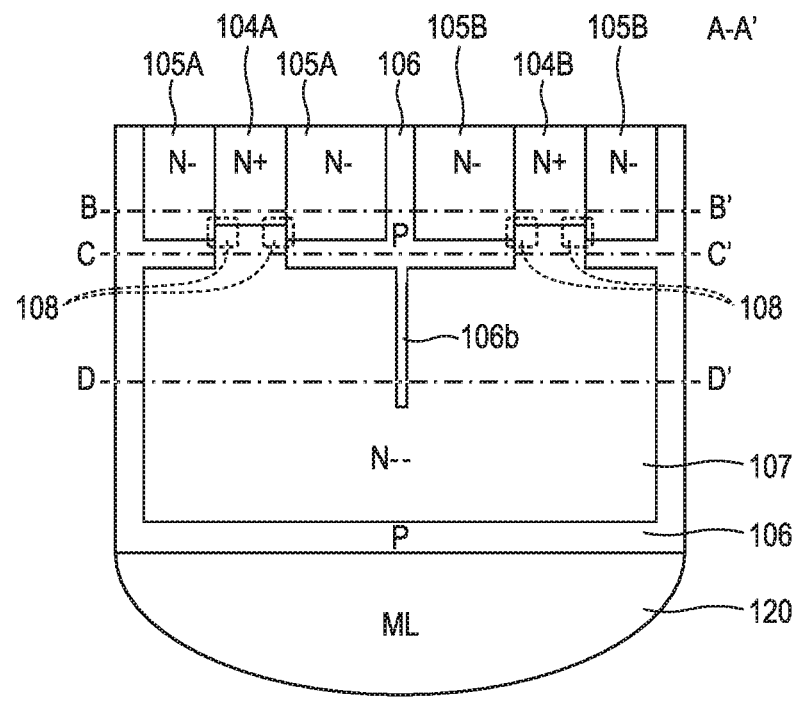
FIG. 38A is a diagram illustrating an example of the configuration of a pixel in an imaging device according to a ninth embodiment of the present invention.

FIG. 38A is a vertical cross-sectional view illustrating an example of the structure of a pixel, among the pixels according to the present embodiment, which mainly detects long-wavelength light. Like the configuration described in the eighth embodiment (FIG. 35A), the P-type semiconductor region 106 disposed between the N-type semiconductor regions 104A and 104B includes the separating part 106b, which enters into the N-type semiconductor region 107 that forms the light-receiving region. However, the width of the separating part 106b is narrower (thinner) than the width (thickness) of the P-type semiconductor region 106 provided between the N-type semiconductor regions 104A and 104B.

Note that in addition to the width of the separating part 106b, the depth (height) of the separating part 106b can be adjusted, as described in the eighth embodiment. The width and depth can be determined in consideration of the drop in image quality caused by the separating part 106b acting as a dead band.

Figure 38B:
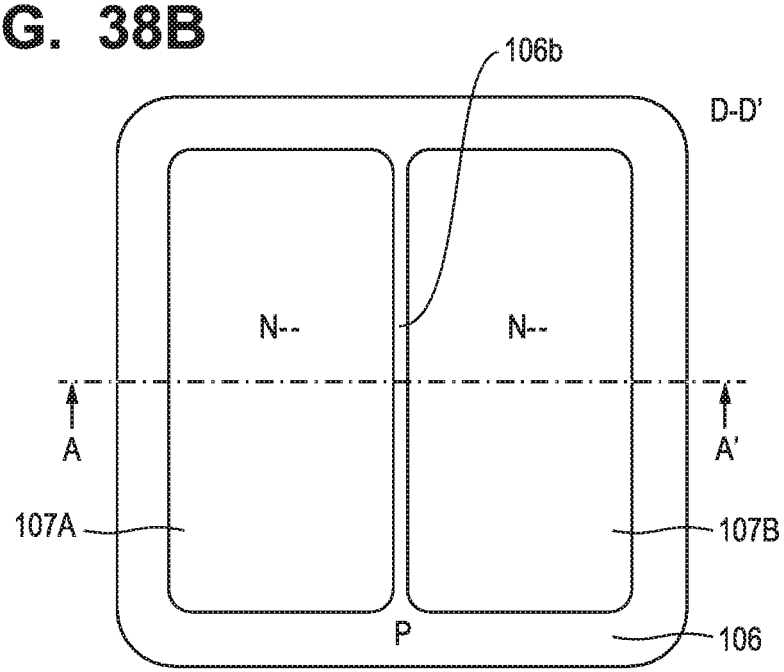
FIG. 38B is a diagram illustrating an example of the configuration of a pixel in the imaging device according to the ninth embodiment of the present invention.

Note that the horizontal cross-sectional configuration at the position indicated by the line B-B' in FIG. 38A is the same as that illustrated in FIG. 33A. Additionally, the horizontal cross-sectional configuration at the position indicated by the line C-C' in FIG. 38A is the same as that illustrated in FIG. 33B. FIG. 38B is a horizontal cross-sectional view of the position indicated by the line D-D' in FIG. 38A. The width of the separating part 106b is narrower than in the horizontal cross-sectional configuration at the same position in the eighth embodiment, illustrated in FIG. 35B. By providing the separating part 106b, the movement of electrons from the N-type semiconductor region 107A to 107B, or in the opposite direction, can be suppressed. Additionally, by reducing the width of the separating part 106b, the volume of the separating part which acts as a dead band can be reduced, which makes it possible to suppress a drop in image quality caused by the separating part 106b.

Figure 39A:
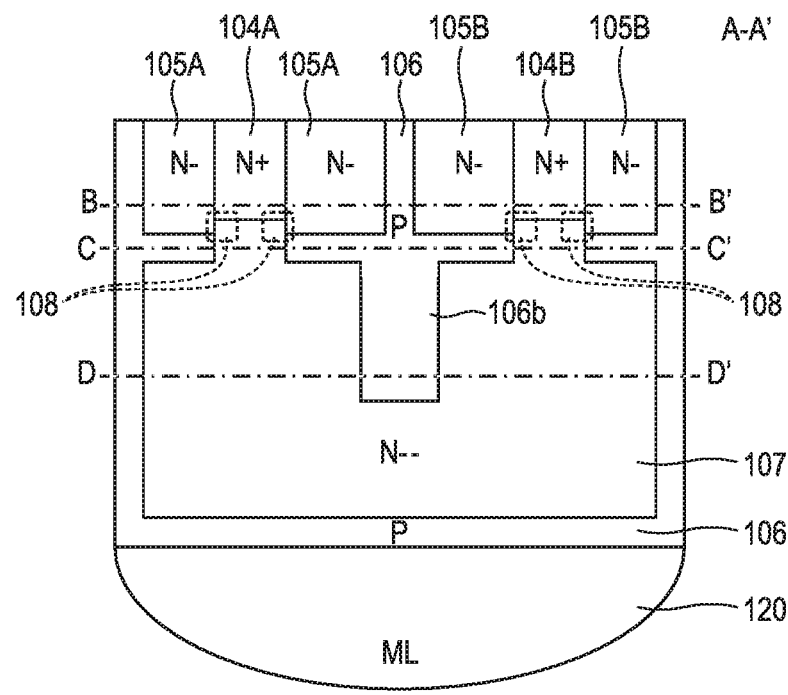
FIG. 39A is a diagram illustrating an example of the configuration of a pixel in the imaging device according to the ninth embodiment of the present invention.
Figure 39B:
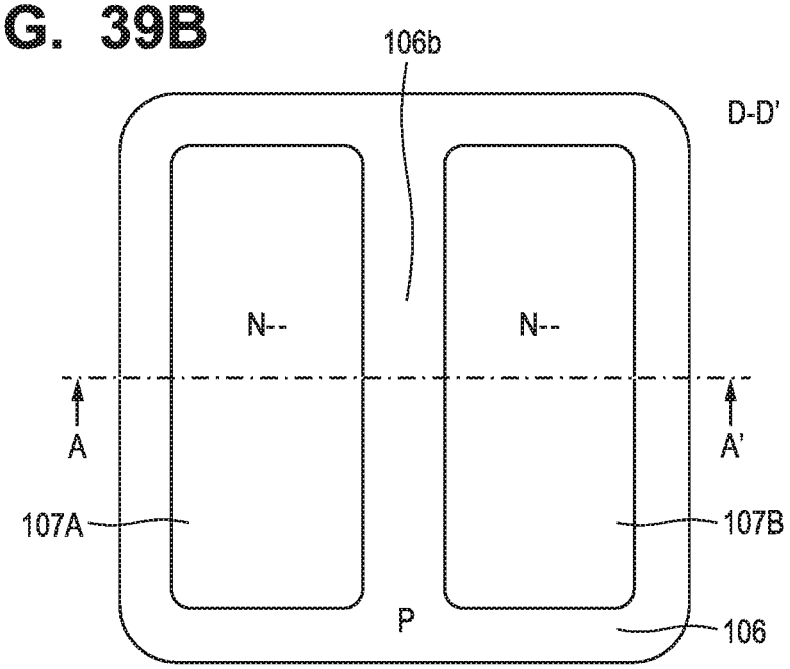
FIG. 39B is a diagram illustrating an example of the configuration of a pixel in the imaging device according to the ninth embodiment of the present invention.

FIG. 39A and FIG. 39B are vertical cross-sectional views illustrating an example of the structure of a pixel, among the pixels according to the present embodiment, which mainly detects short-wavelength light. The width (thickness) of the separating part 106b is greater than in the structure of the pixel that mainly detects long-wavelength light, illustrated in FIG. 38A and FIG. 38B. Although the height (depth) of the separating part 106b is described as being the same as in FIG. 38A and FIG. 38B, the height (depth) of the separating part 106b may be varied in accordance with the wavelength of light mainly detected. When light on the short-wavelength side is incident on the light-receiving surface, electrons are produced mainly in shallow parts near the light-receiving surface. As such, the separating part 106b provided in the deep part has very little influence on the number of electrons produced by short-wavelength light. Thus, even if the width of the separating part 106b is increased and the separation performance is improved, the volume of the dead band undergoes no substantial increase.

Note that the horizontal cross-sectional configuration at the position indicated by the line B-B' in FIG. 39A is the same as that illustrated in FIG. 33A. Additionally, the horizontal cross-sectional configuration at the position indicated by the line C-C' in FIG. 39A is the same as that illustrated in FIG. 33B. FIG. 39B is a horizontal cross-sectional view of the position indicated by the line D-D' in FIG. 38A. The width of the separating part 106b is broader than in the horizontal cross-sectional configuration at the same position in the eighth embodiment, illustrated in FIG. 35B. By providing the separating part 106b, the movement of electrons from the N-type semiconductor region 107A to 107B, or in the opposite direction, can be suppressed. Additionally, the effect of the separating part can be increased by broadening the width of the separating part 106b.

Note that if the separation performance is equivalent to that of the pixel that mainly detects long-wavelength light, the width of the separating part 106b in the pixel that mainly detects short-wavelength light need not be broader than the width of the P-type semiconductor region 106 provided between the N-type semiconductor regions 104A and 104B. For example, the width may be broader than the width of the separating part 106b provided in the pixel that mainly detects long-wavelength light (FIG. 38A and FIG. 38B), but narrower than the width of the P-type semiconductor region 106 provided between the N-type semiconductor regions 104A and 104B.

As described above, the present embodiment can be combined with the eighth embodiment. For example, the width of the separating part 106b may be varied in the structures of the R pixels, the G pixels, and the B pixels illustrated in FIG. 37A and FIG. 37B. For example, the width of the separating part may be broader in the G pixels than in the R pixels, and the width of the separating part may be broader in the B pixels than in the G pixels.

According to the present embodiment, by adjusting the width (thickness) of the separating part constituted by a semiconductor of the second conductivity type, provided in a semiconductor region of the first conductivity type having a light-receiving surface, in accordance with the wavelength of light mainly detected by the pixel, the separation performance can be improved while suppressing a drop in image quality caused by the separating part.

Tenth Embodiment

The pixel 12 in an imaging device according to a tenth embodiment of the present invention will be described next.

In the present embodiment, the separating part 106b described in the eighth embodiment is provided in all of the pixels. However, in pixels that detect long-wavelength light, where electrons are produced even at deep parts, the impurity concentration of the separating part is reduced in order to suppress a drop in image quality caused by providing the separating part 106b. Reducing the impurity concentration of the separating part, which is a P-type semiconductor region, lengthens the lifespan of electrons which are minority carriers in the separating part, which makes it possible to increase the probability that the electrons produced in the separating part can escape from the separating part.

Figure 40:
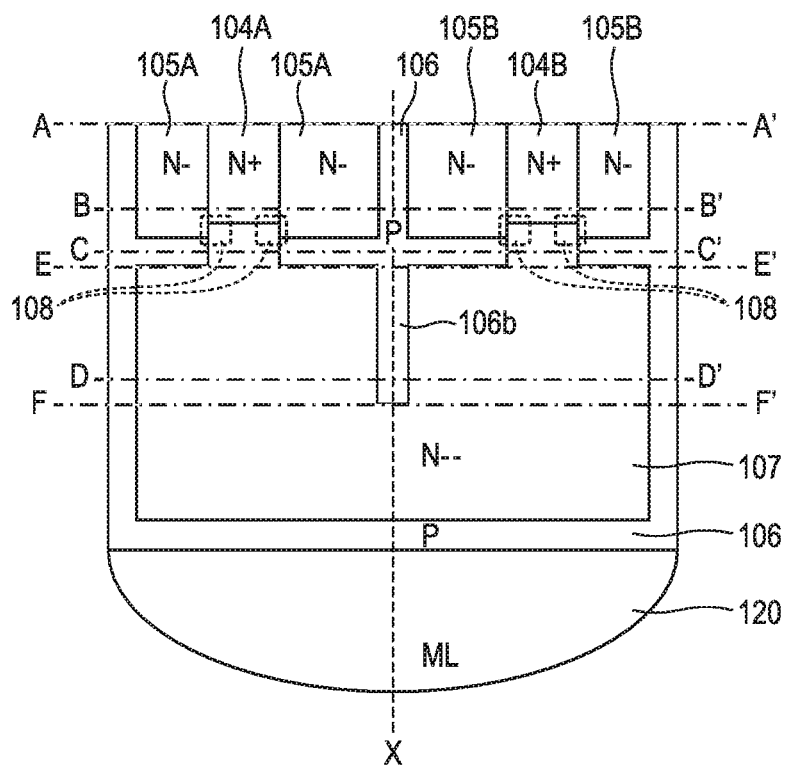
FIG. 40 is a diagram illustrating an example of the configuration of a pixel in an imaging device according to a tenth embodiment of the present invention.

FIG. 40 is a vertical cross-sectional view illustrating an example of the structure of a pixel according to the present embodiment. In the present embodiment, the same cross-sectional structure as the structure of the pixel that mainly detects short-wavelength light (FIG. 35A and FIG. 35B), described in the eighth embodiment, is used regardless of the wavelength to be detected. Accordingly, the horizontal cross-sectional configurations at the positions indicated by the lines B-B' and C-C' in FIG. 40 are the same as those illustrated in FIG. 33A and FIG. 33B. Additionally, the horizontal cross-sectional configuration at the position indicated by the line D-D' is the same as that illustrated in FIG. 35B. However, the impurity concentration of the separating part 106b is lower than in other parts of the P-type semiconductor region 106.

Figure 41:
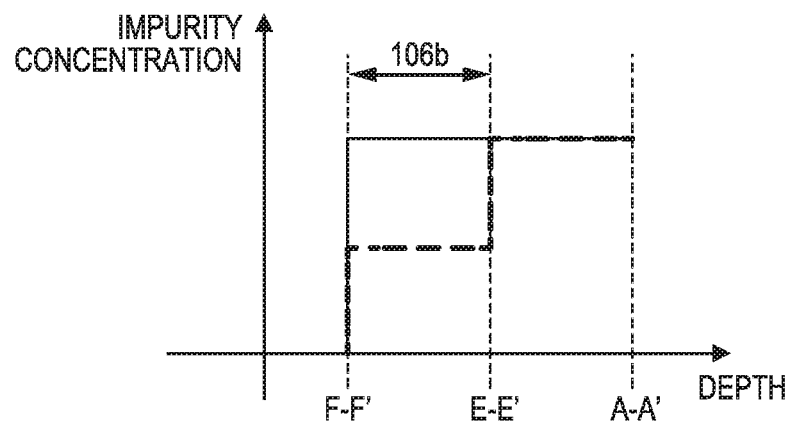
FIG. 41 is a diagram pertaining to an impurity concentration in a pixel in the imaging device according to the tenth embodiment of the present invention.

FIG. 41 illustrates the impurity concentration of the P-type semiconductor region 106 along an optical axis x of the microlens 120 illustrated in FIG. 40. The depth indicated in FIG. 41 corresponds to the distance from the light-receiving surface. Control is performed such that pixels that mainly detect short-wavelength light undergo a concentration change indicated by the solid line, and pixels that mainly detect long-wavelength light undergo a concentration change indicated by the dot-dash line. For pixels that mainly detect short-wavelength light, the impurity concentration is constant regardless of the depth. However, for pixels that mainly detect long-wavelength light, the impurity concentration of the part from a line E-E' to a line F-F', which corresponds to the separating part 106b, is controlled to be lower than in other parts.

By providing the separating part 106b, the movement of electrons from the N-type semiconductor region 107A to 107B, or in the opposite direction, can be suppressed. Additionally, by making the impurity concentration of the separating part 106b lower than in other parts of the P-type semiconductor region 106, the lifespan of electrons produced in the separating part can be lengthened, and the probability that electrons will escape from the separating part due to drift can be increased. In this manner, a drop in image quality caused by the separating part 106b can be suppressed by reducing the impurity concentration of the separating part 106b as well.

The present embodiment can be combined with the control of at least one of the depth and width of the separating part 106b, as described in the eighth and ninth embodiments. Accordingly, when the separating part 106b is provided, controlling not only the impurity concentration of the separating part 106b, but the width or depth of the separating part 106b as well, makes it possible to improve the separation performance while suppressing a drop in image quality caused by the separating part 106b.

In FIG. 41, the impurity concentration of the P-type semiconductor region 106 is constant for pixels that mainly detect short-wavelength light. However, the impurity concentration of the part corresponding to the separating part 106b (the part from the line E-E' to the line F-F') may be made lower than in other parts (the part from the line A-A' to the line E-E'). This is because even with short-wavelength light, it is not necessarily the case that no electrons will be produced by the separating part 106b.

When the present embodiment is applied, for example, to the structures of R pixels, G pixels, and B pixels, the impurity concentration of the separating part 106b can be made lower for the G pixels than for the B pixels, and the impurity concentration of the separating part 106b can be made lower for the R pixels than for the G pixels, for example.

According to the present embodiment, by adjusting the impurity concentration of the separating part constituted by a semiconductor of the second conductivity type, provided in a semiconductor region of the first conductivity type having a light-receiving surface, in accordance with the wavelength of light mainly detected by the pixel, the separation performance can be improved while suppressing a drop in image quality caused by the separating part.

Eleventh Embodiment

The pixel 12 in an imaging device according to an eleventh embodiment of the present invention will be described next. In the present embodiment, the separation performance for electrons produced at shallow parts is improved by further providing a separating part extending from the light-receiving surface to within an N-type semiconductor region.

Figure 42A:
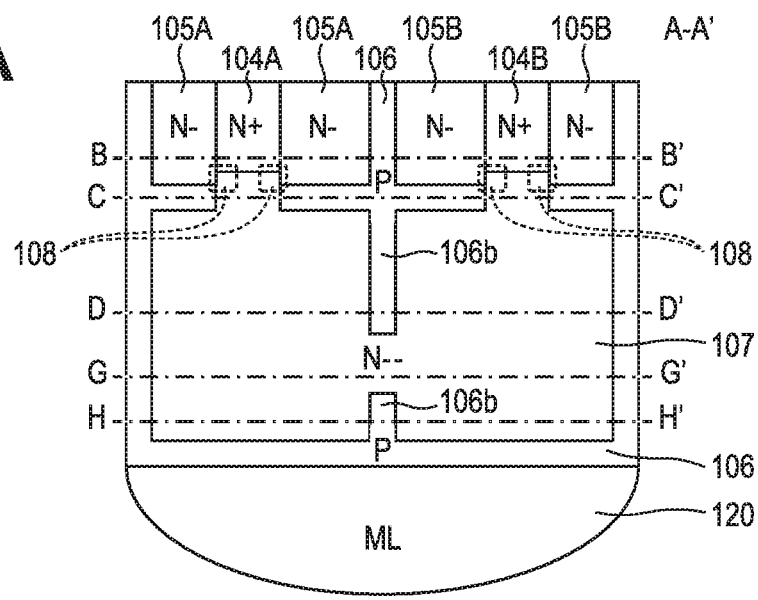
FIG. 42A is a diagram illustrating an example of the structure of a pixel in an imaging device according to an eleventh embodiment of the present invention.

FIG. 42A is a vertical cross-sectional view illustrating an example of the structure of a pixel according to the present embodiment. In the present embodiment, the separating part 106b of the P-type semiconductor region is provided entering into the N-type semiconductor region 107 from the light-receiving surface of the N-type semiconductor region 107. The position of the separating part 106b on the light-receiving surface side may be the same as that of the separating part 106b provided on the surface opposite from the light-receiving surface. However, the separating part 106b provided in a shallow part from the light-receiving surface has a large impact on the image quality. Accordingly, this configuration can be combined with at least one configuration for suppressing a drop in image quality caused by the separating part 106b, such as narrowing the width as described in the ninth embodiment or reducing the impurity concentration as described in the tenth embodiment. The pixel structure according to the present embodiment can be employed regardless of the wavelength of light mainly detected. However, from the standpoint of improving the separation performance for electrons produced in shallow parts, applying the structure to pixels that mainly detect short-wavelength light has a greater effect.

Figure 42B:
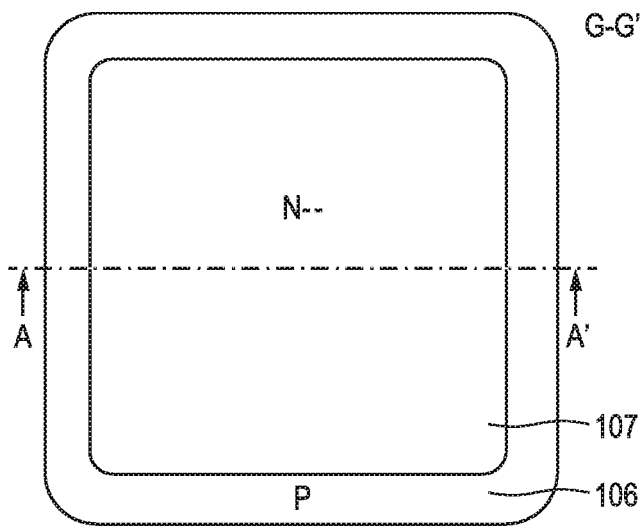
FIG. 42B is a diagram illustrating an example of the structure of a pixel in the imaging device according to the eleventh embodiment of the present invention.
Figure 42C:
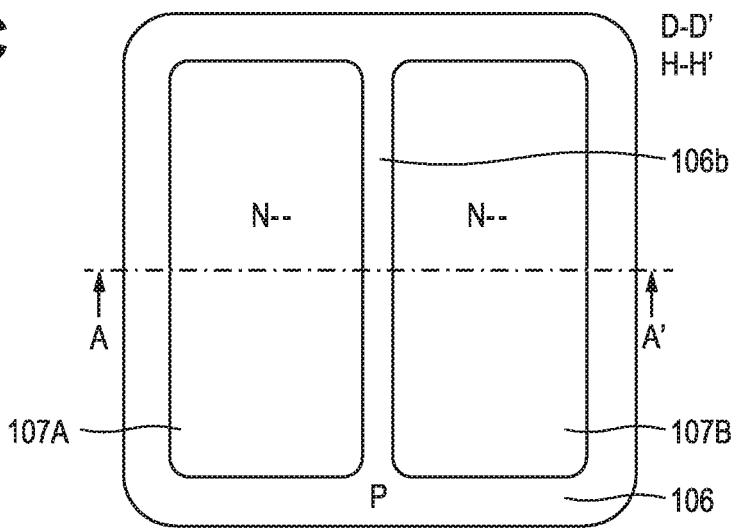
FIG. 42C is a diagram illustrating an example of the structure of a pixel in the imaging device according to the eleventh embodiment of the present invention.

Note that the horizontal cross-sectional configuration at the position indicated by the line B-B' in FIG. 42A is the same as that illustrated in FIG. 33A. Additionally, the horizontal cross-sectional configuration at the position indicated by the line C-C' in FIG. 42A is the same as that illustrated in FIG. 33B. FIG. 42B is a horizontal cross-sectional view of the position indicated by a line G-G' in FIG. 42A. FIG. 42C is a horizontal cross-sectional view of the positions indicated by the line D-D' and a line H-H' in FIG. 42A.

In the present embodiment, a separating part constituted by a semiconductor region of the second conductivity type, provided in a semiconductor region of the first conductivity type which has a light-receiving surface, is provided in both the light-receiving surface and the surface opposite from the light-receiving surface. This makes it possible to improve the separation performance for electrons produced in a shallow part of the semiconductor region of the first conductivity type.

Twelfth Embodiment

The configuration of an imaging device according to a twelfth embodiment of the present invention will be described next.

In the present embodiment, a potential form of a light-receiving region is varied by varying a potential difference between a semiconductor region of the first conductivity type and a semiconductor region of the second conductivity type in accordance with the wavelength to be detected.

Figure 43:
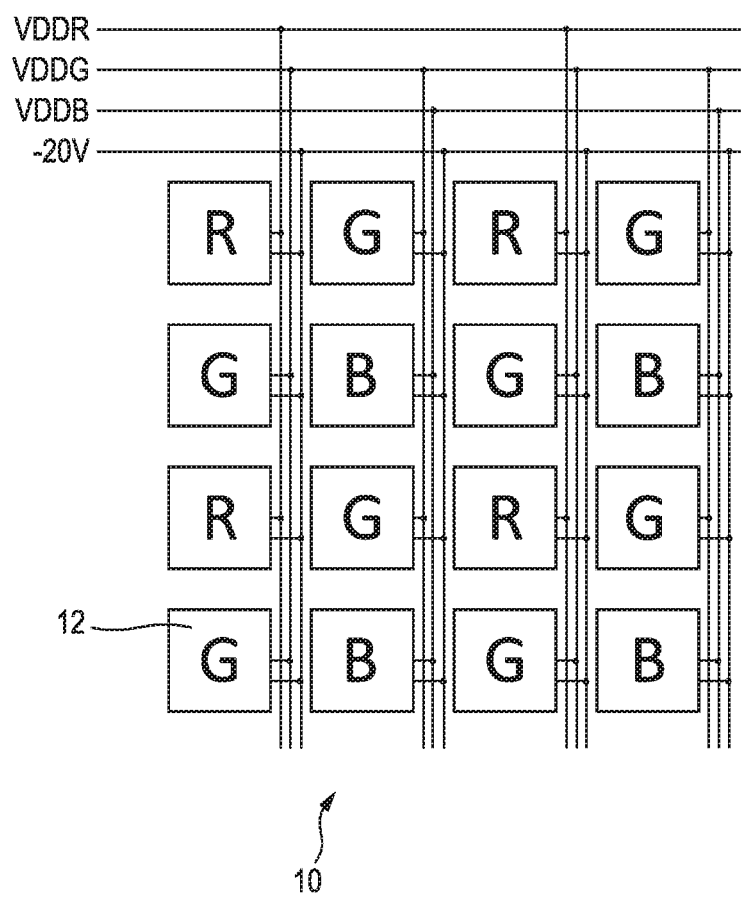
FIG. 43 is a diagram pertaining to the supply of a voltage to a pixel in an imaging device according to a twelfth embodiment of the present invention.

FIG. 43 illustrates part of the pixel region 10 in the imaging device according to the present embodiment. Here, it is assumed that the imaging device is provided with a Bayer pattern color filter. In FIG. 43, R, G, and B indicate pixels 12 provided with red, green, and blue color filters, respectively (R pixels, G pixels, and B pixels).

In the present embodiment, of the voltages supplied to the pixels, a common line is used to supply the negative voltage to all the pixels. As such, a common negative voltage of −20 V is applied to the semiconductor regions of the second conductivity type (P-type) in all of the pixels. On the other hand, the positive voltages are supplied through respective lines corresponding to the R pixels, the G pixels, and the B pixels. As such, mutually-different positive voltages VDDR, VDDG, and VDDB can be supplied to the semiconductor regions of the first conductivity type (N-type) of the R pixels, the G pixels, and the B pixels, respectively.

In the B pixels, which mainly detect short-wavelength light, electrons are produced in a shallow part, and thus the separation performance is lower than that of the G pixels and the R pixels. Accordingly, the positive voltage VDDB applied to the N-type semiconductor regions of the B pixels is made higher than the positive voltages VDDR and VDDG applied to the N-type semiconductor regions of the R pixels and the G pixels. This makes it possible to increase the gradient of the potential of the B pixels, and reduce a worsening in the separation performance caused by electron drift.

Likewise, the positive voltage VDDG applied to the G pixels is made higher than the positive voltage VDDR applied to the R pixels. Note that the positive voltage VDDR applied to the R pixels and the positive voltage VDDG applied to the G pixels may be the same.

Note that the present embodiment can be combined with at least one of the pixel structures described in the eighth to eleventh embodiments, in which the separating part is provided. In this case, the probability of electrons produced in the separating part escaping from the separating part can be increased, which has an effect of reducing dead bands.

Thirteenth Embodiment

The pixel 12 in an imaging device according to a thirteenth embodiment of the present invention will be described next.

In the present embodiment, a potential form of a light-receiving region is controlled by varying an interval between the two semiconductor regions 104A and 104B of the first conductivity type (N-type) that constitute the cathodes of photodiodes in accordance with the wavelength to be detected.

Figure 44A:
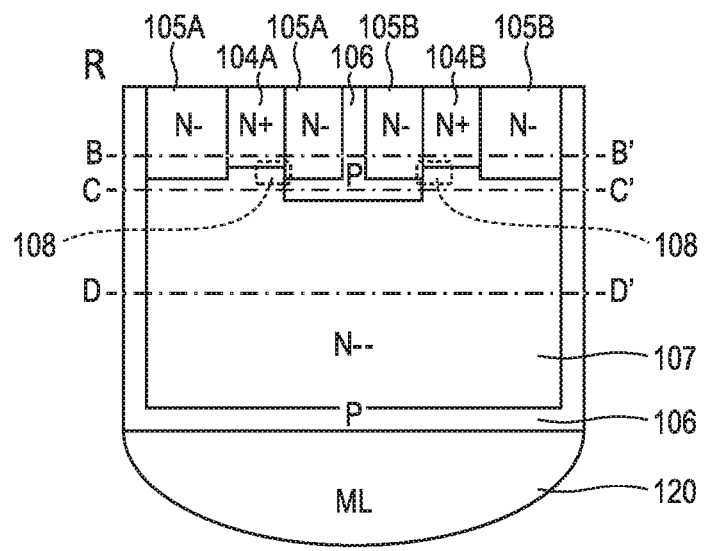
FIG. 44A is a diagram illustrating an example of the structure of a pixel in an imaging device according to a thirteenth embodiment of the present invention.
Figure 44B:
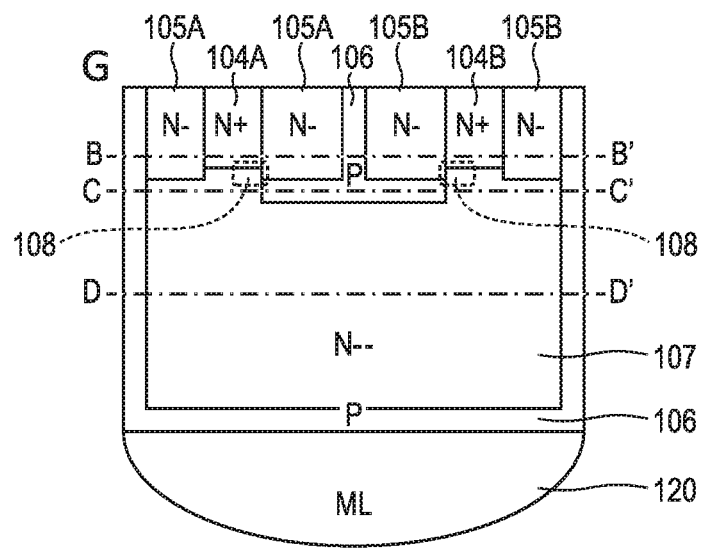
FIG. 44B is a diagram illustrating an example of the structure of a pixel in the imaging device according to the thirteenth embodiment of the present invention.
Figure 44C:
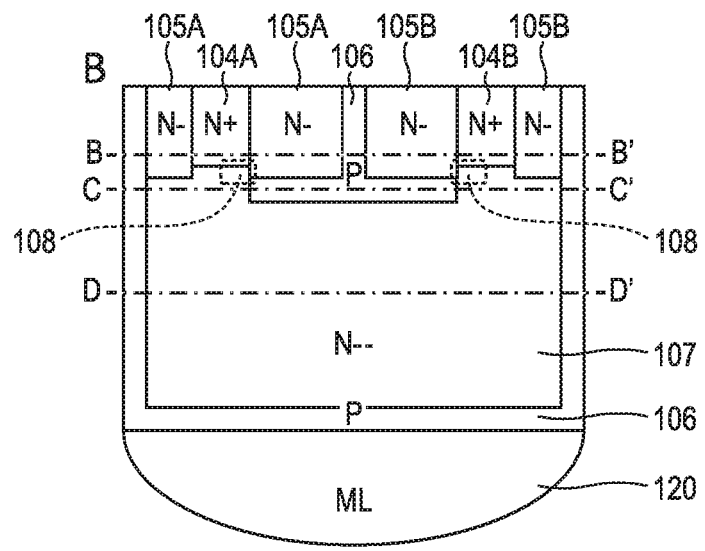
FIG. 44C is a diagram illustrating an example of the structure of a pixel in the imaging device according to the thirteenth embodiment of the present invention.

FIG. 44A to FIG. 44C are vertical cross-sectional views illustrating examples of the configurations of the R pixels, the G pixels, and the B pixels in FIG. 36C. Although FIG. 44A to FIG. 44C illustrate configurations in which the separating part is not provided, the present embodiment may be combined with at least one of the above-described eighth to eleventh embodiments, so that the separating part is provided.

The R pixels detect long-wavelength light, and thus there is little worsening in the separation performance due to electron movement. However, providing the separating part makes the pixels more susceptible to the influence of a drop in image quality caused by the separating part. As such, in the R pixels (FIG. 44A), the interval between the N-type semiconductor regions 104A and 104B is made narrower than in the G pixels (FIG. 44B).

The B pixels detect short-wavelength light, and thus there is a high level of worsening in the separation performance due to electron movement. However, providing the separating part makes the pixels less susceptible to the influence of a drop in image quality caused by the separating part. As such, in the B pixels, the interval between the N-type semiconductor regions 104A and 104B is made broader than in the G pixels.

Note that FIG. 44A to FIG. 44C illustrate configurations where the interval between the N-type semiconductor regions 104A and 104B is varied depending on the wavelength of light mainly detected. However, the interval between the N-type semiconductor regions 104A and 104B may be determined on the basis of a different condition. For example, when the wavelength dependence of the pupil separation performance is to be reduced during focus detection, the interval between the N-type semiconductor regions 104A and 104B can be made broader for pixels where the wavelength of light mainly detected is shorter. The present embodiment can also be combined with at least one of the eighth to eleventh embodiments.

VARIATIONS

Although preferred embodiments of the present invention have been described above, the present invention is not intended to be limited to these embodiments, and many variations and alterations are possible within the scope thereof.

For example, an example in which the configuration of part of one of the embodiments is added to a different embodiment, replaced with the configuration of part of another embodiment, and so on are also embodiments of the present invention.

Additionally, the imaging devices described in the foregoing embodiments can be applied in a variety of imaging systems. A digital still camera, a digital camcorder, a surveillance camera, a copier, a fax machine, a mobile phone, a vehicle-mounted camera, an observation satellite, and the like can be given as examples of such applicable imaging systems. A camera module including an optical system such as a lens and a solid-state imaging device is also included in such imaging systems. When configuring such an imaging system, some of the functions of the imaging devices described in the foregoing embodiments, e.g., the focus detection signal generating unit or the image processing unit, may be configured to be realized by a signal processing unit outside the imaging device.

According to the present invention, in an imaging device which uses SPADs, focus detection using a phase difference detection method can be performed, and a bokeh similar to that which is obtained when not dividing pupils when capturing an image can be achieved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:
1. An imaging device comprising:
a plurality of pixels arranged in a plurality of rows and a plurality of columns,
wherein each of the plurality of pixels includes:
a light-receiving unit having a plurality of first semiconductor regions of a first conductivity type provided in a surface part of a semiconductor substrate and a second semiconductor region of a second conductivity type provided in the surface part of the semiconductor substrate between the plurality of first semiconductor regions, a plurality of photodiodes each configured between the second semiconductor region and one of the plurality of first semiconductor regions;

a plurality of quenching circuits, each connected to a corresponding one of the plurality of first semiconductor regions; and a counter unit connected to each of connection nodes between the plurality of first semiconductor regions and the plurality of quenching circuits, the counter unit counting a pulse generated in response to a photon being incident on the light-receiving unit, wherein the second semiconductor region is provided across a deeper part of the semiconductor substrate than the plurality of first semiconductor regions.

2. The imaging device according to claim 1, further comprising:
a plurality of third semiconductor regions of the first conductivity type and having a lower impurity concentration than the plurality of first semiconductor regions, the plurality of third semiconductor regions being provided in the surface part of the semiconductor substrate at positions between the second semiconductor region and the plurality of first semiconductor regions.

3. The imaging device according to claim 2, wherein the plurality of third semiconductor regions are provided across a deeper part of the semiconductor substrate than the plurality of first semiconductor regions.

4. The imaging device according to claim 1, further comprising:
a first separating part constituted by a fourth semiconductor region of the second conductivity type provided between the light-receiving units of adjacent ones of the pixels.

5. The imaging device according to claim 1, further comprising:
a second separating part constituted by a fifth semiconductor region of the second conductivity type having a lower impurity concentration than the second semiconductor region, the second separating part being provided from the second semiconductor region to a second surface part that is on a side of the semiconductor substrate opposite from the surface part.

6. The imaging device according to claim 1, wherein each of the plurality of pixels further includes one microlens provided on the second surface part that is on the side of the semiconductor substrate opposite from the surface part.

7. The imaging device according to claim 1, wherein each of the plurality of pixels includes two of the first semiconductor regions arranged adjacent in a first direction, with a center of the light-receiving unit located between the first semiconductor regions when viewed in a plan view.

8. The imaging device according to claim 1, wherein the plurality of pixels include:
a first pixel including two of the first semiconductor regions arranged adjacent in a first direction, with a center of the light-receiving unit located between the first semiconductor regions when viewed in a plan view; and
a second pixel including two of the first semiconductor regions arranged adjacent in a second direction intersecting with the first direction, with the center located between the first semiconductor regions.

9. The imaging device according to claim 7, wherein each of the plurality of pixels further includes the first semiconductor regions disposed at the center.

10. The imaging device according to claim 1, having:
a first driving mode in which a first driving voltage is supplied to the second semiconductor region and a second driving voltage is supplied to each of the plurality of first semiconductor regions via the quenching circuits; and
a second driving mode in which the first driving voltage is supplied to the second semiconductor region and a third driving voltage is supplied only to one first semiconductor region among the plurality of first semiconductor regions.

11. The imaging device according to claim 10, wherein a potential difference between the third driving voltage and the first driving voltage is greater than a potential difference between the second driving voltage and the first driving voltage.

12. The imaging device according to claim 10, further comprising:
a focus detection signal generating unit that, in the first driving mode, generates a signal for focus detection on the basis of a count value counted by a counter circuit connected to some of the first semiconductor regions among the plurality of first semiconductor regions and a count value counted by a counter circuit connected to other first semiconductor regions among the plurality of first semiconductor regions.

13. The imaging device according to claim 10, further comprising:
an image processing unit that, in the second driving mode, generates a signal for image capturing on the basis of a count value counted by a counter circuit connected to the one first semiconductor region.

14. The imaging device according to claim 1, further comprising:
an image processing unit that generates a signal for image capturing on the basis of a total value of count values counted by counter circuits connected to the plurality of first semiconductor regions.

15. An imaging device in which a plurality of pixels are disposed, wherein each of the plurality of pixels includes:
a microlens;
a first semiconductor region of a first conductivity type having a light-receiving surface on which light is incident via the microlens; and
a plurality of second semiconductor regions of the first conductivity type provided on a surface of the first semiconductor region opposite from the light-receiving surface, the plurality of second semiconductor regions being separated by a semiconductor region of a second conductivity type,
wherein the semiconductor region of the second conductivity type in at least some pixels of the plurality of pixels has a part extending to a predetermined depth of the first semiconductor region, and
wherein the at least some pixels are pixels a wavelength of light mainly detected by which is shorter than for other pixels.

16. An imaging device in which a plurality of pixels are disposed, wherein the plurality of pixels include a plurality of types of pixels having different spectral properties; and
of the plurality of pixels, a potential difference supplied to a first type of pixel is smaller than a potential difference supplied to a second type of pixel a wavelength of light mainly detected by which is shorter than that of the first type of pixel.

17. The imaging device according to claim 16, wherein the second type of pixel is a pixel a wavelength of light mainly detected by which is shorter than that of the first type of pixel.

18. An imaging device in which a plurality of pixels are disposed, wherein each of the plurality of pixels includes:
   a microlens;
   a first semiconductor region of a first conductivity type having a light-receiving surface on which light is incident via the microlens; and
   a plurality of second semiconductor regions of the first conductivity type provided on a surface of the first semiconductor region opposite from the light-receiving surface, the plurality of second semiconductor regions being separated by a semiconductor region of a second conductivity type,
   wherein of the plurality of pixels, an interval of the plurality of second semiconductor regions in a first type of pixel is narrower than an interval of the plurality of second semiconductor regions in a second type of pixel a wavelength of light mainly detected by which is shorter than that of the first type of pixel.

19. An imaging system comprising:
an imaging device; and
a signal processing unit that processes a signal output from the imaging device,
wherein the imaging device comprises:
a plurality of pixels arranged in a plurality of rows and a plurality of columns,
wherein each of the plurality of pixels includes:
a light-receiving unit having a plurality of first semiconductor regions of a first conductivity type provided in a surface part of a semiconductor substrate and a second semiconductor region of a second conductivity type provided in the surface part of the semiconductor substrate between the plurality of first semiconductor regions, a plurality of photodiodes each configured between the second semiconductor region and one of the plurality of first semiconductor regions;
a plurality of quenching circuits, each connected to a corresponding one of the plurality of first semiconductor regions; and
a counter unit connected to each of connection nodes between the plurality of first semiconductor regions and the plurality of quenching circuits, the counter unit counting a pulse generated in response to a photon being incident on the light-receiving unit,
wherein the second semiconductor region is provided across a deeper part of the semiconductor substrate than the plurality of first semiconductor regions.

* * * * *